United States Patent [19]

Yamauchi et al.

[11] Patent Number: 5,715,191
[45] Date of Patent: Feb. 3, 1998

[54] STATIC RANDOM ACCESS MEMORY HAVING VARIABLE SUPPLY VOLTAGES TO THE MEMORY CELLS AND METHOD OF OPERATING THEREOF

[75] Inventors: Hiroyuki Yamauchi, Takatsuki; Toru Iwata, Osaka, both of Japan

[73] Assignee: Matsushita Electric Industrial Co., Ltd., Osaka, Japan

[21] Appl. No.: 733,313

[22] Filed: Oct. 17, 1996

[30] Foreign Application Priority Data

Oct. 25, 1995 [JP] Japan ............... 7-278138

[51] Int. Cl.[6] ........................... G11C 11/413
[52] U.S. Cl. ............ 365/156; 365/154; 365/189.09; 365/189.11; 365/190; 365/205; 365/230.03; 365/227; 365/229
[58] Field of Search ............... 365/156, 154, 365/189.09, 189.11, 190, 205, 230.03, 227, 229

[56] References Cited

U.S. PATENT DOCUMENTS

| | | | |
|---|---|---|---|
| 5,301,147 | 4/1994 | Guo et al. | 365/154 |
| 5,303,190 | 4/1994 | Pelley, III | 365/189.11 |
| 5,581,500 | 12/1996 | D'Souza | 365/154 |

Primary Examiner—David C. Nelms
Assistant Examiner—Andrew Q. Tran
Attorney, Agent, or Firm—McDermott, Will & Emery

[57] ABSTRACT

A memory cell includes a load transistor pair serving as a high data holding element, a drive transistor pair serving as a low data holding element, and an access transistor pair for accessing the high data holding element or the low data holding element. A high data holding potential corresponding to the source potential of the load transistor pair is set at a value larger than a supply potential, and a low data holding potential corresponding to the source potential of the drive transistor pair is set at a value larger than a ground potential. In a read operation, a source potential control line of a selected memory cell is connected with a ground line through a source line switch.

52 Claims, 38 Drawing Sheets

CONVENTIONAL TRANSISTOR

DRIVE TRANSISTOR
(ACCESS TRANSISTOR)

STATIC RANDOM ACCESS MEMORY HAVING VARIABLE SUPPLY VOLTAGES TO THE MEMORY CELLS AND METHOD OF OPERATING THEREOF

BACKGROUND OF THE INVENTION

The present invention relates to a data storage device, and more particularly, it relates to a data storage device driven at a low voltage with small power consumption.

A small power consumption type semiconductor SRAM IC will now be described as a typical example of conventional data storage devices with reference to FIG. 38.

FIG. 38 is a circuit diagram of a memory cell in the conventional small power consumption type semiconductor SRAM IC, showing one of the memory cells aligned in a cell array in the form of a matrix of n rows by m columns (wherein n and m are positive integers). In FIG. 38, VN denotes a first memory node for storing a high or low data; VR denotes a second memory node for storing a data complementary to that stored by the first memory node VN; P1 denotes a first load transistor for supplying a potential of a high data to the first memory node VN; P2 denotes a second load transistor for supplying a potential of a high data to the second memory node VR; N1 denotes a first drive transistor for supplying a potential of a low data to the first memory node VN; N2 denotes a second drive transistor for supplying a potential of a low data to the second memory node VR; Vcc denotes a supply potential serving as the potential of a high data; Vss denotes a ground potential serving as the potential of a low data; WL(n) denotes a word line for selecting one of the memory cells aligned in the row direction; BL(m) and /BL(m) denote a bit line pair for controlling a data read or write operation on the memory cells aligned in the column direction; CLM denotes a column control line for selecting one of the memory cells aligned in the column direction; N31 denotes a first access transistor activated through the word line WL(n); N32 denotes a second access transistor activated through the column control line CML; N41 denotes a third access transistor activated through the column control line CML; and N42 denotes a fourth access transistor activated through the word line WL(n).

This memory cell is characterized by the configuration in which the bit line BL(m) is connected with the first memory node VN in series through the first and second access transistors N31 and N32. Since the first access transistor N31 is controlled through the word line WL(n) and the second access transistor N32 is controlled through the column control line CLM, the bit line BL(m) is connected with the first memory node VN merely in a memory cell positioned at the intersection between the selected word line WL(n) and the selected column control line CLM (this selection of the memory cell is hereinafter referred to as the cross-point selection). As a result, the corresponding bit line BL(m) alone is discharged, and hence, the number of the bit lines to be charged in precharging the bit lines BL(m) up to the supply voltage Vcc can be decreased, resulting in decreasing the current consumption. The third and fourth access transistors N41 and N42 work on the bit complementary line /BL(m) in the same manner as the first and second access transistors N31 and N32.

This conventional small power consumption type semiconductor SRAM IC has, however, the following two problems:

First, since each access transistor is composed of two series transistors N31 and N32 or N41 and N42, one memory cell requires eight transistors. Accordingly, when a RAM with a large capacity is configured by using such a memory cell, the area on a semiconductor substrate occupied by the memory cells is disadvantageously large.

Next, even through the power consumption is suppressed by conducting the cross-point selection, the absolute value of the threshold voltage of each transistor included in the memory cell cannot be decreased to be lower than 0.6 V for preventing a leakage current. Therefore, there is a limit in decreasing the supply voltage Vcc, and hence, the power consumption cannot be further decreased.

SUMMARY OF THE INVENTION

The present invention was devised to overcome the aforementioned problems of the conventional technique, and the object is decreasing the power consumption of a data storage device which can be operated at a low voltage, without increasing the area occupied by data holding means therein, while suppressing a leakage current.

The data storage device of this invention comprises plural data holding means, and the plural data holding means include high data holding means for holding a high data at a potential higher than a supply potential; and low data holding means for holding a low data at a potential higher than a ground potential.

In the present data storage device, since the data holding potential of the low data holding means is set at a larger value than the ground potential, a leakage current flowing through the low data holding means can be suppressed, resulting in decreasing the power consumption. Furthermore, since the data holding potential of the high data holding means is set at a larger value than the supply potential for the entire device, the data values of a high data and a low data can be secured.

In one aspect of the data storage device, a difference between the potential of the high data holding means and the potential of the low data holding means is preferably set to be equal to a difference between the supply potential and the ground potential. In this manner, the data values of a high data and a low data can be both secured because the potential difference is set to be equal to a difference between the supply potential and the ground potential.

In another aspect, the data storage device preferably further comprises data holding potential changing means for changing the difference between the potential of the high data holding means and the potential of the low data holding means in accordance with operation modes of the data storage device. In this manner, since the difference between the potential of the high data holding means and the potential of the low data holding means can be changed in accordance with the operation modes of the device, a read or write operation can be rapidly conducted.

In still another aspect of the data storage device, the operation modes of the data storage device preferably include a first operation mode for conducting a read or write operation on any of said data holding means and a second operation mode for not conducting read and write operations on any of said data holding means, and the data holding potential changing means preferably increases an absolute value of at least one of the potentials of the high data holding means and the low data holding means in a third operation mode, in which the second operation mode is continued for a duration longer than the second operation mode by one microsecond or more. In this manner, in the stand-by period, that is, the third operation mode, the source potential of the low data holding means is increased than in the activating period, the first operation mode. Therefore, in the case where the low data holding means includes a transistor, the threshold voltage of the transistor is increased due to the substrate bias effect, and hence, a leakage current can be decreased. Furthermore, since it is possible to set the threshold voltage in the activating period at a lower value in consideration of the decrease of the leakage current, the power consumption can be decreased by adopting low voltage drive without degrading the operation speed.

In still another aspect of the data storage device, the data holding means preferably includes cross-couple type transistor pairs, and the data holding potential changing means preferably works as source potential control means for changing a potential at a source electrode of the transistor pairs. Thus, since the data holding means include the cross-couple type transistor pairs and the device comprises the source potential control means for changing the potential at the source electrode of the transistor pairs, the drive ability of the transistor pair can be increased/decreased by changing the source potential so as to increase the source-gate voltage. As a result, the operation speed can be improved in the activating period, that is, the first operation mode, as well as a leakage current can be securely decreased in the stand-by period, that is, the second operation mode.

Specifically, since the gate-source voltage of the drive transistors serving as the low data holding means is increased, a read operation, which is extraction of charge from a bit line, can be conducted at a high speed. Furthermore, in an unselected memory cell, the gate-source voltage is smaller than in a selected memory cell, and hence, charge is scarcely extracted from an unselected bit line. Thus, without increasing the number of the transistors included in the memory cell, namely, without increasing the area occupied by each memory cell on the substrate, the cross-point selection can be effected, and the power consumed in precharging the bit line pairs can be decreased.

In still another aspect, the data storage device preferably further comprises frequency dependent type data holding potential changing means for changing the potential of the low data holding means so that the difference between the potential of the high data holding means and the potential of the low data holding means is less increased as a cycle frequency of a clock signal is larger in the first operation mode. Thus, as the cycle frequency of the clock signal serving as a reference for a read or write operation becomes larger, the charge/discharge amount becomes more dominant in the leakage current where a DC component has been dominant. As a result, as the cycle frequency increases, the activating period is unavoidably shortened, resulting in decreasing the charge/discharge amount. Thus, the leakage current can be further decreased.

In still another aspect, the data storage device preferably further comprises frequency dependent type data holding potential changing means for increasing the potential of the high data holding means as a cycle frequency of a clock signal is larger in the first operation. Thus, the drive ability of the low data holding means is improved, and hence, a read operation can be conducted more rapidly.

In still another aspect, the data storage device preferably further comprises frequency dependent type data holding potential changing means for changing the potential of the high data holding means so that the difference between the potential of the high data holding means and the potential of the low data holding means is less increased as a cycle frequency of a clock signal is larger in the first operation mode. Thus, as the cycle frequency of the clock signal serving as a reference for a read or write operation becomes larger, the charge/discharge amount becomes more dominant in the leakage current where a DC component has been dominant. As a result, as the cycle frequency increases, the activating period is unavoidably shortened, resulting in decreasing the charge/discharge amount. Thus, the leakage current can be further decreased.

In still another aspect, the data storage device preferably further comprises frequency dependent type data holding potential changing means for decreasing the potential of the low data holding means as a cycle frequency of a clock signal is larger in the first operation mode. Thus, the drive ability of the low data holding means is improved, and hence, a read operation can be conducted more rapidly.

In still another aspect of the data storage device, the data holding means are preferably disposed in the form of an array of memory cells including cross-couple type transistor pairs, the data storage device preferably further comprises bit lines connected with the memory cells for selecting one of the memory cells, the memory cells include access transistors interposed between the bit lines and a source electrode of the high data holding means, and a threshold voltage of each of the access transistors is set at a smaller value than 0.35 V in the absolute value. In this manner, by increasing the source potential of the access transistor, the threshold voltage of the access transistor is dynamically increased due to the substrate bias effect, and the gate-source voltage of the access transistor becomes negative. Therefore, a leakage current during the stand-by period can be suppressed, and hence, a read operation can be securely conducted even when the absolute value of the threshold voltage of the access transistor is set at a value smaller than 0.35 V.

In still another aspect of the data storage device, the low data holding means is preferably a drive transistor pair, and a threshold value of each transistor of the drive transistor pair is set at a smaller value than 0.35 V in the absolute value. In this manner, by increasing the source potential of the drive transistor, the threshold voltage of the drive transistor is dynamically increased due to the substrate bias effect, and the gate-source voltage of the drive transistor becomes negative. Therefore, a leakage current during the stand-by period can be suppressed, and hence, a read operation can be securely conducted even when the absolute value of the threshold voltage of the drive transistor is set at a value smaller than 0.35 V.

In still another aspect of the data storage device, the data holding means are preferably disposed in the form of an array of memory cells including cross-couple type transistor pairs, the data storage device preferably further comprises bit lines connected with the memory cells for selecting one of the memory cells, the memory cells include access transistors interposed between the bit lines and a source electrode of the high data holding means, and the data storage device is further provided with means for setting an absolute value of a substrate bias potential of each of the access transistors during a stand-by period in which neither a read operation nor a write operation is conducted on any of the data holding means at a value larger than an absolute value of the substrate bias potential of the access transistor during an activating period in which a read or write operation is conducted on the data holding means. In this manner, by increasing the absolute value of the substrate bias potential of the access transistor in the stand-by period, the threshold voltage of the access transistor is increased due to the substrate bias effect. As a result, a leakage current during the stand-by period can be suppressed, resulting in attaining the small power consumption by the low voltage drive.

In still another aspect, the data storage device preferably further comprises data holding potential changing means for decreasing the potential of the low data holding means during a stand-by period in which neither a read operation nor a write operation is conducted on any of the data holding means. Thus, in the case where the low data holding means includes a transistor, even when the threshold voltage of the transistor is increased in the stand-by period due to the substrate bias effect, the difference in the holding potential between a high data and a low data is large, and hence, the data latching ability cannot be degraded.

In still another aspect of the data storage device, the low data holding means is preferably a drive transistor pair, and device parameters are preferably set so that dependency of a threshold voltage of each transistor of the drive transistor pair on a substrate bias potential is increased. In this manner, the threshold voltage is more largely increased in accordance with the change of the substrate bias potential. Therefore, the threshold voltage of each transistor used in the data holding means can be set at a further lower value, resulting in attaining further smaller power consumption by lower voltage drive.

In still another aspect of the data storage device, the device parameters preferably include a depth, from a surface of a substrate, of each transistor of the drive transistor pair determined in accordance with the substrate bias potential, and an impurity concentration in a space charge area between a bottom of the substrate and a channel region. Thus, a coefficient Gamma of the substrate bias effect can be securely increased.

In still another aspect of the data storage device, the data holding means are preferably disposed in the form of an array of memory cells including cross-couple type transistor pairs, the data storage device preferably further comprises bit line pairs connected with the memory cells for selecting one of the memory cells; low data holding power lines connected with the memory cells for controlling the potential of the low data holding means; a sense amplifier connected with the memory cells via the bit line pairs for amplifying a potential of a data read from a memory cell selected from the memory cells; and a low data holding power control circuit for controlling the potential of the low data holding means through the low data holding lines, and the sense amplifier sets, in amplifying the potential of the read data, a difference between the potential of the high data holding means and the potential of the low data holding means in the selected memory cell at a value close to a difference between the potential of the high data holding means and the potential of the low data holding means in an unselected memory cell. In this manner, differently from the conventional technique in which the discharge amount of a bit line is controlled in accordance with the duration for activating a word line, the discharge amount of a bit line can be controlled by increasing the potential of a low data holding power line connected with the source electrode of the drive transistor. As a result, excessive discharge of the bit line can be avoided, resulting in decreasing the power consumption.

In still another aspect of the data storage device, the memory cell preferably include access transistors interposed between the bit line pairs and a source electrode of the high data holding means, and the low data holding power control circuit preferably sets the potential of the low data holding means during a stand-by period in which neither a read operation nor a write operation is conducted on any of the data holding means at a potential lower than the supply potential by a threshold voltage of each of the access transistors. In this manner, the potential of the low data holding power line can be decreased by the threshold voltage of the transistor included in the low data holding power control circuit. Therefore, even when the word line is activated, the access transistors included in the memory cell are substantially in an off-state. Thus, the cross-point selection can be securely effected, resulting in decreasing the power consumption.

In still another aspect of the data storage device, the data holding means are preferably disposed in the form of an array of memory cells including cross-couple type transistor pairs, the data storage device preferably further comprises bit line pairs connected with the memory cells for selecting one of the memory cells; and a sense amplifier connected with the memory cells through the bit line pairs for amplifying a potential of a data read from a memory cell selected from the memory cells, the sense amplifier includes a low potential supply power controlling transistor which becomes conductive in a read operation, and control signals complementary to each other are respectively supplied to a gate electrode and a source electrode of the low potential supply power controlling transistor, and a threshold voltage of the low potential supply power controlling transistor is set at a value smaller than 0.35 V in the absolute value. In this manner, the channel width of the low potential supply power controlling transistor included in the sense amplifier can be set at a small value advantageously for the high integration of the sense amplifier.

In still another aspect, the data storage device preferably further comprises high data holding power lines connected with the high data holding means for supplying a voltage to the high data holding means; and high data holding potential floating means for placing the potential of selected high data holding means in a floating state in a write operation. In this manner, in a write operation, it is possible to prevent a short-circuit between the current supplier for the high data holding power line and the ground power supply of a write driver connected with the bit line pair through load transistors and the like serving as the high data holding means. As a result, not only a wastefully consumed current can be suppressed, but also a factor to unstabilize the potential of the high data holding power line can be eliminated.

In still another aspect, the data storage device preferably further comprises data holding potential changing means for setting a difference between the potential of selected high data holding means and the potential of selected low data holding means in a write operation at a value equal to or smaller than a difference between the potential of the high data holding means and the potential of the low data holding means in a stand-by period in which neither a read operation nor a write operation is conducted, and sets a difference between a potential at a source electrode of unselected high data holding means and a potential at a source electrode of unselected low data holding means in a write operation at a value equal to the difference between the potential of the high data holding means and the potential of the low data holding means in the stand-by period. In this manner, a potential difference between the high data holding power line and the bit line pair can be made small in a write operation. As a result, a wasteful through-current can be suppressed, resulting in decreasing the power consumption.

In still another aspect, the data storage device preferably further comprises high data holding power lines connected with the high data holding means for supplying a voltage to the high data holding means; and data holding potential changing means for increasing the potential of selected high data holding means in a read operation. In this manner, in the case where the low data holding means includes a transistor, the transistor can be activated rapidly in a read operation, resulting in attaining a high speed read operation.

In still another aspect of the data storage device, the data holding means are preferably disposed in the form of an array of memory cells including cross-couple type transistor pairs, the array is divided into plural blocks, and the data storage device preferably further comprises a first low data holding power line extending over the plural blocks; and second low data holding power lines respectively connected with the low data holding means in the plural blocks for supplying a voltage to the low data holding means, and the first low data holding power line is connected with the second low data holding power lines through switches. In this manner, the memory cell array is divided into the plural blocks, and therefore, in changing the potential of the low data holding power line, the resistance value and the capacitance delay of the low data holding power line can be decreased. As a result, the potential of the low data holding power line can be rapidly changed, resulting in a rapid read operation and further smaller power consumption.

In still another aspect of the data storage device, the impedance control means preferably generates, through the switches, a potential for providing low impedance to a selected second low data holding power line and a potential for providing high impedance to an unselected second low data holding power line. In this manner, the low data holding power line in an unselected block cannot be provided with completely high impedance and cannot be strongly connected with a low data holding power line in an upper rank. This can be advantageous in decreasing the power consumption.

Alternatively, the data storage device of this invention comprises a memory cell array-unit including memory cells aligned in the form of an array; and a peripheral circuit unit, and the peripheral circuit unit includes voltage control means for increasing, in a read operation, a difference between a potential of high data holding means and a potential of a low data holding means of a selected memory cell to be larger than a difference between a potential at a source electrode of high data holding means and a potential at a source electrode of low data holding means of an unselected memory cell; and current control means for allowing a current to flow through the peripheral circuit unit in an activating period in which a read or write operation is conducted and cutting the current flowing through the peripheral circuit unit in a stand-by period in which neither a read operation nor a write operation is conducted.

In this data storage device, the gate-source voltage of access transistors and drive transistors serving as the low data holding means can be smaller in an unselected memory cell than in a selected memory cell in a read operation. Furthermore, this data storage device is provided with the current control means for cutting a current flowing through the peripheral circuit unit during a stand-by period, and hence, it is possible to prevent a leakage current during the stand-by period which is much longer than an activating period. Thus, the power consumption of the entire device can be further decreased.

Alternatively, the present method of driving a data storage device including plural cross-couple type transistor pairs working as data holding means, comprises a source line grounding step of grounding a source line of a transistor pair selected from the plural transistor pairs; and a source line connecting step of connecting a source line of unselected transistor pairs with the source line of the selected transistor pair in precharging the source line of the selected transistor pair.

In this method of driving a data storage device, after grounding the source line of the selected transistor pair, the source line of the selected transistor pair is connected with the source lines of the unselected transistor pairs in precharging the source line of the selected transistor pair. Therefore, the charge supplied to the source lines of the unselected transistor pairs is injected into the source line of the selected transistor pair. In this manner, the charge conventionally discharged as a leakage current can be recycled, and hence, the power consumption can be decreased.

In one aspect of the method of driving a data storage device, the source line grounding step preferably includes a step of placing the source line of the selected transistor pair in a floating state and connecting the source lines of the unselected transistor pairs with one another in a write operation. In this manner, the source line of the selected transistor pair is placed in the floating state in a write operation. As a result, the source line of the transistor pair attains high impedance, resulting in turning off the transistor pair. This shortens time required for achieving a predetermined high data holding potential, resulting in attaining a high speed write operation. Furthermore, since a through-current flowing from a power supply for supplying the high data holding potential to the data holding means during a write operation can be elliminated, the power consumption can be further decreased.

BRIEF DESCRIPTION OF THE DRAWINGS

FIGS. 6(a) and 6(b) illustrate a semiconductor SRAM IC device according to a second embodiment of the invention, wherein FIG. 6(a) is a circuit diagram of a memory cell array and FIG. 6(b) is a timing chart for a read operation;

FIGS. 7(a) through 7(d) illustrate conducting states of access transistors and the like included in a memory cell at time t0 and t1 of FIG. 3(a), wherein FIG. 7(a) shows the state of a first access transistor N3 of a selected memory cell, FIG. 7(b) shows the state of a first access transistor N7 of an unselected memory cell, FIG. 7(c) shows the state of a first access transistor N11 of the unselected memory cell, and FIG. 7(d) shows the state of a first drive transistor N1 of the selected memory cell;

FIGS. 9(a) and 9(b) illustrate a semiconductor SRAM IC device according to modification of the second embodiment, wherein FIG. 9(a) is a circuit diagram of a memory cell array and FIG. 9(b) is a timing chart for a read operation;

FIGS. 10(a) through 10(d) illustrate conducting states of access transistors and the like included in the memory cell shown in FIG. 9(a) at time t0 and time t1 during a read operation, wherein FIG. 10(a) shows the state of a first access transistor P3 of a selected memory cell, FIG. 10(b) shows the state of a first access transistor P7 of an unselected memory cell, FIG. 10(c) shows the state of a first access transistor P11 of the unselected memory cell, and FIG. 10(d) shows the state of a first drive transistor of the selected memory cell;

FIGS. 13(a) through 13(d) illustrate conducting states of access transistors and the like included in a memory cell of a semiconductor SRAM IC device according to a fifth embodiment at time t0 and time t1 during a read operation, wherein FIG. 13(a) shows the state of a first access transistor N3 of a selected memory cell, FIG. 13(b) shows the state of a first access transistor N7 of an unselected cell, FIG. 13(c) shows the state of a first access transistor N11 of the unselected memory cell, and FIG. 13(d) shows the state of a first drive transistor N9 of the unselected memory cell;

FIGS. 14(a) and 14(b) are circuit diagrams of a memory cell in a semiconductor SRAM IC device according to a sixth embodiment of the invention, wherein FIG. 14(a) is a circuit diagram of a selected memory cell in an activating period and FIG. 14(b) is a circuit diagram of a semi-selected memory cell in the activating period;

FIGS. 15(a) and 15(b) are circuit diagrams of a memory cell in a semiconductor SRAM IC device of the sixth embodiment, wherein FIG. 15(a) is a circuit diagram of an unselected memory cell in the activating period and FIG. 15(b) is a circuit diagram of a memory cell in a stand-by period;

FIGS. 18(a) and 18(b) are correlation diagrams between a gate-source voltage Vgs and a logarithm of a drain-source current Ids using a substrate bias potential Vbs as a parameter, wherein FIG. 18(a) shows the characteristic of a conventional semiconductor substrate and FIG. 18(b) shows the characteristic of a semiconductor substrate according to an eighth embodiment of the invention;

FIGS. 33(a) through 33(c) are circuit diagrams of a control signal generator included in the semiconductor SRAM IC device of the fifteenth embodiment, wherein FIG. 33(a) is a circuit diagram of a recycle equivalent signal generator, FIG. 33(b) is a circuit diagram of a recycle step-up signal generator, and FIG. 33(c) is a circuit diagram of a recycle step-down signal generator;

FIGS. 35(a) and 35(b) illustrate a semiconductor SRAM IC device according to modification of the sixteenth embodiment, wherein FIG. 35(a) is a circuit diagram of a block control signal generator and FIG. 35(b) is a timing chart for a read period;

FIGS. 36(a) and 36(b) illustrate a semiconductor SRAM IC device according to a seventeenth embodiment of the invention, wherein FIG. 36(a) is a block circuit diagram of the semiconductor SRAM IC device and FIG. 36(b) shows the variation in a leakage current during an operation period and a stand-by period;

FIGS. 37(a) through 37(d) show the proportions in power consumption of main circuits in various semiconductor SRAM IC devices, wherein FIG. 37(a) shows the proportions in the power consumption of a conventional semiconductor SRAM IC device, FIG. 37(b) shows the proportions in the power consumption of a conventional semiconductor SRAM IC device capable of cross-point selection, FIG. 37(c) shows the proportions in the power consumption of the semiconductor SRAM IC device of the invention, and FIG.

37(d) shows the proportions in the power consumption of the semiconductor SRAM IC device of the seventeenth embodiment.

DETAILED DESCRIPTION OF THE INVENTION

A first embodiment of the invention will now be described with reference to the accompanying drawings.

Figure 1:
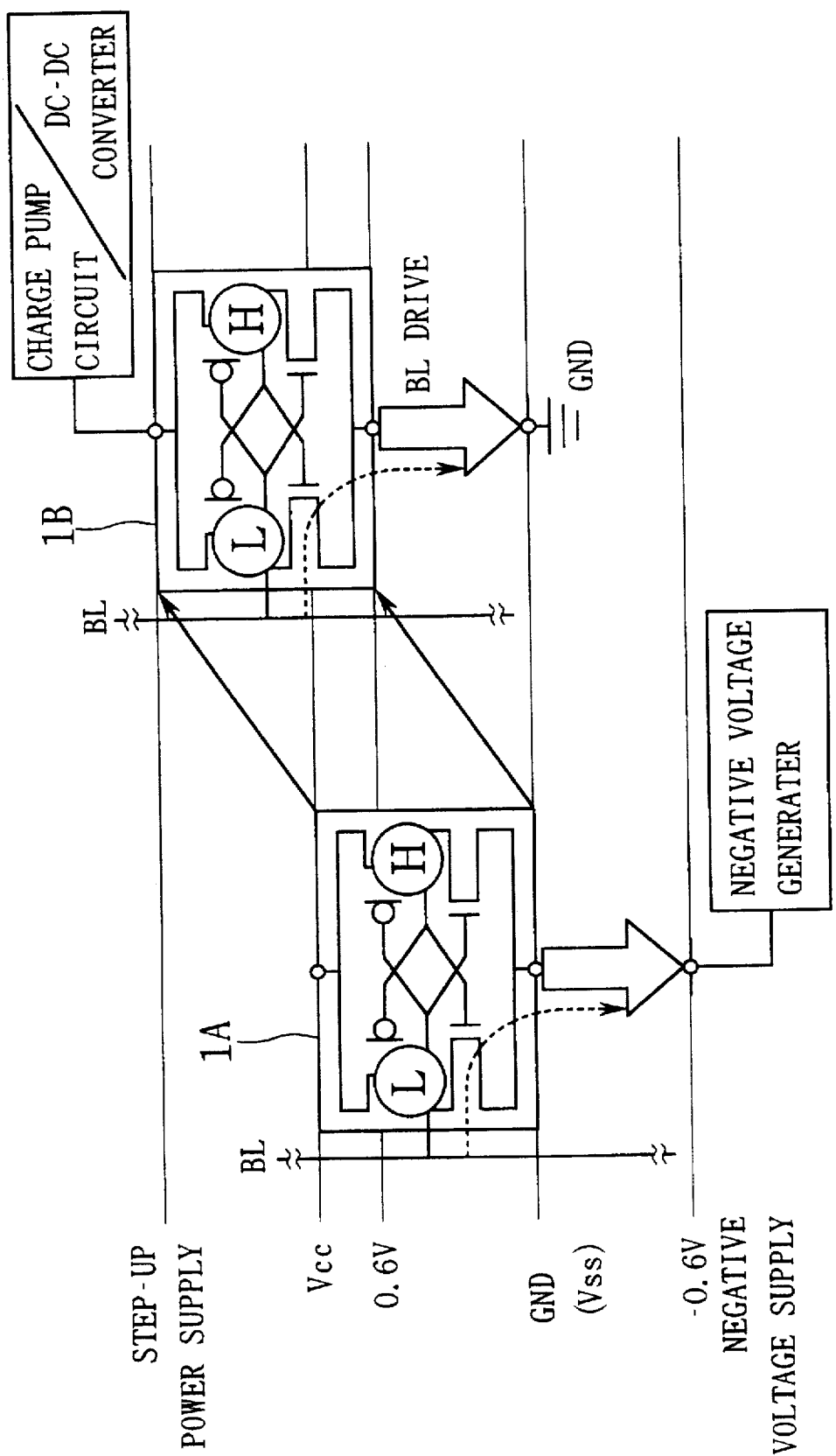
FIG. 1 is a schematic diagram for showing data holding means and a data holding potential in a data storage device according to a first embodiment of the invention.

First, the basic concept of the invention will be described in the first embodiment. FIG. 1 is a schematic diagram for showing data holding means and a data holding potential in a data storage device of the first embodiment.

In FIG. 1, memory cells 1A and 1B are connected with bit lines BL, one of which is selected in accordance with an externally input address, and each memory cell is composed of a cross-couple type transistor pair having data holding means for holding data with two values, i.e., a high data (H) and a low data (L). A supply voltage Vcc is set at, for example, 1.0 V for attaining low voltage drive. In the memory cell 1A, a data holding potential of the high data holding means is set at the supply potential Vcc, and a data holding potential of the low data holding means is set at a ground potential GND (=Vss). In a read operation, when the memory cell 1A is selected, the potential of the low data holding means is set at −0.6 V supplied by a negative voltage generator, so as to increase a gate-source voltage Vgs of the transistor pair serving as the low data holding means. Thus, BL drive for improving the drive ability of the transistor pair is performed, thereby increasing a reading speed.

In contrast, in the memory cell 1B according to the invention, a data holding potential of the high data holding means is set at 1.5 V, which is obtained by increasing the supply potential Vcc by using an internal step-up circuit, that is, a charge pump circuit or a DC—DC converter including an inductor and a capacitor, and a data holding potential of the low data holding means is set at 0.6 V, which is larger than the ground potential GND. In a read operation, when the memory cell 1B is selected, the potential of the low data holding means is grounded, so as to increase the gate-source voltage Vgs of the transistor pair serving as the low data holding means. Thus, the BL drive for improving the drive ability is performed, thereby increasing the reading speed.

In this manner, in the memory cell 1B, the holding potentials of the respective data holding means are shifted in the reverse direction to the direction for driving the bit line BL. The direction for driving the bit line BL herein means, for example, a direction toward the ground potential with regard to a bit line BL to be precharged up to the supply potential Vcc.

The characteristic of this embodiment is that there is no need to provide a negative voltage generator, which is required for the BL drive. In a read operation, a read current flows into the negative voltage generator connected with the memory cell 1A, and hence, the load of this voltage generator is increased. In contrast, the load of the internal step-up circuit connected with the memory cell 1B is small because no current flows into this circuit.

Furthermore, in a stand-by period when neither a read operation nor a write operation is conducted, in the case where the source potential of the transistor pair serving as the low data holding means is set at 0.6 V, the threshold voltage Vt of each transistor is increased due to the substrate bias effect. Thus, a leakage current can be suppressed. The substrate bias effect will be described in detail in the embodiment described below.

Figure 2:
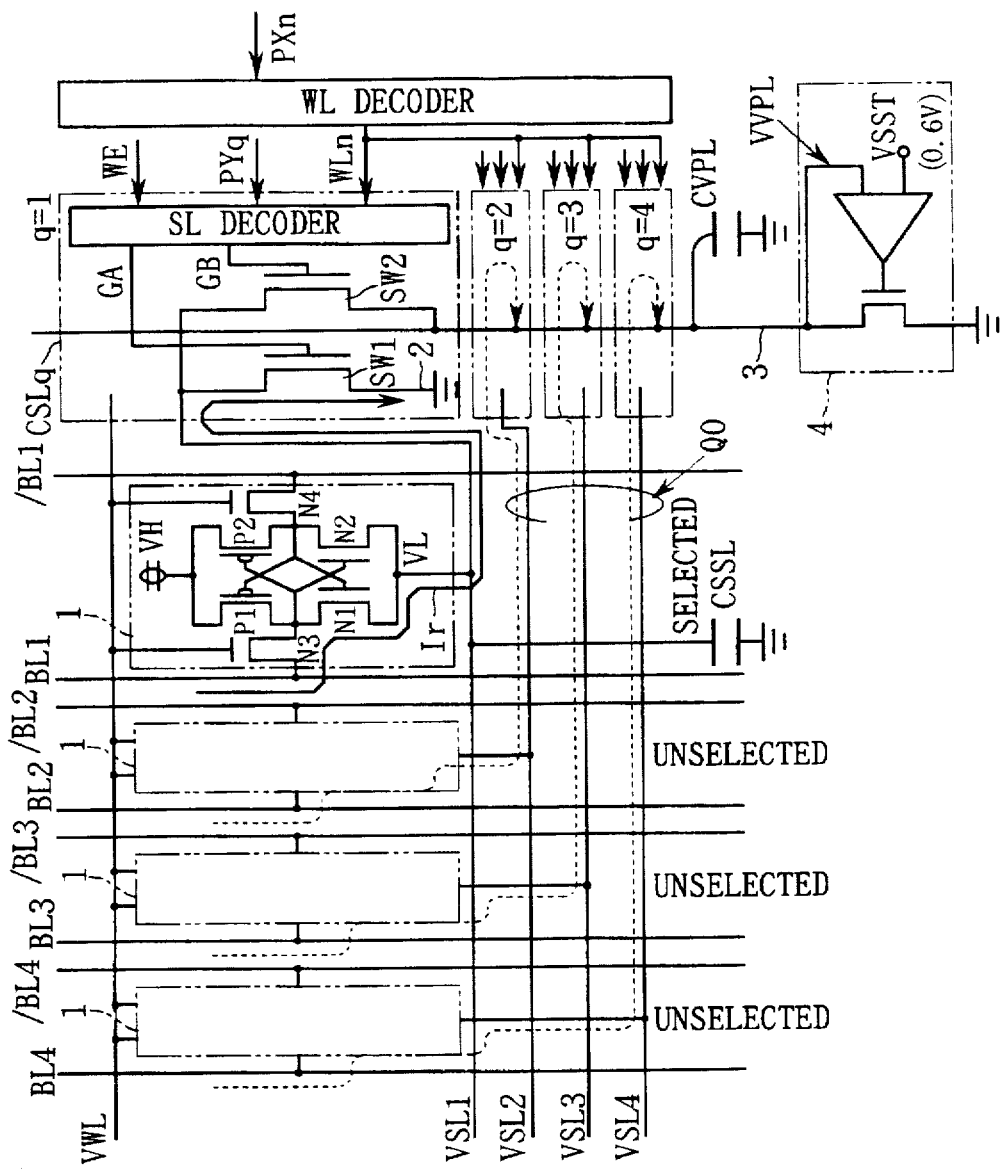
FIG. 2 is a partial circuit diagram of a semiconductor SRAM IC device according to the first embodiment of the invention.

FIG. 2 is a partial circuit diagram of a semiconductor SRAM IC device exemplified as the data storage device of the first embodiment. In FIG. 2, a reference numeral 1 denotes memory cells aligned in the form of an array of n rows by m columns (wherein n and m are positive integers); P1 denotes a first load transistor for supplying a potential of a high data to one of high data holding means; P2 denotes a second load transistor for supplying the potential of a high data to the other high data holding means; N1 denotes a first drive transistor for supplying a potential of a low data to one of low data holding means; and N2 denotes a second drive transistor for supplying the potential of a low data to the other low data holding means.

VH denotes a high data holding potential serving as the potential of a high data; VL denotes a low data holding potential serving as the potential of a low data; VWL denotes a word line for selecting one of the memory cells aligned in the row direction; BLm and /BLm denote a bit line pair for controlling a read or write operation on the memory cells aligned in the column direction; N3 denotes a first access transistor activated through the word line VWL to be connected with one of the data holding means; and N4 denotes a second access transistor activated through the word line VWL to be connected with the other data holding means.

VSLq (wherein q is an integer of 1 through 4) denotes source potential control lines connected with the source electrodes of the drive transistors N1 and N2 of the memory cells 1 for the BL drive.

CSLq denotes a source potential control circuit connected with the corresponding source potential control line VSLq and serving as data holding potential changing means. The source potential control circuit CSLq is controlled in accordance with a source line control signal PYq which is one of output signals of an address decoder for selecting the predetermined memory cell 1 among the plural memory cells on the basis of a pair of a column address and a row address; a word line control signal WLn output by a WL decoder which receives a row address signal PXn, that is, one of the output signals of the address decoder; and a write control signal WE.

The source potential control circuit CSLq includes an SL decoder for receiving the source line control signal PYq, the word line control signal WLn and the write control signal WE; a source line switch SW1 serving as source line connecting means and including a transistor for grounding the source line of the selected memory cell; and a common source line switch SW2 serving as a common source line connecting means and including a transistor for holding the source line of an unselected memory cell at a potential higher than the ground potential.

In response to the source line control signal PYq, the word line control signal WLn and the write control signal WE, the SL decoder outputs a first control signal GA for controlling a ground line 2 working as an externally supplied power line to the gate electrode of the source line switch SW1 and outputs a second control signal GB for controlling a common source connecting line 3 working as another externally supplied power line to the gate electrode of the common source line switch SW2.

A reference numeral 4 denotes a reference potential generator connected with the common source connecting line 3 for adjusting and holding the low data holding potential of the unselected memory cell 1 at 0.6 V which is higher than the ground potential.

A first capacitor CSSL connected with the source potential control line VSL1 indicates a parasitic capacitance of the source potential control line VSL1, and the other source potential control lines respectively have their parasitic capacitances, which are not shown. A second capacitor CVPL connected with the common source connecting line 3 indicates a parasitic capacitance of the common source connecting line 3, and an additional capacitor can be provided when the capacitance is insufficient.

Now, the operation of the SRAM IC device having the aforementioned configuration will be described.

A read operation will be first described with reference to Table 1:

TABLE 1

| Read Operation (WE = 0) | | | | |
|---|---|---|---|---|
| WLn | PYq | GA | GB | VSLm |
| 1 | 1 | 1 | 0 | 0 V |
| 1 | 0 | 0 | 1 | 0.6 V |

As is shown in FIG. 2, it is assumed that the memory cell 1 connected with the bit line pair BL1 and /BL1 is selected. As is listed in Table 1, the write control signal WE is deactivated and the word line control signal WLn is activated in a read operation. In this case, the source line control signal PY1 and the first control signal GA in the source potential control circuit CSL1 of FIG. 2 are activated and the second control signal GB is deactivated, and hence, the source control line VSL1 is placed at the ground potential. On the other hand, in the unselected memory cells 1, the source line control signals PY2 through PY4 and the first control signals GA in the source potential control circuits CSL2 through CSL4 are deactivated and the second control signals GB are activated. As a result, the source control lines VSL2 through VSL4 are connected with the common source connecting line 3, and hence are set at a potential of 0.6 V which is higher than the ground potential.

In this manner, since a read current Ir in the selected memory cell 1 decreases the source potential of the first drive transistor N1 and increases the gate-source voltage Vgs thereof, the driving ability of the first drive transistor N1 is increased. Accordingly, a data in the memory cell 1 can be read without fail through the low voltage drive. Additionally, since the source potentials of the drive transistors in the unselected memory cells are increased, the amount of charge Q0 discharged through the source control lines VSL2 through VSL4 from the unselected bit lines BL2 through BL4, which is generated in activating the word line VWL, can be suppressed. Thus, the power consumption can be further decreased.

Figure 3:
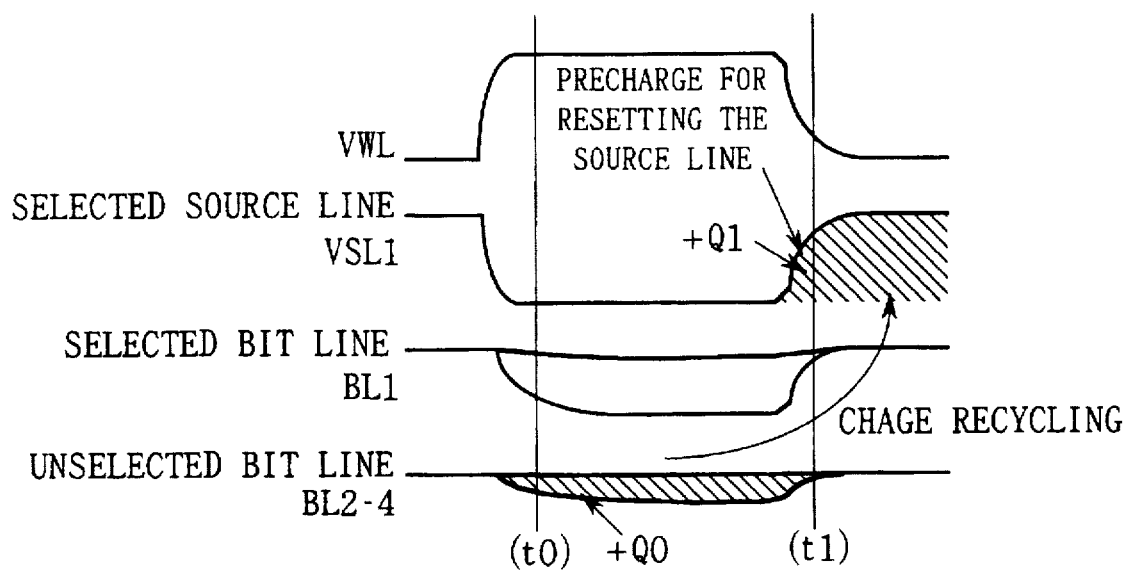
FIG. 3(a) is a timing chart for a read operation on a memory cell of the semiconductor SRAM IC device of the first embodiment.
FIG. 3(b) is a schematic diagram for illustrating recycle of charge in the memory cell of the semiconductor SRAM IC device of the first embodiment.
Figure 3:
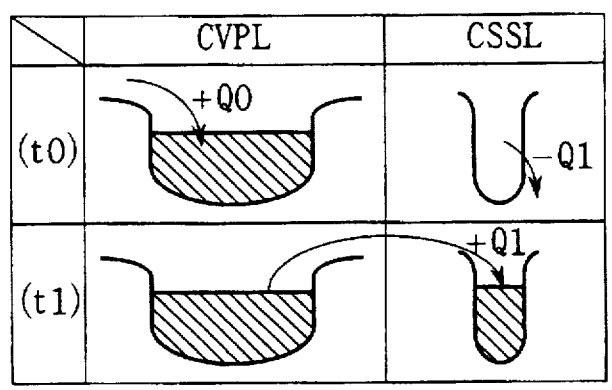

As is shown in a timing chart for a read operation of FIG. 3(a), time for starting a read operation is indicates as t0 and time for completing the read operation is indicated as t1.

At the read completing time t1, in the selected memory cell 1, the first control signal GA is deactivated and the second control signal GB is activated in the source potential control circuit CSL1. As a result, the source control line VSL1 is connected with the common source connecting line 3 to be set at the potential of 0.6 V.

In this case, the discharged charge Q0 is charged in the second capacitor CVPL. Therefore, a partial charge Q1 of the charge of the second capacitor CVPL is injected into the first capacitor CSSL, that is, the parasitic capacitance of the source control line VSL1, as is shown in FIG. 3(b). The charge can be thus recycled, resulting in further decreasing the power consumption.

Next, a write operation will be described with reference to Table 2:

TABLE 2

| Write Operation (WE = 1) | | | | |
|---|---|---|---|---|
| WLn | PYq | GA | GB | VSLm |
| 1 | 1 | 0 | 0 | Hi – Z |
| 1 | 0 | 0 | 1 | 0.6 V |

It is assumed that the memory cell 1 connected with the bit line pair BL1 and /BL1 is selected as is shown in FIG. 2. As listed in Table 2, the write control signal WE and the word line control signal WLn are activated in a write operation. In this case, the source control signal PY1 in the source potential control circuit CSL1 of FIG. 2 is activated and the first control signal GA and the second control signal GB are deactivated. As a result, the source control line VLS1 is placed in a floating state. On the other hand, in the unselected memory cells 1, the source line control signals PY2 through PY4 and the first control signal GA in the source potential control circuits CSL2 through CSL4 are deactivated, and the second control signals GB are activated. As a result, the source control lines VSL2 through VSL4 are connected with the common source connecting line 3 so as to be set at the potential of 0.6 V which is higher than the ground potential.

In this manner, the source control line VSL1 of the selected memory cell 1 is in the floating state in a write operation, and hence the source control line VSL1 attains high impedance, thereby turning off the drive transistors N1 and N2. As a result, a time required for attaining the predetermined potential of a high data can be shortened, resulting in a high speed write operation. In addition, since it is possible to prevent a through-current from flowing from a power supply for supplying the high data holding potential VH to the memory cell 1 during a write operation, the power consumption can be further decreased.

In this embodiment, the source control lines VSLq are parallel to the word line VWL, which does not limit the invention, and the source control lines VSLq can be parallel to the bit lines BLm.

Furthermore, the number of the source control lines VSLq connected with the common source connecting line 3 is determined correspondingly to the four memory cells 1, but the number can be determined correspondingly to eight memory cells 1. However, in order to suppress the loads of the source control lines VSLq, the source control lines VSLq are divided into a possible larger number.

Moreover, in a stand-by period when neither a read operation nor a write operation is conducted, when the source potential of one of the access transistors N3 and N4 connected with the low data holding means is higher than the ground potential Vss, the threshold voltage Vt of that access transistor is increased due to the substrate bias effect. As a result, a leakage current can be suppressed. The substrate bias effect will be described in the embodiment described below.

Now, the entire configuration of a data storage device adopted in each of the following embodiments will be described.

Figure 4:
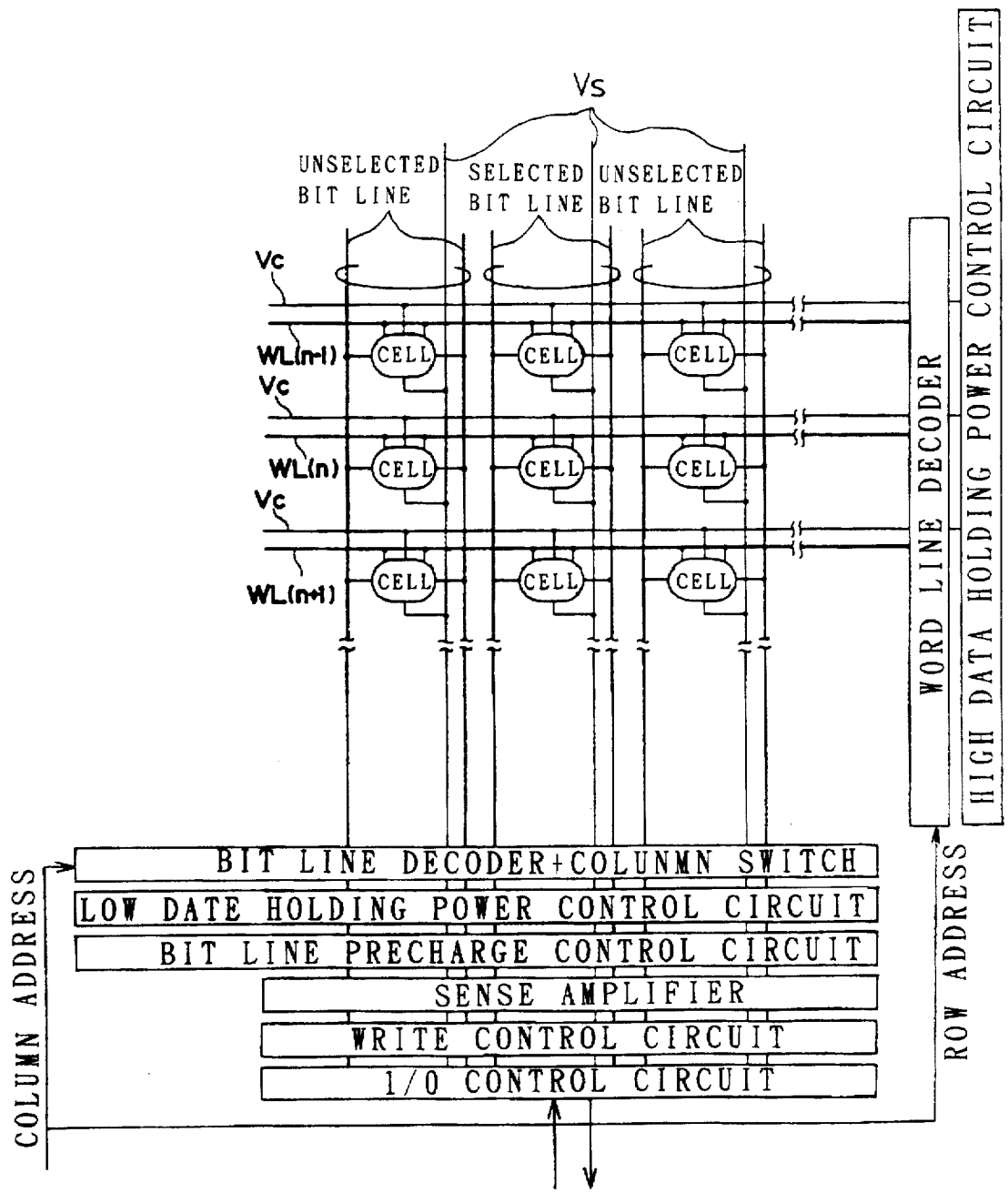
FIG. 4 shows the entire configuration of the semiconductor SRAM IC device of the invention.
Figure 5:
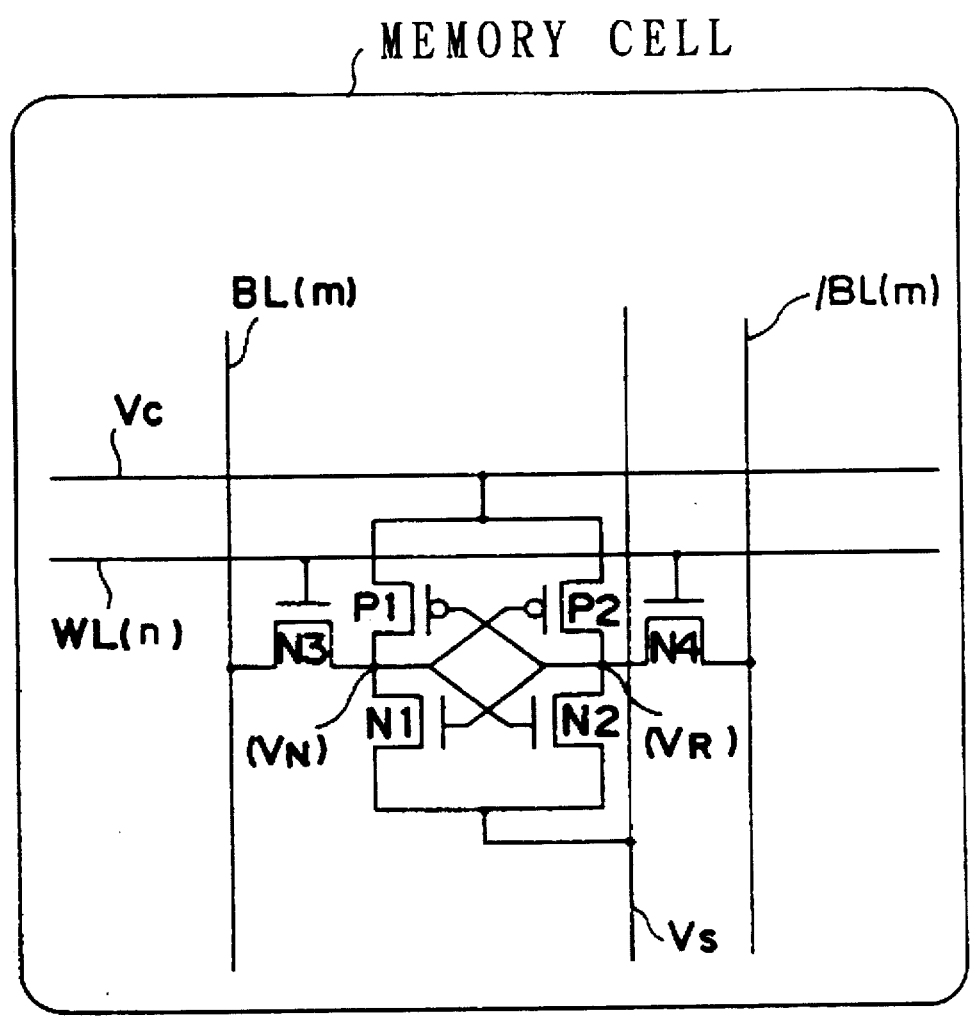
FIG. 5 is a circuit diagram of a memory cell in the semiconductor SRAM IC device of the invention.

FIG. 4 shows the entire configuration of a semiconductor SRAM IC device exemplified as the present data storage device, and FIG. 5 is a circuit diagram of a memory cell included in the semiconductor SRAM IC device. As is shown in FIG. 4, with the memory cells aligned in the form of an array of n rows by m columns disposed as the center, the following peripheral circuits are disposed in a column address selecting direction: a bit line decoder for decoding an externally input column address and a column switch for selecting a desired bit line pair among a plurality of bit line pairs on the basis of the decoded column address; a low data holding power control circuit for controlling a potential of a low data; a bit line precharge control circuit for precharging the memory cells; a sense amplifier for detecting a high or low data which has been held by a memory node of a memory cell and is read through a bit line pair; a write control circuit for writing a data in a memory cell; and an I/O control circuit for controlling read and write operations. Peripheral circuits disposed in a row address selecting direction are a word line decoder for decoding an externally input row address and a high data holding power control circuit for controlling a potential of a high data.

Figure 38:
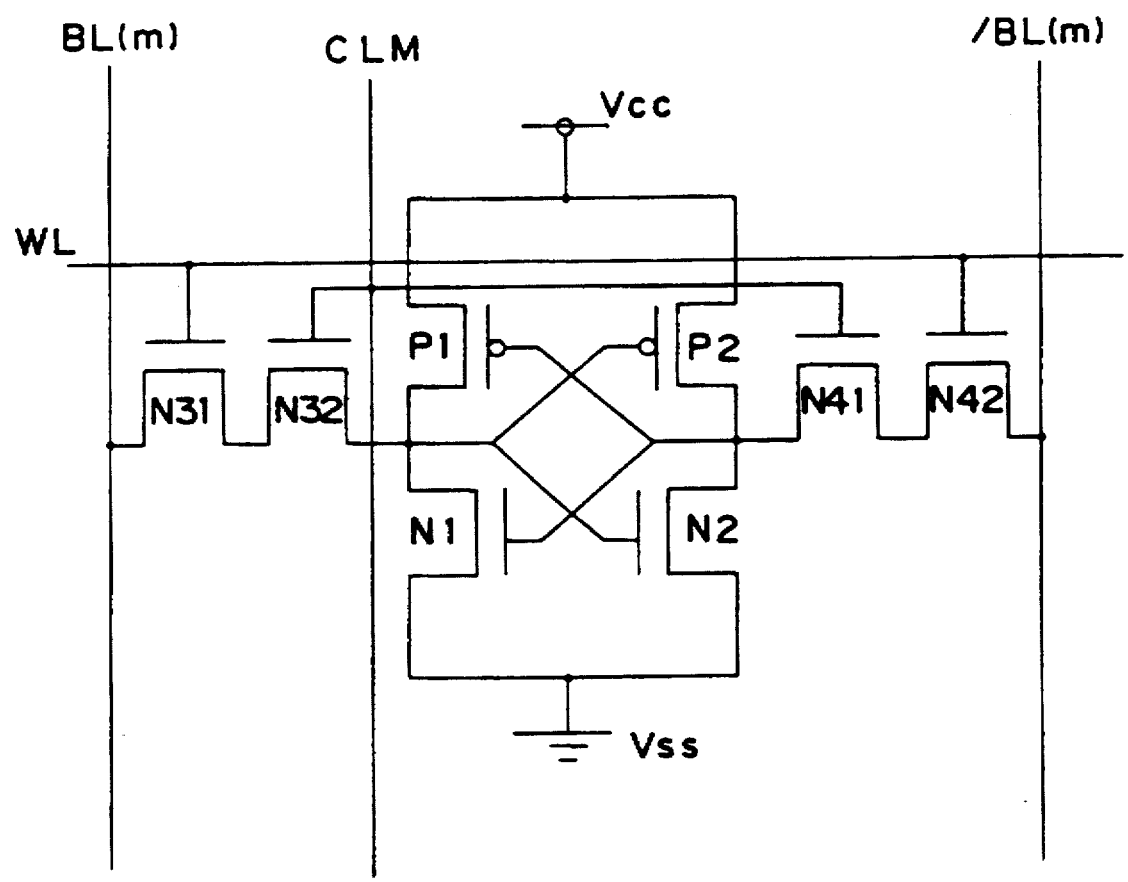
FIG. 38 is a circuit diagram of a memory cell in a conventional semiconductor SRAM IC device.

The memory cell shown in FIG. 5 is different from the conventional small power consumption type memory cell shown in FIG. 38 as follows: N3 denotes a first access transistor connected with a first memory node VN and a bit line BL(m) and activated through a word line WL(n); N4 denotes a second access transistor connected with a second memory node VR and a bit complementary line /BL(m) and activated through the word line WL(n); Vc denotes a high data holding power line connected with a common source electrode shared by load transistor pair P1 and P2 for supplying a potential of a high data to the first memory node VN and the second memory node VR; and Vs denotes a low data holding power line connected with a common source electrode shared by drive transistor pair N1 and N2 for supplying a potential of a low data to the first memory node VN and the second memory node VR. The high data holding power line Vc extends in the row address selecting direction parallel to the word line WL(n), and the low data holding power line Vs extends in the column address selecting direction parallel to the bit line BL(m).

The various embodiments of the aforementioned semiconductor SRAM IC device will now be described.

Figure 6A:
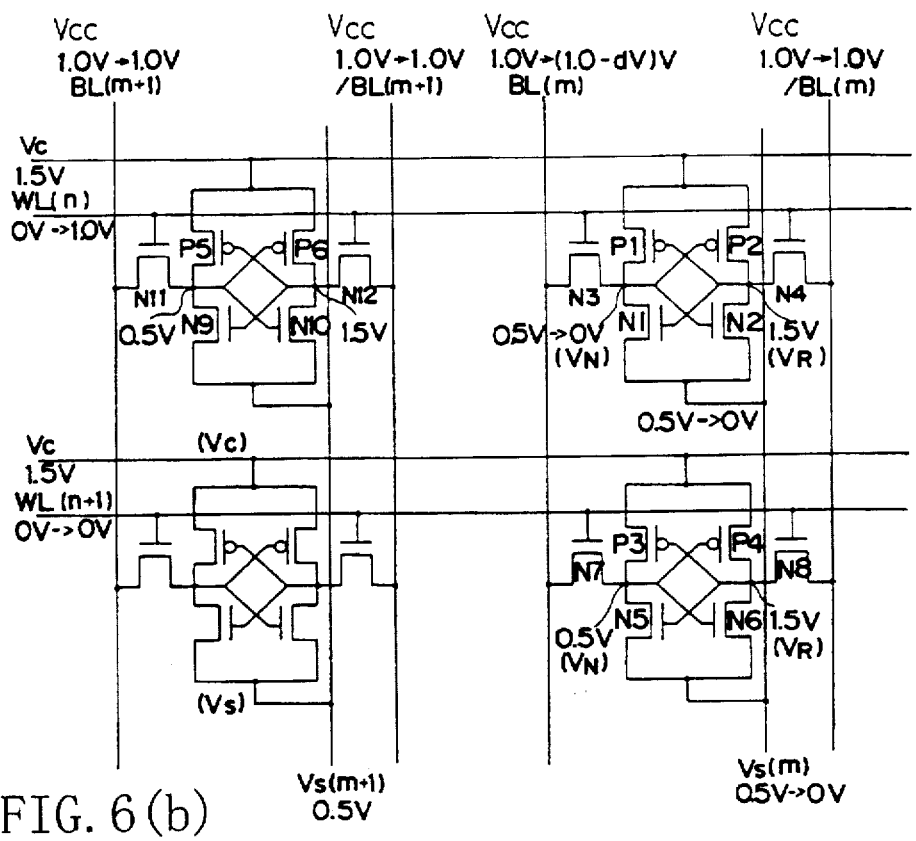
Figure 6B:
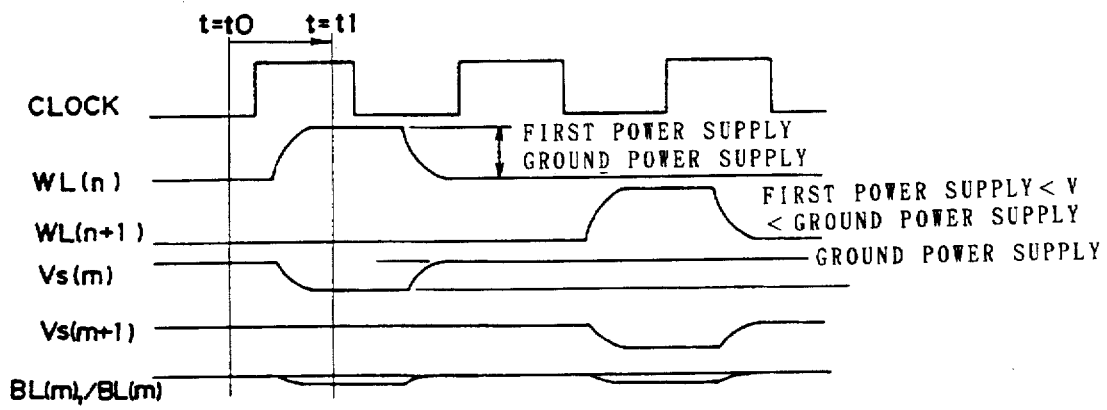

FIGS. 6(a) and 6(b) show the semiconductor SRAM IC device according to a second embodiment, wherein FIG. 6(a) is a circuit diagram of memory cells and FIG. 6(b) is a timing chart for a read operation. In FIG. 6(a), a transistor pair P3 and P4 and a transistor pair P5 and P6 respectively correspond to the load transistor pair P1 and P2; a transistor pair N5 and N6 and a transistor pair N9 and N10 respectively correspond to the drive transistor pair N1 and N2; and a transistor pair N7 and N8 and a transistor pair N11 and N12 respectively correspond to the access transistor pair N3 and N4. In FIG. 6(b), a signal CLOCK serves as a reference of control timing of the entire IC device or as a reference of operational timing for write and read operations, and word lines WL(n) and WL(n+1), low data holding power lines Vs(m) and Vs(m+1), and a bit line pair BL(m) and /BL(m) correspond to the respective signal lines shown in FIG. 6(a).

As is shown in FIG. 6(b), assuming that a read operation is started in response to a rise of the signal CLOCK between time t0 and time t1, the potentials of the respective signal lines vary with time in the following manner:

First, at time t0, the word lines WL(n) and WL(n+1) have a potential of 0 V, the low data holding power lines Vs(m) and Vs(m+1) have a potential of 0.5 V, the bit line pair BL(m) and /BL(m) have a potential of 1.0 V, and the high data holding power line Vc of FIG. 6(a) has a potential of 1.5 V.

Then, at time t1, the potential of the word line WL(n) selected at the rise of the signal CLOCK is increased to 1.0 V, i.e., the supply voltage Vcc, and the potential of the low data holding power line Vs(m) connected with the selected bit line pair BL(m) and /BL(m) is substantially simultaneously decreased to 0 V. Furthermore, assuming that a low data of 0.5 V is held by the first memory node VN and a high data of 1.5 V is held by the second memory node VR as is shown in FIG. 6(a), the first memory node VN becomes conductive with the bit line BL(m) and the low data holding power line Vs(m) through the first access transistor N3. As a result, the potential of the bit line BL(m) is slightly (=d V) decreased because the impedance of the bit line BL(m) becomes low. This causes a potential difference between the bit line pair BL(m) and /BL(m), and hence, the data held by the first memory node VN can be read by using this potential difference.

Figure 7A:
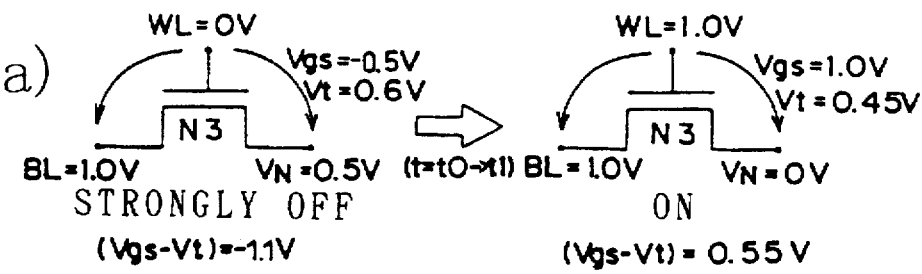

It will now be verified that the cross-point selection is effected in the aforementioned SRAM IC device with reference to FIGS. 7(a) through 7(d). FIGS. 7(a) through 7(d) show the conducting states of the access transistors and the like included in the memory cells of FIG. 6(a) during a read operation. As is shown in FIG. 7(a), in the first access transistor N3 connected with the selected bit line, the potential at the gate electrode connected with the word line WL(n) is 0 V and the potential at the source electrode connected with the first memory node VN is 0.5 V at time t0, and hence, the gate-source voltage Vgs is −0.5 V. Furthermore, assuming that the threshold voltage Vt thereof is set at 0.6 V, an effective voltage (Vgs−Vt) for defining a current value is −1.1 V, which means the first access transistor N3 is in a strong off-state. Then, at time t1, the potential at the gate electrode connected with the word line WL is 1.0 V and the potential at the source electrode connected with the first memory node VN is 0 V, and hence, the gate-source voltage Vgs is 1.0 V. Since the threshold voltage Vt is decreased from 0.6 V to 0.45 V due to the substrate bias effect described below, the effective voltage (Vgs−Vt) becomes 0.55 V, resulting in turning on the first access transistor N3.

Figure 7B:
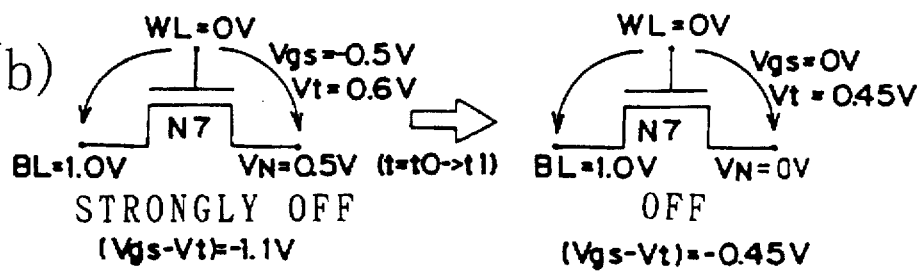

As is shown in FIG. 7(b), in the first access transistor N7 connected with the selected bit line, the description on the state at time t0 is omitted, and at time t1, the potential at the gate electrode connected with the word line WL(n+1) is 0 V and the potential at the source electrode connected with the first memory node VN is 0 V, and hence, the gate-source voltage Vgs thereof is 0 V. Since the threshold voltage Vt is decreased from 0.6 V to 0.45 V due to the substrate bias effect, the effective voltage (Vgs−Vt) becomes −0.45 V. As a result, the first access transistor N7 remains to be in an off-state at time t1.

Figure 7C:
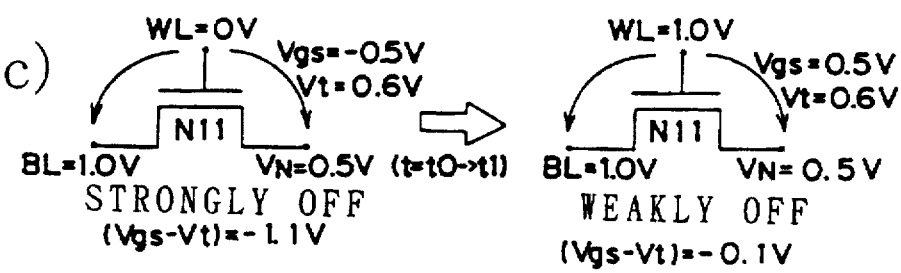

As is shown in FIG. 7(c), in the first access transistor N11 connected with the unselected bit line BL(n+1), the description of the state at time t0 is omitted, and at time t1, the potential at the gate electrode connected with the word line WL(n) is 1.0 V and the potential at the source electrode connected with the first memory node VN is 0.5 V, and hence, the gate-source voltage Vgs is 0.5 V. Since the threshold voltage Vt is 0.6 V, the effective voltage (Vgs−Vt) is −0.1 V, and hence, the first access transistor N11 remains to be in an off-state and is not conductive at time t1.

Figure 7D:
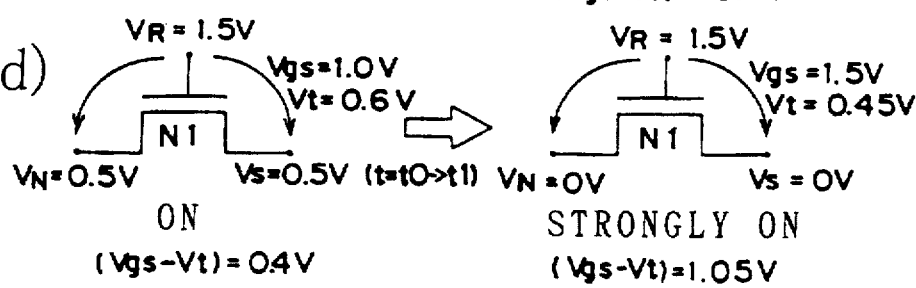

As is shown in FIG. 7(d), in the first drive transistor N1 of the memory cell connected with the selected bit line, the description of the state at time t0 is omitted, and at time t1, the potential at the gate electrode connected with the second memory node VR is 1.5 V and the potential at the source electrode connected with the low data holding power line Vs is 0 V, and hence, the gate-source voltage Vgs thereof is 1.5 V. Since the threshold voltage Vt is decreased from 0.6 V to 0.45 V due to the substrate bias effect, the effective voltage (Vgs–Vt) becomes 1.05 V, and hence, the conducting state of the first drive transistor N1 changes from an on-state to a strong on-state.

In this manner, when the first access transistor N3 connected with the selected word line WL(n) and the selected bit line BL(m) is compared with the first access transistor N11 connected with the selected word line WL(n) and the unselected bit line BL(m+1) at time t1, there is a difference of 0.65 V in the effective voltage (Vgs+Vt) for defining the current value. Accordingly, the reading ability of the memory cell connected with the unselected bit line BL(m+1) is suppressed to be lower by one or more figures. As a result, even though two access transistors are not used in the present SRAM IC device differently from the conventional small power consumption type SRAM, the cross-point selection can be effected.

Figure 8:
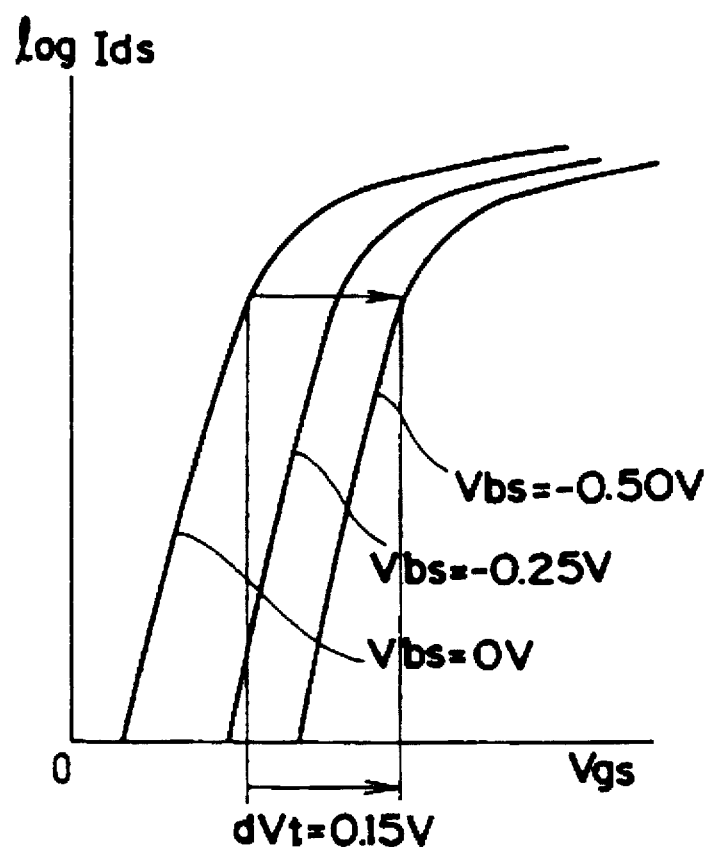
FIG. 8 is a correlation diagram between a gate-source voltage Vgs and a logarithm of a drain-source current Ids by using a substrate bias potential Vbs as a parameter.

Now, the substrate bias effect will be described with reference to FIG. 8. FIG. 8 is a correlation diagram between a gate-source voltage Vgs and a logarithm of a drain-source current Ids by using a substrate bias potential Vbs as a parameter. The relationship between the substrate bias potential Vbs and the threshold voltage Vt is represented by the following equation:

$$Vt = Vfb + (2 \times Phi) + Gamma \times \sqrt{(2 \times Phi - Vbs)} \quad (1)$$

The correlation diagram of FIG. 8 shows that when the absolute value of the substrate bias potential Vbs, which is a potential difference between a semiconductor substrate bearing the SRAM and the source electrode of a transistor included in the SRAM, is increased by 0.5 V, the threshold voltage Vt is increased by 0.15 V, whereas the substrate bias potential Vbs has a negative value.

In the equation (1), Vfb indicates a flat band voltage, Phi indicates a Fermi level, and Gamma indicates a coefficient of the substrate bias effect, and these are parameters determined depending upon the material for the semiconductor. Therefore, the threshold voltage Vt can be univocally varied by controlling the substrate bias potential Vbs.

As a characteristic of this embodiment, a first potential difference (Va) of a data stored in the memory node of a selected memory cell is controlled to be larger than a second potential difference (Vb) of a data stored in the memory node of an unselected memory cell. Accordingly, the cross-point selection can be effected without increasing the number of the access transistors. In addition, by decreasing the potential of the low data holding power line Vs(m) to the ground potential in a read operation, the absolute value of the substrate bias potential Vbs is decreased so as to cause the substrate bias effect, resulting in decreasing the threshold voltage. Thus, the read operation can be definitely conducted even when the potential of the high data holding power line Vc is 1.5 V.

The first potential difference Va and the second potential difference Vb are given as follows:

| | | |
|---|---|---|
| Va | = | (the potential of the high data holding power line Vc) – (the potential of the low data holding power line Vs(m)) |
| | = | 1.5 V – 0 V |
| | = | 1.5 V |
| Vb | = | (the potential of the high data holding power line Vc) – (the potential of the low data holding power line Vs (m + 1)) |
| | = | 1.5 V – 0.5 V |
| | = | 1.0 V |

Figure 9A:
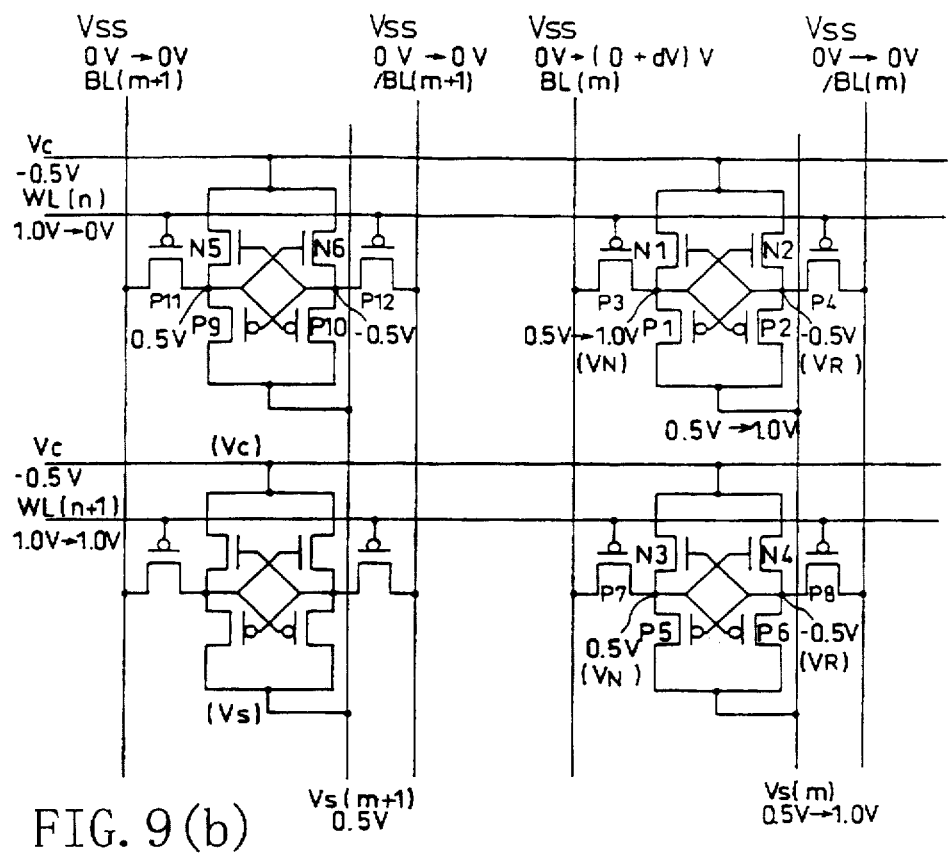
Figure 9B:
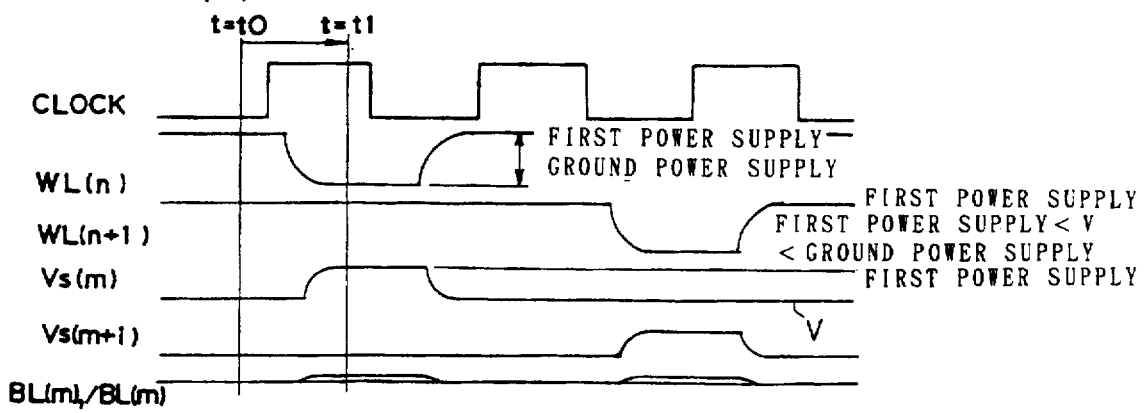

Modification of the second embodiment will now be described referring to FIGS. 9(a) and 9(b) and 10(a) through 10(d). FIGS. 9(a) and 9(b) show a semiconductor SRAM IC device obtained by modifying the second embodiment of this invention, wherein FIG. 9(a) is a circuit diagram of memory cells and FIG. 9(b) is a timing chart for a read operation. FIGS. 10(a) through 10(d) show the conducting states of the access transistors and the like included in the memory cells of the FIG. 9(a). The memory cells of FIG. 9(a) can be obtained by inverting the polarities of the transistors included in the memory cells of FIG. 6(a).

Figure 10A:
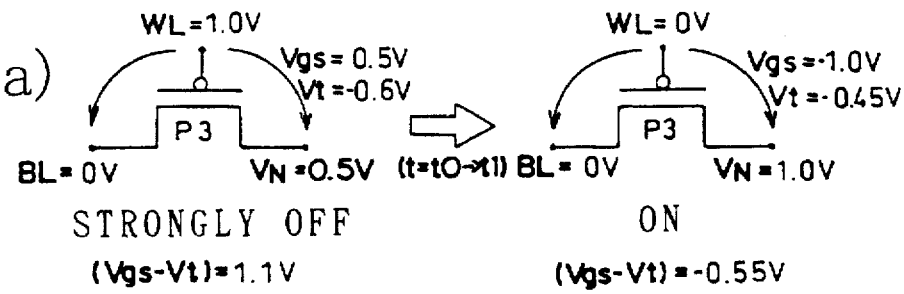
Figure 10B:
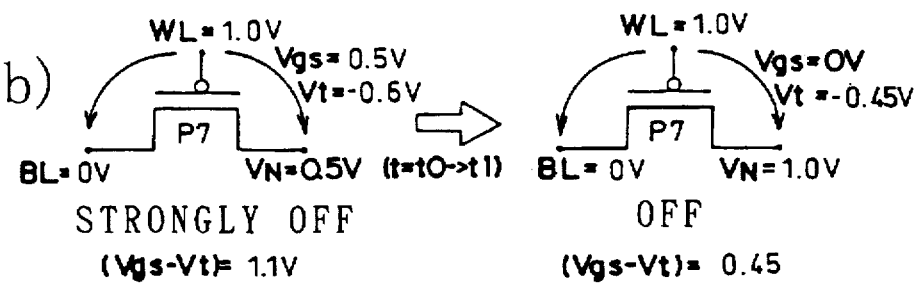
Figure 10C:
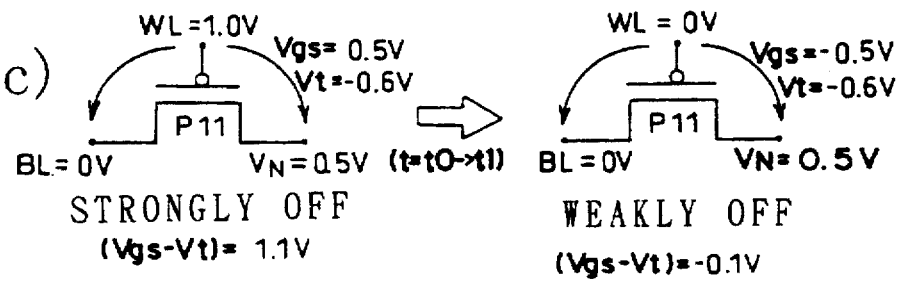
Figure 10D:
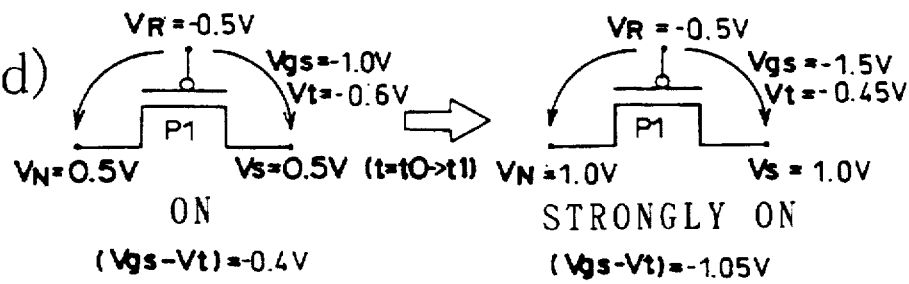

As is shown in FIGS. 9(a), 9(b) and 10(a), merely the first access transistor P3 connected with the selected word line WL(n) and bit line BL(m) is in an on-state among the access transistors, similarly to the second embodiment.

Accordingly, also the semiconductor SRAM IC device including the transistors having the reverse polarities to those of the second embodiment can attain the same characteristics as those of the second embodiment.

In this modification, the first potential difference Va and the second potential difference Vb are given as follows:

| | | |
|---|---|---|
| Va | = | (the potential of the high data holding power line Vs(m)) – (the potential of the low data holding power line Vc) |
| | = | 1.0 V – (–0.5) V |
| | = | 1.5 V |
| Vb | = | (the potential of the high data holding power line Vs(m + 1)) – (the potential of the low data holding power line Vc) |
| | = | 0.5 V – (–0.5) V |
| | = | 1.0 V |

Thus, the first and second potential differences Va and Vb have the same values as those of the second embodiment.

As described with regard to the second embodiment and its modification, it goes without saying that a semiconductor SRAM IC device including transistors having reverse polarities to those of each embodiment described below can attain the same characteristics of those of the embodiment.

Figure 11:
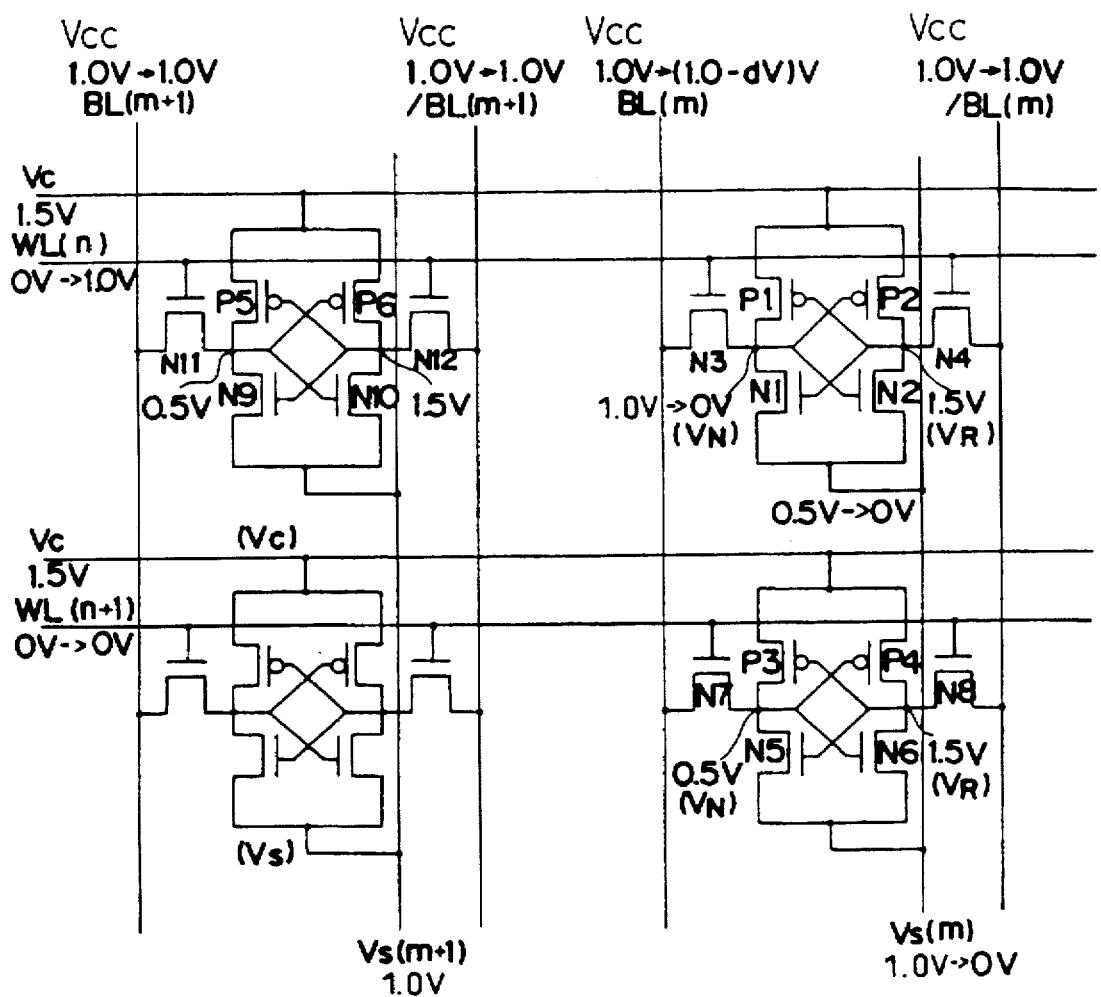
FIG. 11 is a circuit diagram of a memory cell array in a semiconductor SRAM IC device according to a third embodiment of the invention.

Now, the semiconductor SRAM IC device according to a third embodiment of the invention will be described with reference to FIG. 11. As a characteristic of this embodiment, in a read operation, a low data holding power line Vs(m+1) of a memory cell connected with an unselected bit line is set not at 0.5 V, that is, the intermediate potential between the supply voltage Vcc for the peripheral circuits and the ground voltage Vss, as in the second embodiment, but at the supply voltage Vcc as is shown in FIG. 11.

In this embodiment, the first potential difference Va is 1.5 V (i.e., 1.5 V–0 V) and the second potential difference Vb is 0.5 V (i.e., 1.5 V–1.0 V).

Thus, not only a generator for an intermediate potential can be omitted, but also a potential difference between the low data holding power line Vs(m) of a memory cell connected with a selected bit line BL(m) and the low data holding power line Vs(m+1) of a memory cell connected with an unselected bit line BL(m+1) can be increased. As a result, the on-off ratio between the first access transistor N3 of the selected memory cell and the first access transistor N11 of the unselected memory cell can be increased, resulting in large cross-point selectivity. Accordingly, the power consumption of this device can be stably decreased.

An intermediate potential generator used in such a device generally has high impedance, and hence, its efficiency is poor in the case where a large amount of a current flows as in the low data holding power line Vs. In the case where the potential of the high data holding power line Vc is to be increased, however, the supply potential Vcc is increased by approximately merely 0.6 V and additionally, there is no need to cause a current from the increased potential.

Therefore, its efficiency is not degraded and a step-up potential of twice or three times as large as the supply potential can be comparatively easily obtained as in a flash EEPROM.

Figure 12:
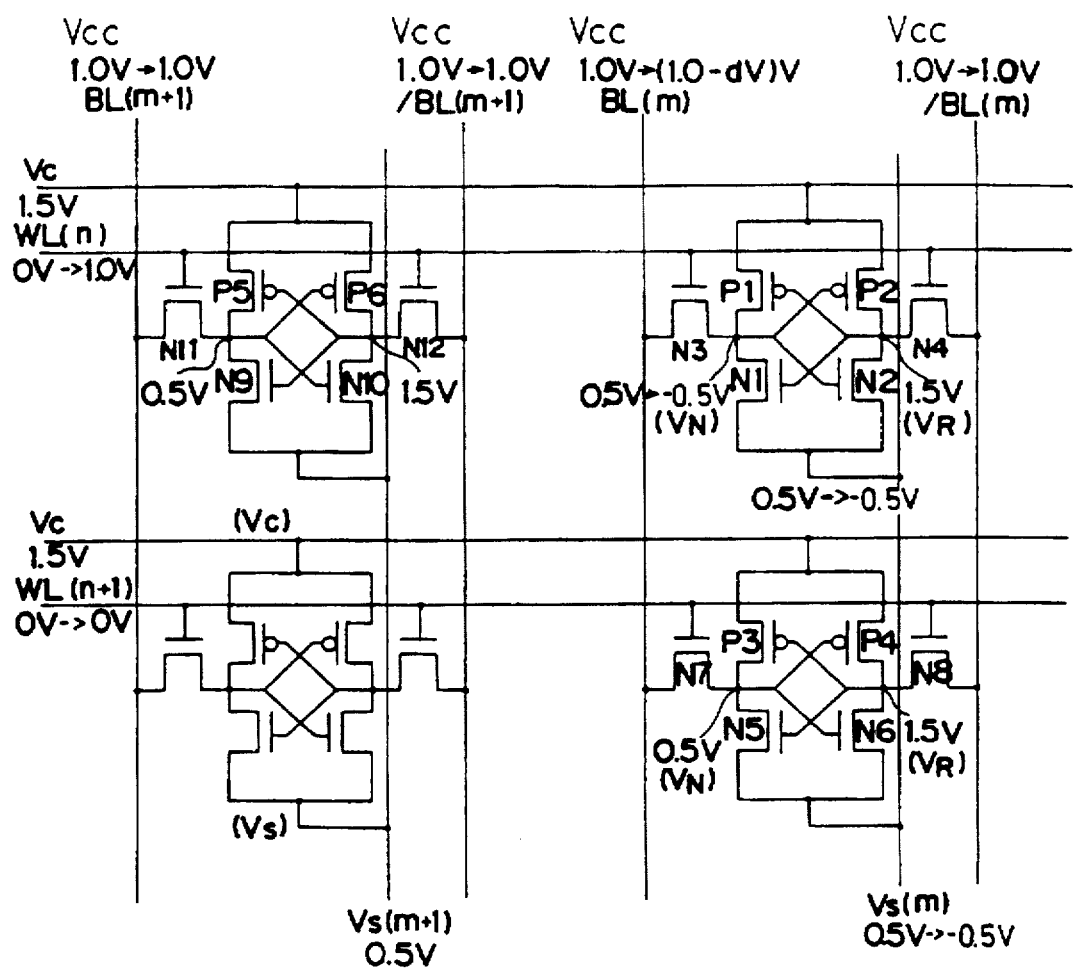
FIG. 12 is a circuit diagram of a memory cell array in a semiconductor SRAM IC device according to a fourth embodiment of the invention.

Now, the semiconductor SRAM IC device according to a fourth embodiment of the invention will be described with reference to FIG. 12. In a read operation of this semiconductor SRAM IC device, a low data holding power line Vs(m+1) of a memory cell connected with an unselected bit line is set at 0.5 V, that is, the intermediate potential between the supply potential Vcc for the peripheral circuits and the ground potential Vss, and a low data holding power line Vs(m) of a memory cell connected with a selected bit line BL(m) is set at a negative potential of −0.5 V as is shown in FIG. 12.

Thus, even when the supply potential Vcc is set at a potential as low as 0.5V, the selected memory cell can be read with the low data holding power line Vs(m) over-driven to a negative potential, and hence, a rapid read operation can be conducted.

As a characteristic of this embodiment, the supply potential Vcc can be set lower than in the third embodiment and a high speed read operation can be attained. It goes without saying that the potential of the low data holding power line Vs(m+1) of the memory cell connected with the unselected bit line can be set at the supply potential Vcc for the peripheral circuits as in the third embodiment.

Now, the semiconductor SRAM IC device according to a fifth embodiment of the invention will be described with reference to the drawings. As is shown in FIGS. 6(a), 6(b) and 13(a) through 13(d), the threshold voltage Vt of first access transistors N3, N7, N11 and the like and first drive transistors N1, N5, N9 and the like is set at 0.15 V. The threshold voltage is not limited to this value but can significantly be smaller than the threshold voltage Vt (=0.6 V) of transistors included in the conventional SRAM and also smaller than 0.35 V, which is conventionally unattainable.

Figure 13A:
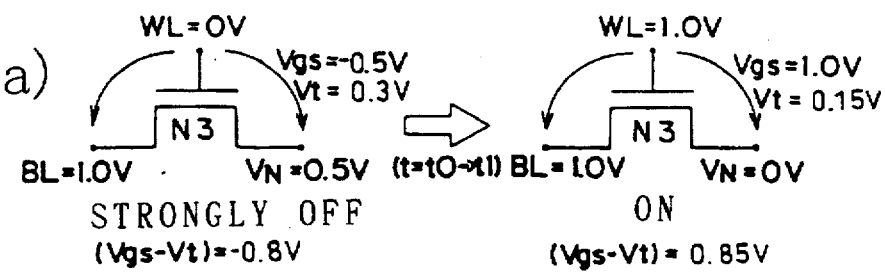
Figure 13B:
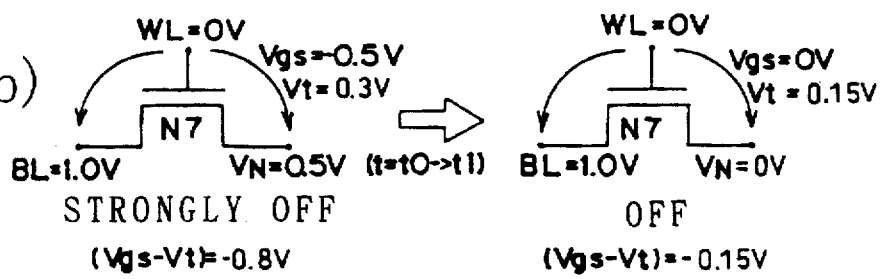
Figure 13C:
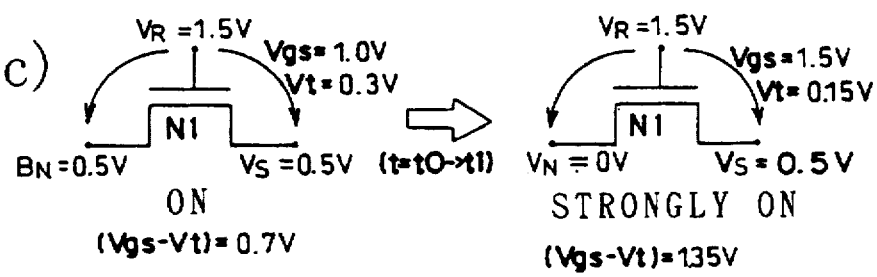
Figure 13D:
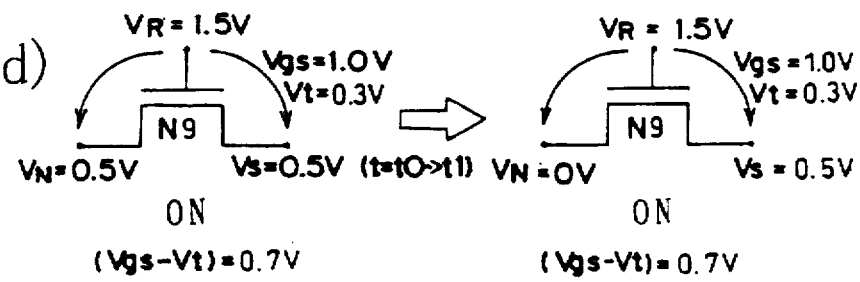

In this semiconductor SRAM IC device, the threshold voltage of the respective transistors can be thus decreased because, in a stand-by state, for example, at time t0 shown in FIG. 6(b), a leakage current decreases for the following two reasons:

First, for example, in the first access transistor N7 of FIG. 13(b), the source electrode connected with the first memory node VN has a potential of 0.5 V in the stand-by period, and the absolute value of the substrate bias potential Vbs is increased by 0.5 V. Accordingly, even when the threshold voltage Vt on the basis of the ground potential Vss is as low as 0.15 V, the threshold voltage Vt is increased by 0.15 V to 0.3 V due to the substrate bias effect described referring to FIG. 8. When the threshold voltage Vt is increased by 0.15 V, the amount of a leakage current decreases by one and a half figures.

Second, for example, in the first access transistor N7, while the potential of the word line WL(n+1) corresponding to the potential of the gate electrode is 0 V, the potential of the source electrode is 0.5 V. Thus, there is a negative difference of −0.5 V in the gate-source voltage Vgs.

The lowest limit of the threshold voltage is conventionally 0.35 V for the following reason: A practical number of memory cells in an SRAM is million or more. It is known that a leakage current in each memory cell is required to be suppressed to 1 pico ampere in order to suppress a leakage current in all the million memory cells to 1 micro ampere or less. For this purpose, the threshold voltage of each transistor included in the SRAM is required to be set at 0.35 V or more. Since the leakage current depends upon the threshold voltage alone, it is impossible to set the threshold voltage at a value smaller than 0.35 V during the stand-by period when a leakage current causes a problem.

In an operation period, however, a leakage current of approximately 1 milliampere is allowable, and hence, the threshold voltage Vt can be smaller than 0.35 V.

As a characteristic of this embodiment, the dynamically effective threshold voltage can be increased and the gate-source potential can be made negative by controlling the source potential, so as to avoid the problem of the leakage current. Accordingly, the threshold voltage Vt can be set at a smaller value than 0.35 V.

Figure 14A:
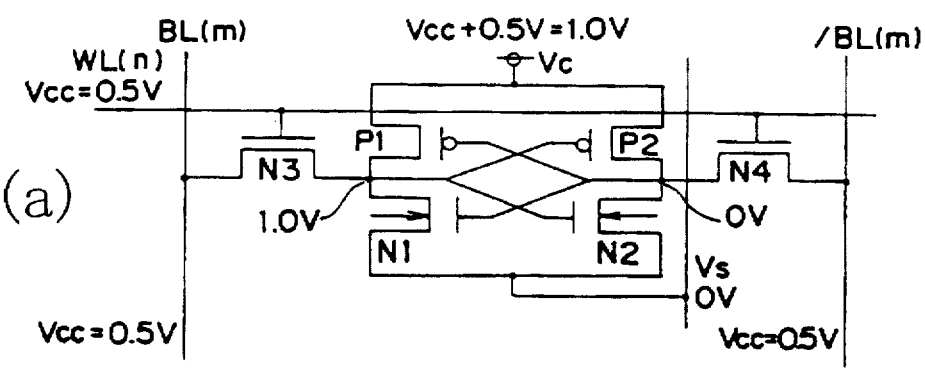

Now, the semiconductor SRAM IC device according to a sixth embodiment of the invention will be described with reference to the drawings. In circuit diagrams shown in FIGS. 14(a), 14(b), 15(a) and 15(b), the potentials of a high data holding power line Vc and a low data holding power line Vs are controlled in an activating period, that is, a first operation mode for conducting a read or write operation, and in a stand-by period, that is, a second operation mode for not conducting a read or write operation. FIG. 14(a) shows a selected memory cell in an activating period, FIG. 14(b) shows a semi-selected memory cell in an activating period, FIG. 15(a) shows an unselected memory cell in an activating period, and FIG. 15(b) shows a memory cell in a stand-by period.

Figure 14B:
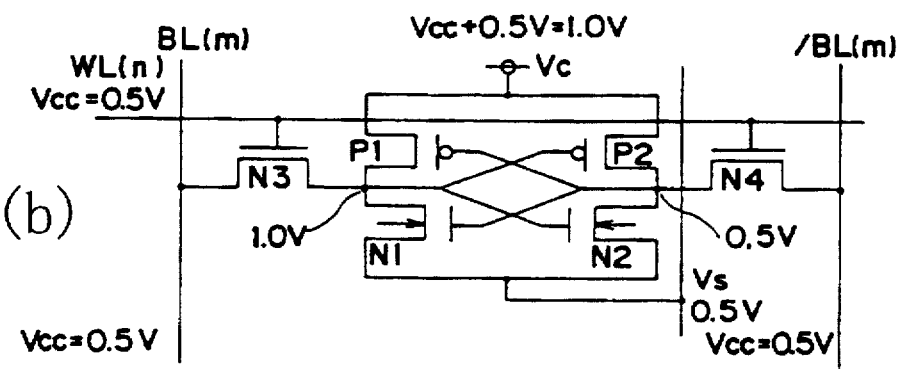

In the semi-selected memory cell in an activating period shown in FIG. 14(b), only the selected word line WL is supplied with the supply potential Vcc and the low data holding power line Vs is not supplied with the ground potential Vss.

Figure 15A:
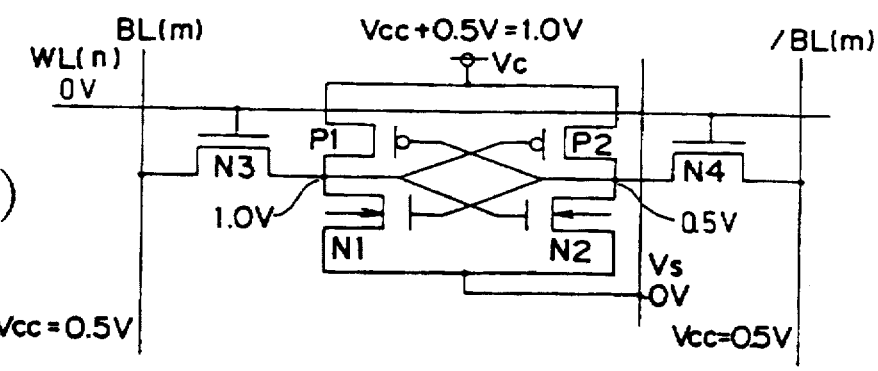

First, as is shown in FIGS. 14(b) and 15(a), in the activating period (excluding a selected memory cell), the high data holding power line Vc has a potential of 1.0 V, i.e., the sum of the ground potential Vcc and 0.5 V, and the low data holding power line Vs has a potential of 0.5 V, i.e., the supply potential Vcc.

Figure 15B:
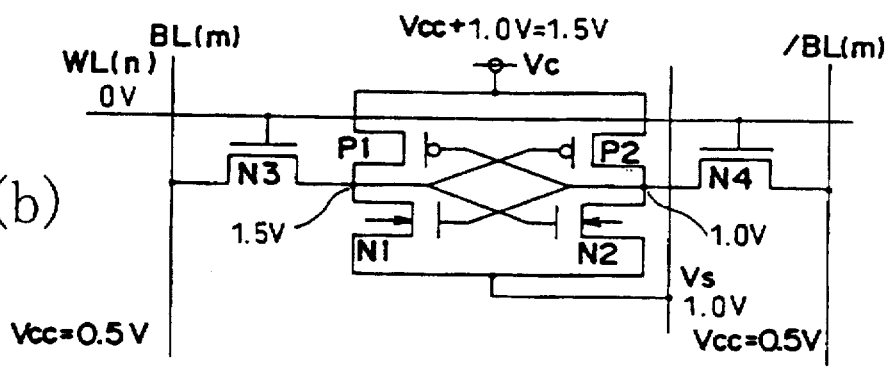

Next, as is shown in FIG. 15(b), in the stand-by period, the potential of the high data holding power line Vc is changed to 1.5 V, i.e., the sum of the supply potential Vcc and 1.0 V, and the potential of the low data holding power line Vs is changed to 1.0 V, i.e., the sum of the supply potential Vcc and 0.5 V. When the potential of the low data holding power line Vs is increased, the threshold voltage is increased due to the substrate bias effect of drive transistors N1 and N2 included in the memory cell.

As a characteristic of this embodiment, in the stand-by period which occupies a large part of an operation period, the potential at the source electrodes of the drive transistors N1, N2 and the like is increased by 1.0 V, so that the threshold voltage thereof is increased by 0.3 V due to the substrate bias effect, resulting in decreasing a leakage current by three figures. Conversely, in considering that the leakage current can be suppressed by three figures, the threshold voltage during the activating period can be set at a value smaller than the ordinary value by approximately 0.3 V. As a result, while the power consumption can be decreased through the low voltage drive using the supply potential Vcc of 0.5 V, the operation speed can be prevented from degrading.

Now, the semiconductor SRAM IC device according to first modification of the sixth embodiment will be described with reference to the drawings.

In this modification, the cycle frequency of a signal CLOCK serving as a timing reference for a read or write operation is relatively increased.

As is shown in FIG. 14(a), in the selected memory cell in the activating period of the sixth embodiment, the potential of the low data holding power line Vs is decreased from 0.5 V in the stand-by period to the ground potential Vss. However, in this modification, since the cycle frequency of the signal CLOCK is increased, the duration when the word line WL(n) is activated is unavoidably shortened. Therefore, the holding potential of 0.5 V during the stand-by period is required to be decreased to, for example, approximately 0.3 V, so as to secure a transition period for the low data holding power line Vs. When the cycle frequency of the signal CLOCK is relatively small, the DC component is dominant in a leakage current, but when the cycle frequency becomes relatively large, the charge/discharge amount becomes dominant. Therefore, the leakage current can be resultantly decreased.

Accordingly, as the cycle frequency of the signal CLOCK is increased, the potential of the low data holding power line during the stand-by period approximates to the ground potential Vss. It is noted that frequency dependent type data holding potential changing means and predetermined potential setting means, which are not shown in the drawings, serve as a low data holding power control circuit of this invention.

Alternatively, while the cycle frequency of the signal CLOCK is being increased, the potential of the high data holding power line Vc of the selected memory cell during the activating period can be increased to, for example, 1.5 V that is the same value as that in the stand-by period. In this manner, the gate potential of the second drive transistor N2 is increased, so that a data can be rapidly read.

Now, the semiconductor SRAM IC device according to second modification of the sixth embodiment will be described with reference to the drawings.

Also in this modification, the cycle frequency of the signal CLOCK serving as a timing reference for a read or write operation is relatively increased as in the first modification.

In a memory cell of this modification, it is assumed that the potential of the high data holding power line Vc and the low data holding power line Vs in the stand-by period shown in FIG. 15(b) are set at 1.5 V and 0.5 V, respectively.

As is described with regard to the first modification, the potential of the high data holding power line Vc can be increased to 2.0 V during the activating period from 1.5 V of the stand-by period.

However, since the cycle frequency of the signal CLOCK is large, the duration when the word line WL(n) is activated is unavoidably shortened. Therefore, it is necessary to increase the holding potential of 1.5 V of the stand-by period to, for example, approximately 1.7 V, so as to secure the transition period for the high data holding power line Vc. Since the charge/discharge amount becomes dominant in a leakage current as the cycle frequency becomes relatively large as described above, and hence, the leakage current can be decreased.

Accordingly, as the cycle frequency of the signal CLOCK is increased, the high data holding potential during the stand-by period approximates to the potential of the high data holding power line Vc during the activating period (herein 1.5 V). It is noted that frequency dependent type data holding potential changing means and predetermined potential setting means, which are not shown, serve as a high data holding power control circuit of this invention.

Also, while the cycle frequency of the signal CLOCK is being increased, the potential of the low data holding power line Vs of the selected memory cell in the activating period can be decreased to the ground potential Vss. In this manner, the gate-source voltage of the second drive transistor N2 can be increased, resulting in a rapid data read operation.

Figure 16:
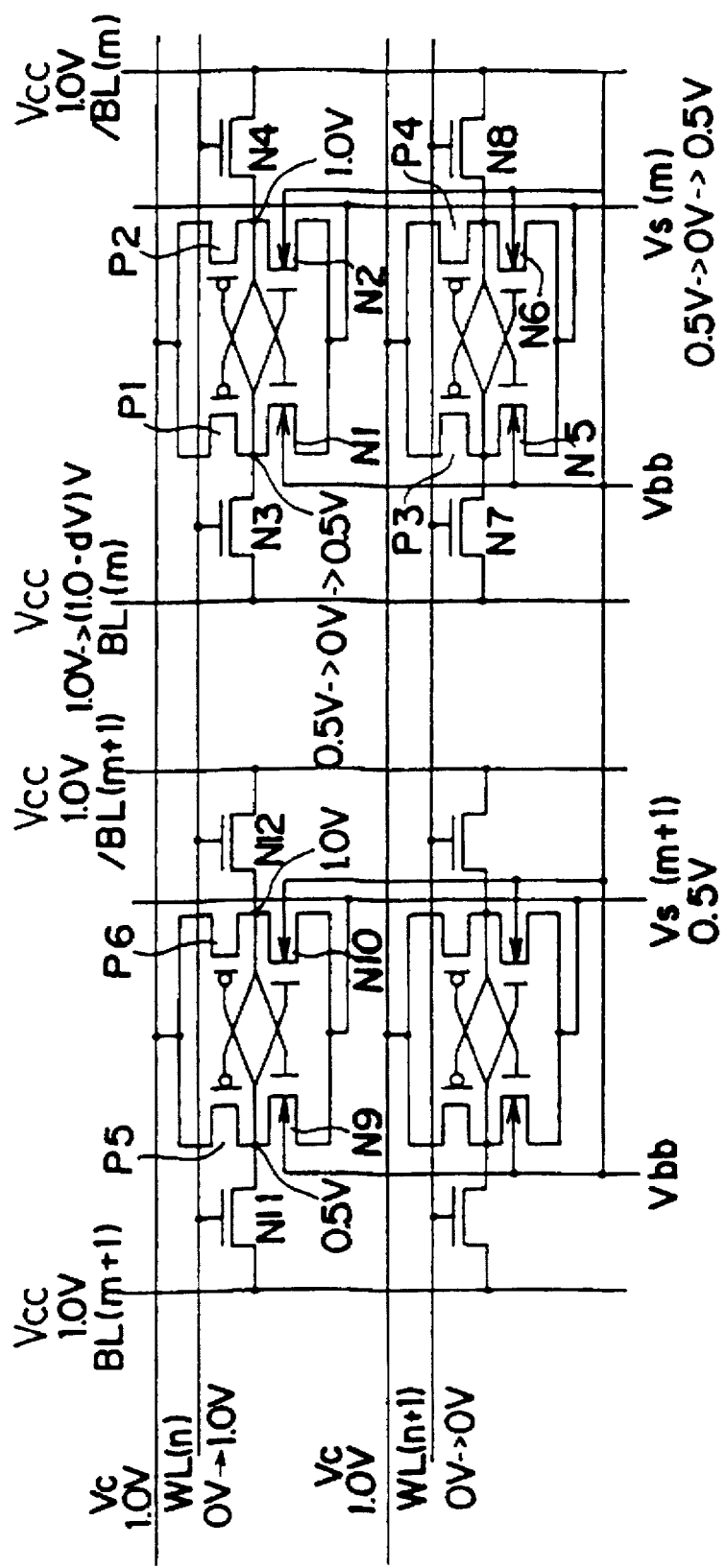
FIG. 16 is a circuit diagram of a memory cell array in a semiconductor SRAM IC device according to a seventh embodiment of the invention.
Figure 17:
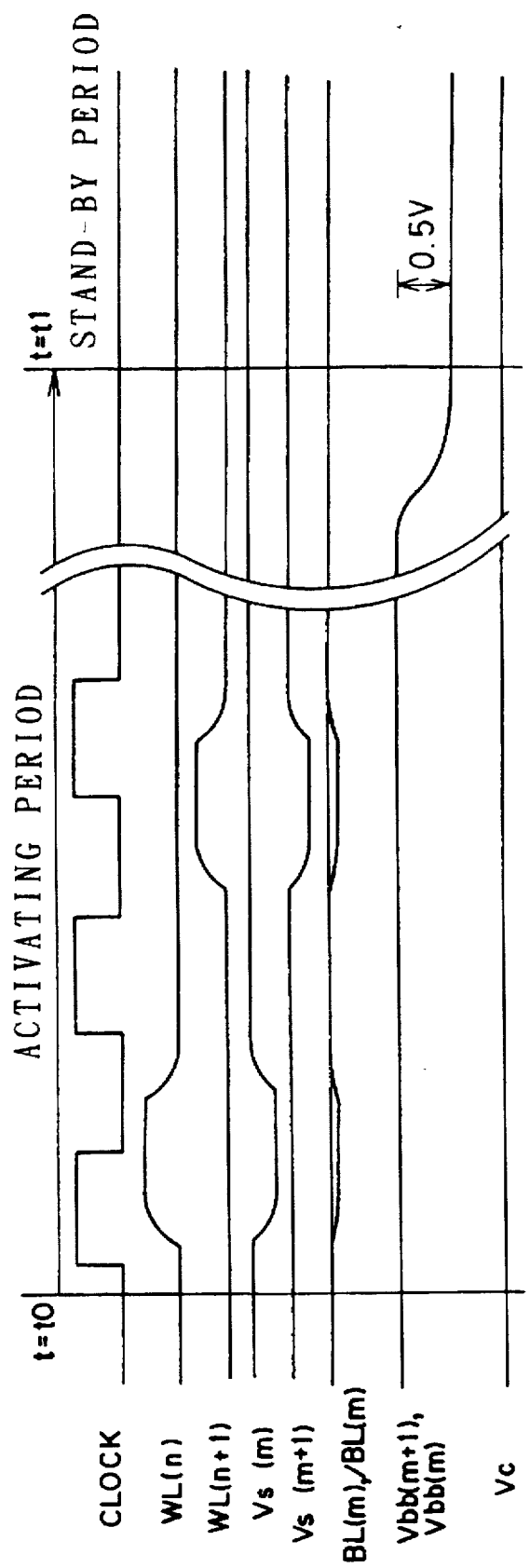
FIG. 17 is a timing chart for a read period and a stand-by period of the semiconductor SRAM IC device of the seventh embodiment.

Now, the semiconductor SRAM IC device according to a seventh embodiment of the invention will be described with reference to the drawings. As is shown in FIGS. 16 and 17, a substrate potential Vbb applied to a substrate in the stand-by period is set at −0.5 V on the basis of that in the activating period, so that the absolute value of the substrate bias potential Vbs is increased by 0.5 V. Therefore, the threshold voltage Vt of the drive transistors N1 and N2 and the like is increased by approximately 0.15 V due to the substrate bias effect, thereby suppressing a leakage current by one and a half figures.

Furthermore, the potential of the low data holding power line Vs is set at the ground potential Vss so as not to degrade the data latching ability of the memory cell.

Now, the semiconductor SRAM IC device according to modification of the seventh embodiment will be described. In this modification, the potential of the high data holding power line Vc is set at 1.5 V, that is, the sum of the supply potential Vcc and 1.0 V, in stead of setting the potential of the low data holding power line Vs at the ground potential Vss, so as not to degrade the data latching ability of the memory cell.

Next, the semiconductor SRAM IC device according to an eighth embodiment of the invention will be described with reference to the drawings. In this embodiment, device parameters are set so that the substrate bias effect caused in access transistors and drive transistors in a memory cell can be larger than the substrate bias effect caused in other transistors.

Figure 18A:
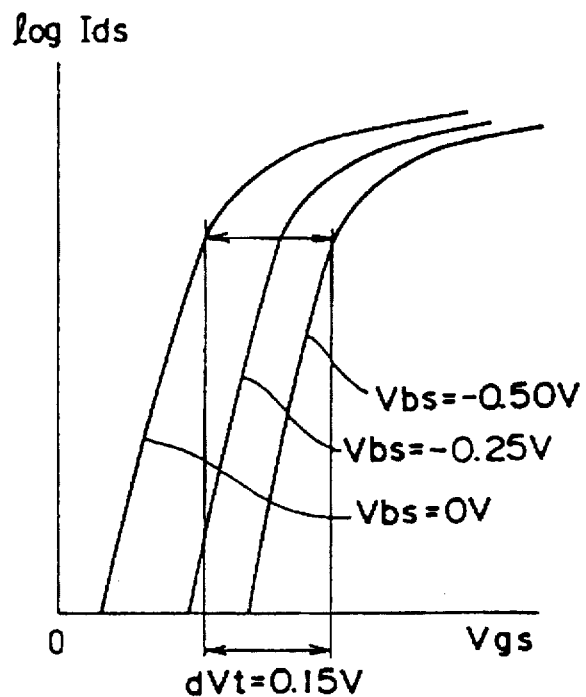
Figure 18B:
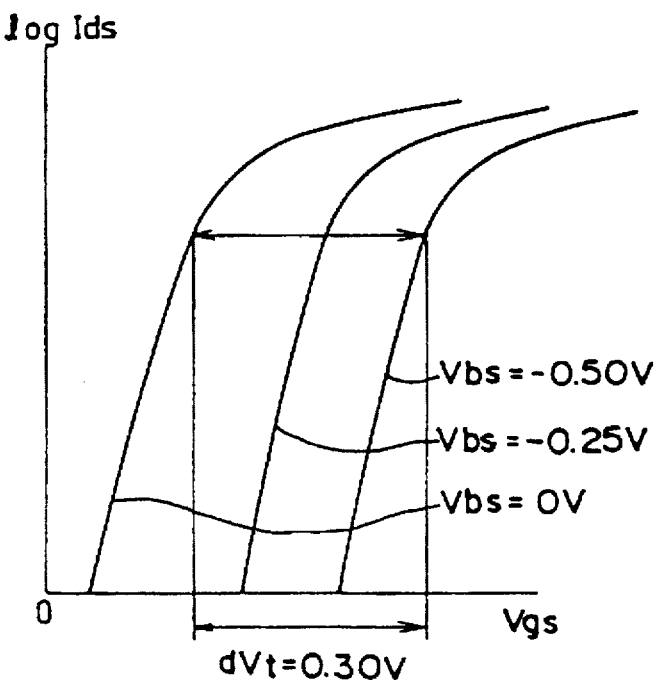

Specifically, when the substrate bias potential Vbs in a conventional semiconductor substrate is decreased by 0.5 V, the threshold voltage Vt is increased by merely 0.15 V as is shown in FIG. 18(a). In contrast, the device parameters of the transistors in this embodiment are set so that the threshold voltage Vt can be increased by 0.30 V as is shown in FIG. 18(b).

As is described in the second embodiment, the relationship between the substrate bias potential Vbs and the threshold voltage Vt is represented by the equation (1). Additionally, the other device parameters have the following relationships:

$$Vt = Vfb + (2 \times Phi) + Gamma \times \sqrt{(2 \times Phi - Vbs)} \quad (1)$$

$$dVt(Vbs) = Gamma \times [\sqrt{(2 \times Phi - Vbs)} - \sqrt{(2 \times Phi)}] \quad (2)$$

$$Vfb = Vms - Qss/Cox \quad (3)$$

$$Gamma \propto \sqrt{N} \quad (4)$$

In the additional device parameters represented by the equations (3) and (4), Vms indicates a difference in the work function between a semiconductor substrate and a gate electrode; Qss indicates the fixed charge amount within an insulating film; Cox indicates the dielectric constant in the insulating film; and N indicates an impurity concentration of the semiconductor substrate.

In order to enlarge the substrate bias effect, the coefficient Gamma of the substrate bias effect in the equation (1) is required to be set at a larger value. Since the value of the coefficient Gamma of the substrate bias effect is, as is shown in the equation (4), in proportion to the square root of the impurity concentration of the semiconductor substrate, the impurity concentration of the substrate is increased in order to increase the coefficient Gamma. However, when the impurity concentration is simply increased, there arises a problem that the threshold voltage itself is shifted to a larger value.

Figure 19A:
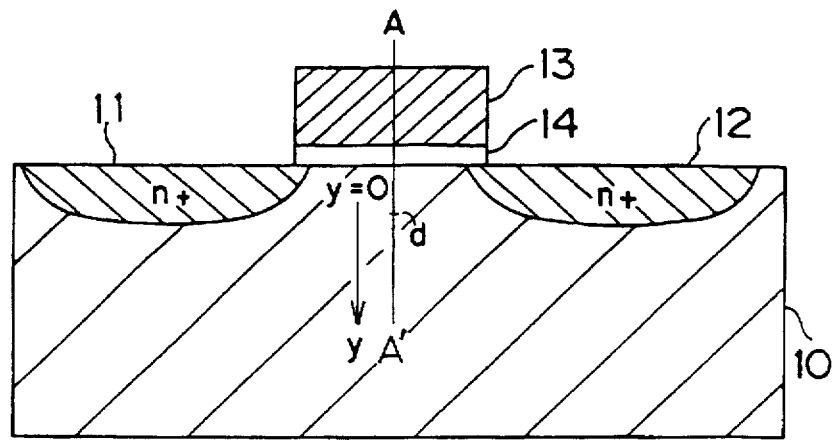
FIG. 19(a) is a sectional view of a MOS transistor used in a semiconductor SRAM IC device of the eighth embodiment.

Therefore, the profile of the impurity concentration of the substrate is designed so that the impurity concentration can be more steeply increased in the vicinity of a channel region which can affect the threshold voltage than in a conventional semiconductor substrate. This will be described by using an approximate model shown in FIG. 19(a). In FIG. 19(a), a reference numeral 10 denotes a semiconductor substrate of p-type silicon, reference numerals 11 and 12 denote source/drain regions doped with an n-type impurity, a reference numeral 13 denotes a gate electrode and a reference numeral 14 denotes an insulating film for insulating the gate electrode 13 from the semiconductor substrate 10. The following description will be made with regard to an impurity profile in a direction along a line A-A' of FIG. 19(a) vertical to the interface between the semiconductor substrate 10 and the insulating film 14. It is assumed that the direction along the line A-A' indicates the y axis and the origin (y=0) is placed at the interface between the semiconductor substrate 10 and the insulating film 14.

Figure 19B:
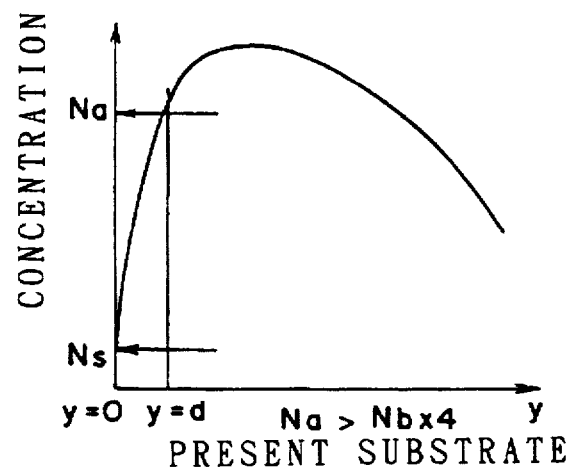
FIG. 19(b) shows an impurity concentration profile of the semiconductor substrate of the MOS transistor used in the semiconductor SRAM IC device of the eighth embodiment.
Figure 19C:
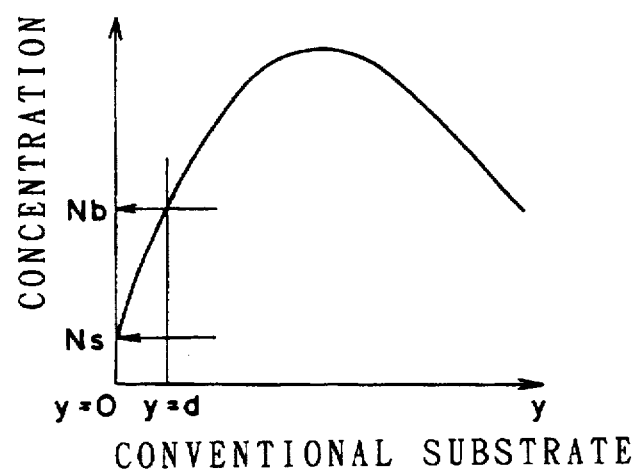
FIG. 19(c) shows an impurity concentration profile of a semiconductor substrate included in a conventional MOS transistor.

It is assumed that an impurity concentration Ns at the origin of the y axis determines the threshold voltage Vt obtained when the substrate bias potential Vbs is 0 V and that an impurity concentration Na at a point d on the y axis determines the threshold voltage Vt obtained when the substrate bias potential Vbs is −0.5 V. In such a case, the gradient of the graph obtained as the impurity concentration profile between the impurity concentrations Ns and Na of this embodiment shown in FIG. 19(b) is steeper than that of the graph between the impurity concentrations Ns and Nb of the conventional semiconductor substrate shown in FIG. 19(c).

Next, in order to increase the coefficient Gamma of the substrate bias effect while keeping the threshold voltage Vt constant, the flat band voltage Vfb of the equation (3) is increased toward the reverse direction to the sign of the threshold voltage Vt, namely, toward the negative direction. Thus, a desired threshold voltage Vt can be attained even when the threshold voltage Vt is largely shifted toward the positive direction due to the increase of the coefficient Gamma of the substrate bias effect.

At present, the flat band voltage Vfb of an n-type MOS transistor is approximately −0.9 V. Therefore, in consideration of the Fermi level (2×Phi) being 0.6 V, the member including the coefficient Gamma of the substrate bias effect can be corrected by merely approximately 0.9 V on the basis of the equation (1) when the threshold voltage Vt is to be set at 0.6 V. When the flat band voltage Vfb can be further decreased by approximately −0.5 V, the coefficient Gamma of the substrate bias effect can be accordingly increased, and hence, the substrate bias effect can be further increased.

Since the flat band voltage Vfb is given by the equation (3), the flat band voltage Vfb can be decreased by designing the device so that the fixed charge amount Qss in the insulating film 14 can be increased or the difference Vms in the work function between the gate electrode 13 and the semiconductor substrate 10 can be decreased.

Now, the semiconductor SRAM IC device according to a ninth embodiment of the invention will be described with reference to the drawings.

Figure 20:
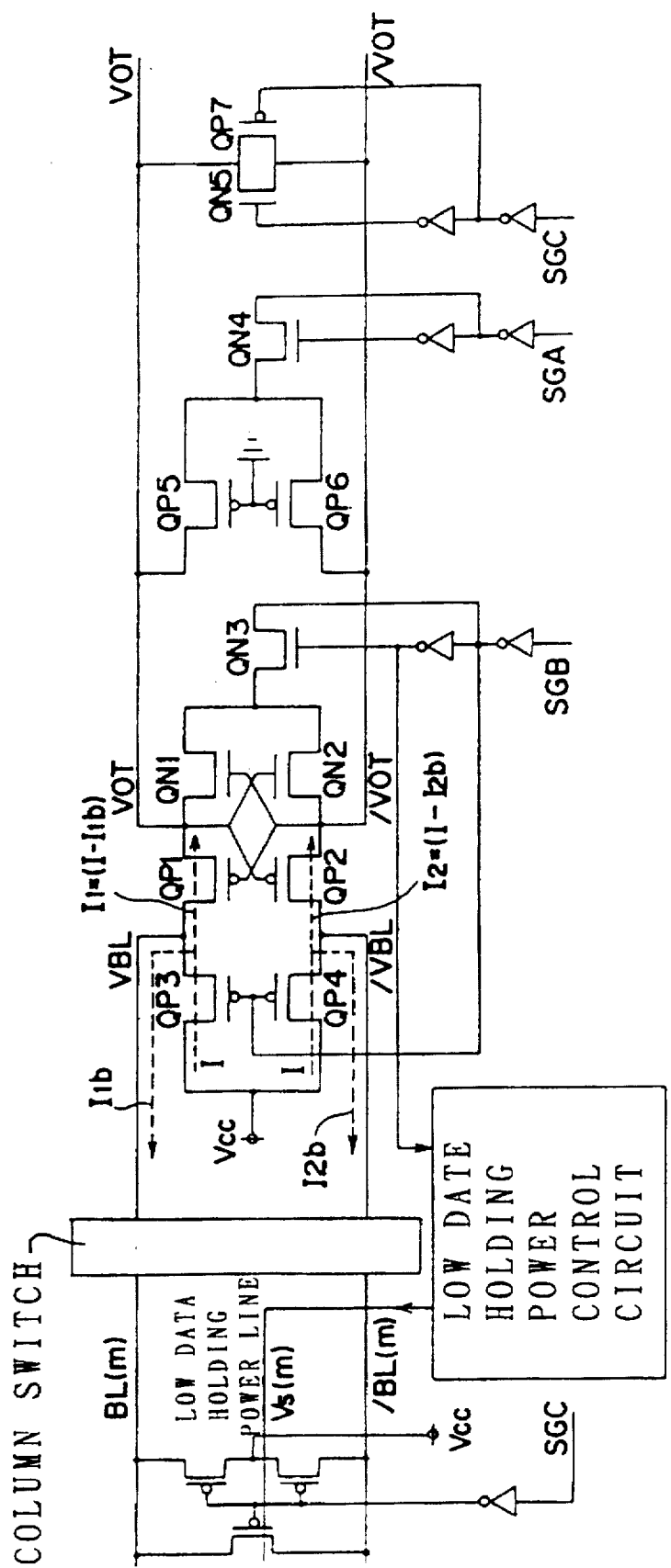
FIG. 20 is a circuit diagram of a sense amplifier of a semiconductor SRAM IC device according to the eighth and a tenth embodiments of the invention.

FIG. 20 is a circuit diagram of a sense amplifier used in the semiconductor SRAM IC device of the ninth embodiment. In FIG. 20, VBL and /VBL denote a pre-data line pair for introducing, into the sense amplifier, currents of a bit line pair BL(m) and /BL(m) selected among eight or sixteen bit line pairs BL(m) and /BL(m) through a column switch on the basis of a column address; VOT and /VOT denote a data line pair for outputting a read data; P1 and P2 denote a first load transistor pair connected with each other in a cross coupling manner for sensing impedance of the pre-data line pair VBL and /VBL; QP3 and QP4 denote a second load transistor pair serving as a current source of a current I; QP5 and QP6 denote a first transistor pair connected with each other through a diode for current sensing on the basis of an impedance difference between the data line pair VBL and /VBL; QN1 and QN2 denote a second transistor pair for latching a small voltage sensed by the first load transistor pair P1 and P2; QN3 denotes a first switch which is turned on in a latching period alone; QN4 denotes a second switch which is turned on in a current sensing period alone; QN5 denotes a third switch which is turned on in periods excluding a read operation period for equalizing the data line pair VOT and /VOT; QP7 denotes a fourth switch having the same function as the third switch QN5; SGA denotes a first control signal for determining the current sensing period by using a signal CLOCK as a trigger; SGB denotes a second control signal for determining the latching period and controlling a low data holding power control circuit by using the signal CLOCK as a trigger; and SGC denotes a third control signal for equalizing the data line pair VOT and /VOT and the bit line pair BL(m) and /BL(m) by using the signal CLOCK as a trigger.

In this sense amplifier, the first load transistor pair P1 and P2 and the first transistor pair QP5 and QP6 together form an initial current sensing circuit, and the first load transistor pair P1 and P2, the second load transistor pair QP3 and QP4 and the second transistor pair QN1 and QN2 together form a final latch-type current sensing circuit.

Figure 21:
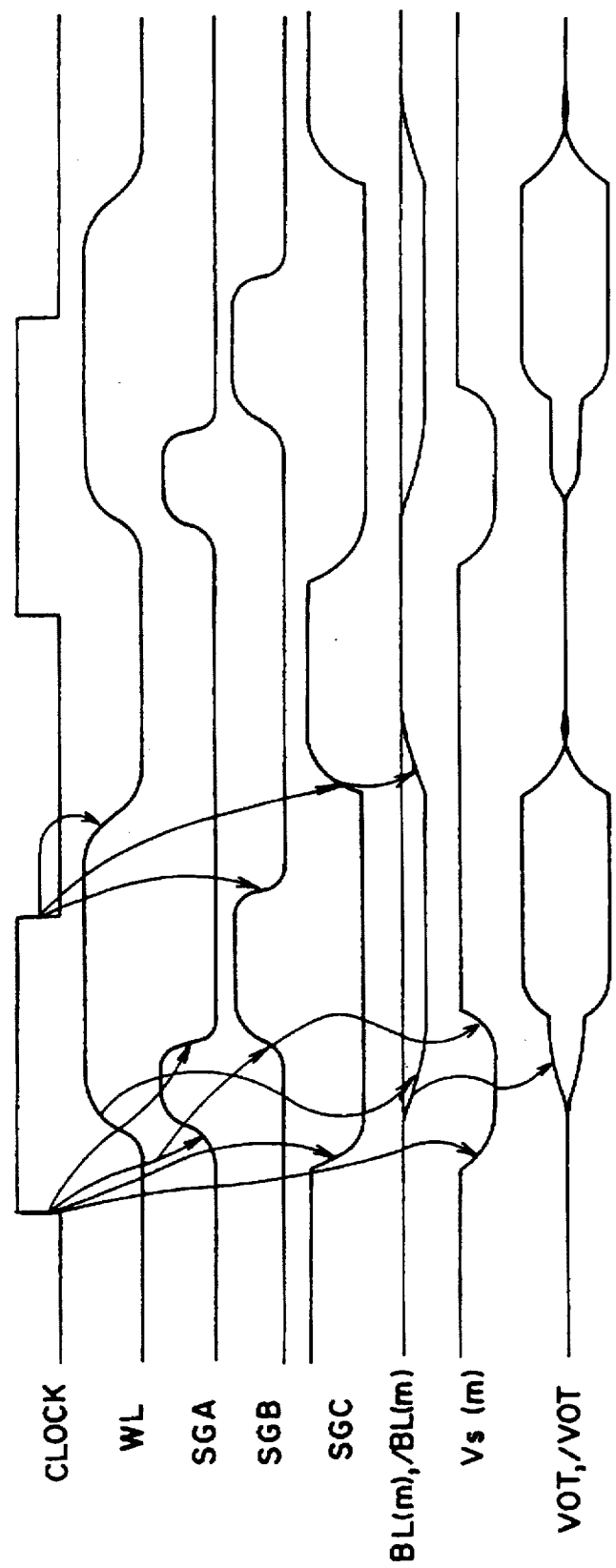
FIG. 21 is a timing chart for operating a sense amplifier of a semiconductor SRAM IC device according to a ninth embodiment of the invention.

The operation of this sense amplifier will now be described with reference to FIGS. 20 and 21.

First, a static initial current sensing operation will be described. Since the word line WL selected on the basis of a row address is activated, an access transistor and a drive transistor connected with a memory node storing a low data are activated so as to attain low impedance, resulting in connecting one of the bit line pair BL(m) and /BL(m) selected on the basis of a column address with the pre-data line pair VBL and /VBL through the column switch.

Then, simultaneously with the activation of the word line WL, the first control signal SGA undergoes a low to high transition, the third control signal SGC undergoes a high to low transition and the second switch QN4 is turned on. This causes a difference between currents I1 and I2 flowing through the data line pair VOT and /VOT through the first load transistor pair P1 and the P2, respectively.

Next, a dynamic final latch-type current sensing operation will be described.

Figure 22:
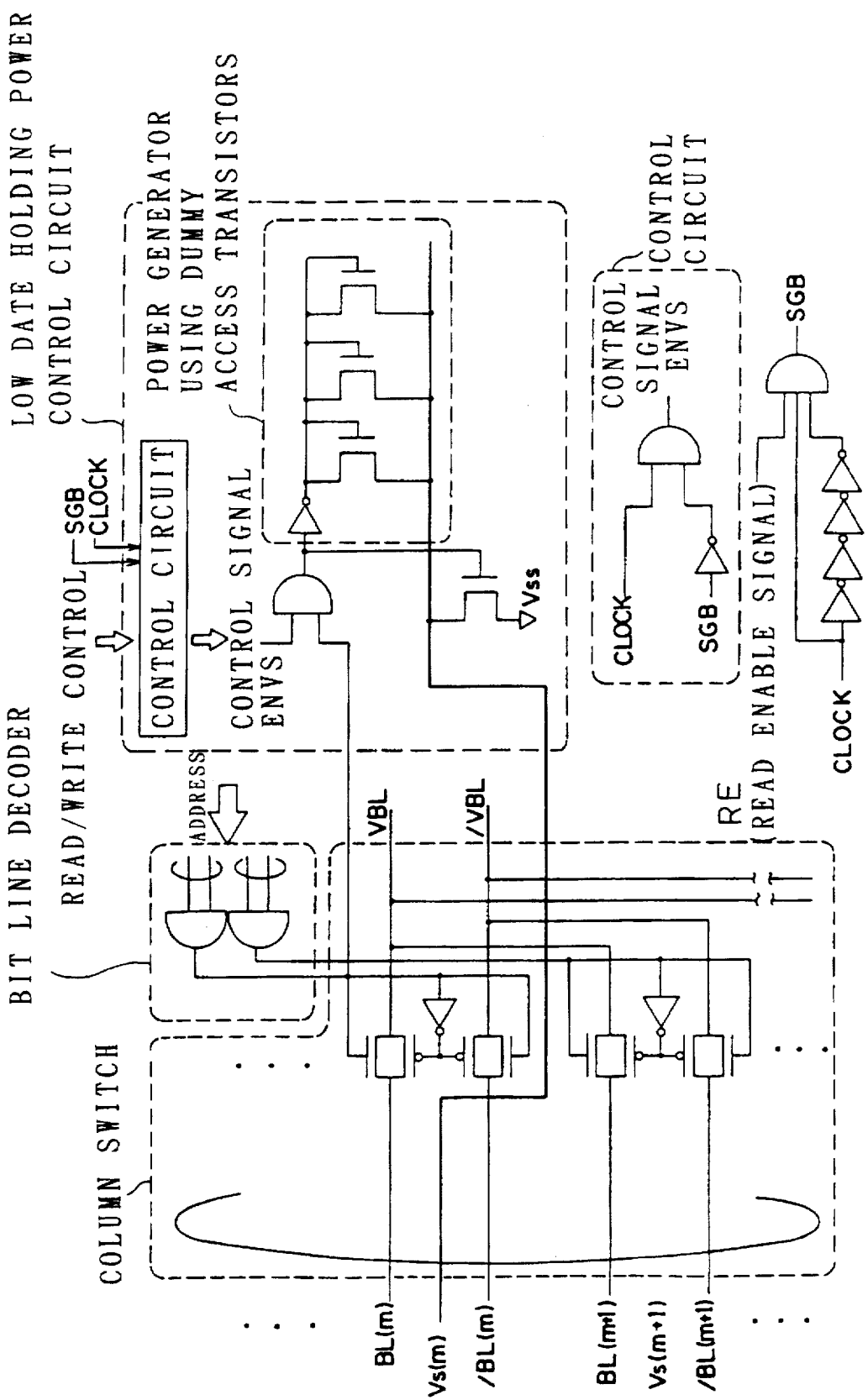
FIG. 22 is a circuit diagram of a column switch, a bit line decoder and a low data holding power control circuit of a semiconductor SRAM IC device according to an eleventh embodiment of the invention.

Since the first control signal SGA undergoes a high to low transition and the second control signal SGB undergoes a low to high transition at the same time, the first switch QN3 is turned on and the second switch QN4 is turned off. This starts the supply of the current I from the second load transistor pair QP3 and QP4, and the first load transistor pair QP1 and QP2 and the second transistor pair QN1 and QN2 together start to work as a complementary transistor. As a result, the small potential difference caused between the data line pair VOT and /VOT during the initial current sensing period is amplified. Next, when the second control signal SGB, which is generated by a three-input AND circuit receiving a read enable signal RE, the signal CLOCK and a delayed signal of the signal CLOCK as is shown in FIG. 22, undergoes a low to high transition, a fourth control signal ENVS undergoes a high to low transition. As a result, the potential of the low data holding power line Vs(m) which has been set at the supply potential Vss at the rise of the signal CLOCK is returned to an intermediate potential (=0.5 V) generated by a power generator using dummy access transistors. Accordingly, the bit line pair BL(m) and /BL(m) stop discharging, and the amplitude value of the bit line pair BL(m) and /BL(m) is clamped.

As a result, the amplitude of the bit line BL(m) is clamped at a fixed value even when the word line WL remains to be activated. In this manner, the amplitude resulting from the discharge of the bit line pair BL(m) and /BL(m) can be controlled regardless of a frequency of the signal CLOCK, differently from a conventional device in which the amplitude resulting from the discharge of the bit line pair BL(m) and /BL(m) is clamped by deactivating the word line WL at the fall of the signal CLOCK.

As a characteristic of this embodiment, although the discharge amount of the bit line pair BL(m) and /BL(m) is suppressed by controlling the time duration for activating the word line WL in the conventional device, the discharge amount of the bit line pair BL(m) and /BL(m) in this embodiment is suppressed by controlling the potential of the low data holding power line Vs(m). As a result, the power consumption can be decreased.

Now, the semiconductor SRAM IC device according to a tenth embodiment of the invention will be described with reference to the drawing. In the final latch-type current sensing circuit shown in FIG. 20, the first switch QN3 serving as a low potential supply power controlling transistor is composed of an n-channel MOS transistor, and a pair of signals respectively having correlative potentials are applied to signal lines connected with its source electrode and gate electrode, respectively. Specifically, when the supply potential Vcc (=1.0 V) is applied to the source electrode of the first switch QN3, the ground potential Vss (=0 V) is applied to the gate electrode thereof. Therefore, a negative bias voltage of −1.0 V is applied between the gate electrode and the source electrode, resulting in completely turning off the first switch QN3. In contrast, when the ground potential Vss (=0 V) is applied to the source electrode of the first switch QN3, the supply potential Vcc (=1.0 V) is applied to the gate electrode thereof. Therefore, a positive bias voltage of 1.0 V is applied between the gate electrode and the source electrode, resulting in turning on the first switch QN3. Thus, the power supply for the ground potential Vss is connected with the final latch-type current sensing circuit.

As a characteristic of this embodiment, when the MOS transistor working as the first switch QN3 is in an off-state, the negative bias voltage is applied, and hence, the first switch QN3 can be completely turned off even when its threshold voltage is set at 0 V. Furthermore, when the first switch QN3 is turned on, the amount of a current per unit channel width which can flow through the MOS transistor can be increased because the threshold voltage is set at such a low value. Accordingly, the channel width can be minimized when a desired current is allowed to flow through the MOS transistor, and hence, the area occupied by the MOS transistor can be minimized. This is advantageous in designing the circuit layout for attaining high integration.

Now, the semiconductor SRAM IC device according to an eleventh embodiment of the invention will be described with reference to the drawing.

FIG. 22 is a circuit diagram of a low data holding power control circuit included in the semiconductor SRAM IC device of this embodiment. As is shown in FIG. 22, the potential of the low data holding power line Vs(m) is controlled by using the fourth control signal ENVS generated on the basis of the signal CLOCK and the second control signal SGB, and an address selecting signal output on the basis of a column address. When the signal CLOCK is at a high level and a delayed signal of the signal CLOCK is at a low level, the fourth control signal ENVS is at a high level. When the address selecting signal undergoes a low to high transition simultaneously with the fourth control signal ENVS, the potential of the low data holding power line Vs(m) is set at the ground potential Vss. Furthermore, when the fourth control signal ENVS undergoes a high to low transition, the low data holding power line Vs(m) is precharged up to a potential which is lower than the supply potential Vcc by the threshold voltage of a dummy access transistor.

A group of the dummy access transistors shown in FIG. 22 has the same size and the same layout as the actual access transistors in the memory cells. The potential of the low data holding power line Vs(m) generated by the low data holding power control circuit is determined so that the actual access transistors in the memory cells can be substantially turned off when the word line WL is activated. When there is no need to completely turn off the actual access transistors in the memory cells, the threshold voltage of the dummy access transistors can be set at a lower value.

Figure 23:
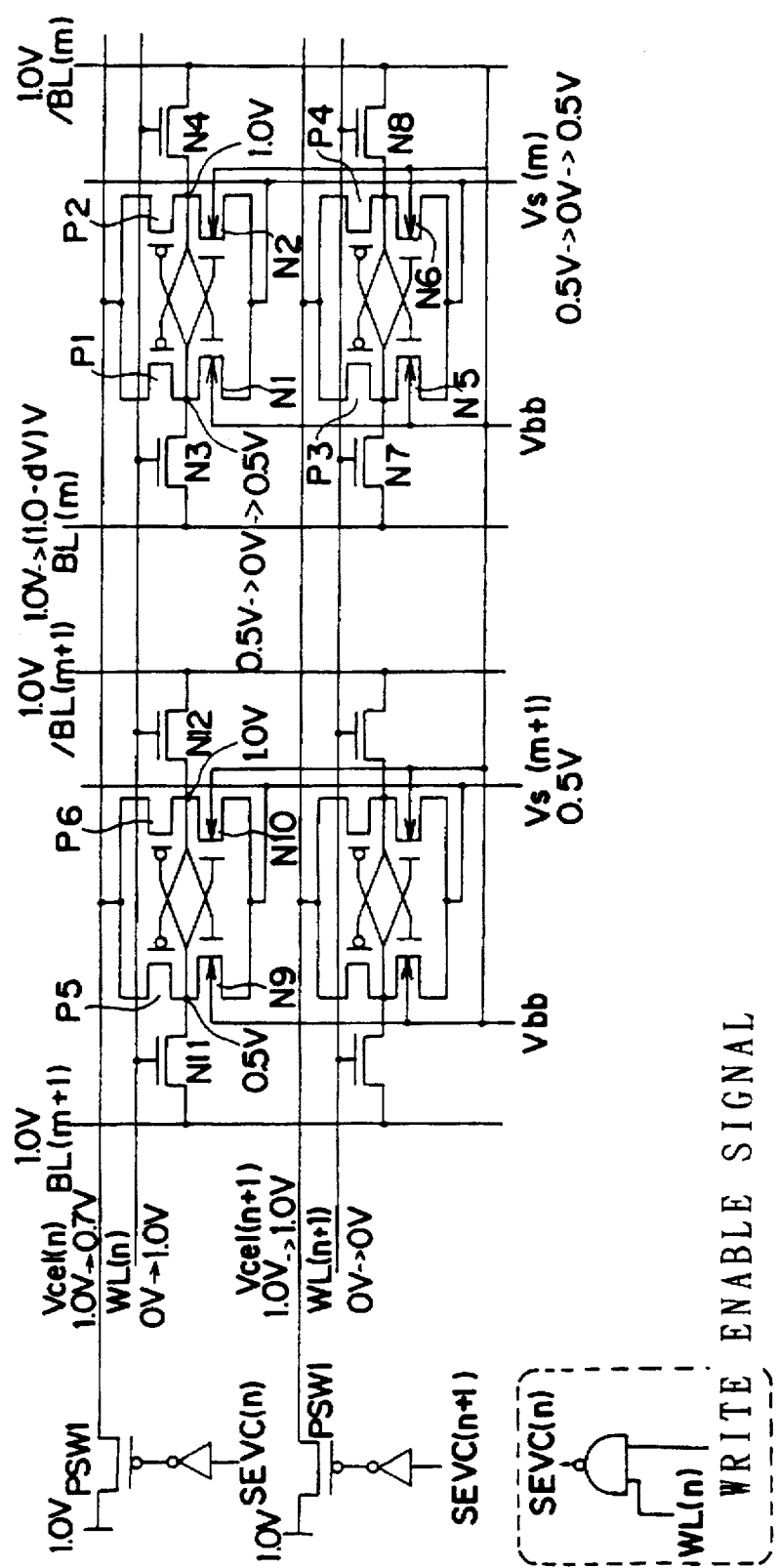
FIG. 23 is a circuit diagram of a memory cell array in a semiconductor SRAM IC device according to a twelfth embodiment of the invention.

Now, the semiconductor SRAM IC device according to a twelfth embodiment of the invention will be described with reference to the drawings. In FIG. 23, Vcel(n) denotes a high data holding power line with its voltage controlled; SEVC (n) denotes a fifth control signal which undergoes a high to low transition when both a word line WL(n) and a write enable signal/RE are activated, namely, when the word line WL(n) is selected in a read operation; and PSW1 denotes a switch transistor controlled in accordance with the fifth control signal SEVC(n).

The operation of the semiconductor SRAM IC device having the aforementioned configuration will now be described.

Figure 24:
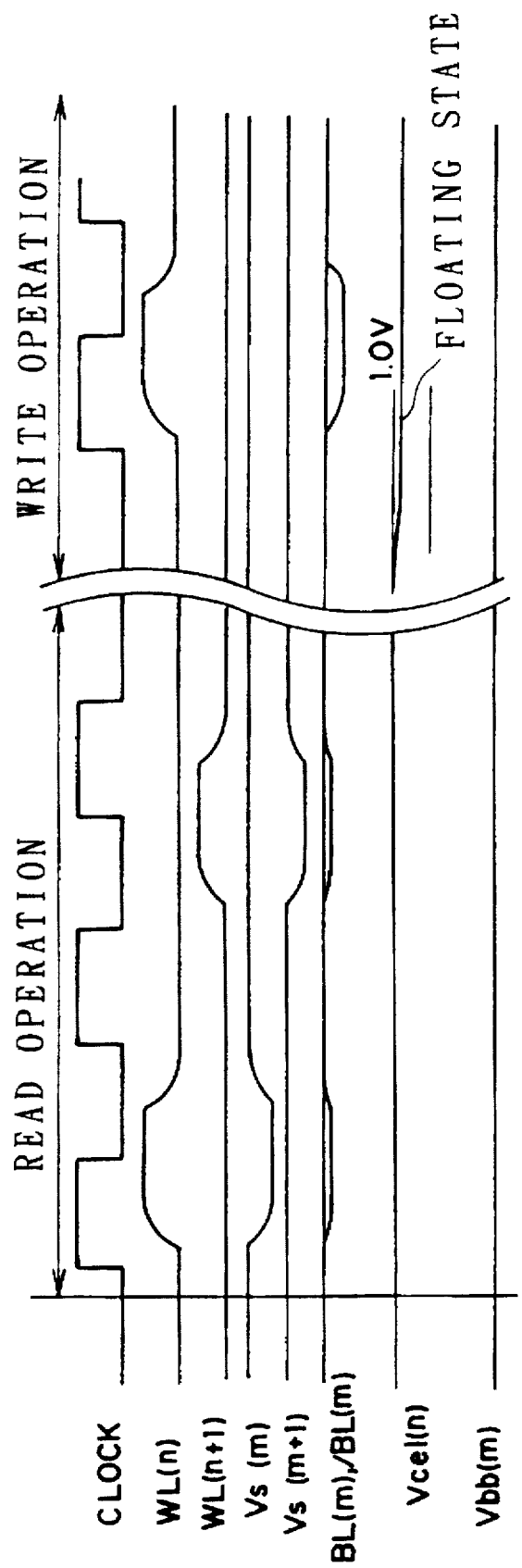
FIG. 24 is a timing chart for a read period and a write period in the semiconductor SRAM IC device of the twelfth embodiment.

First, in a write operation, the fifth control signal SEVC (n) undergoes a high to low transition and the first switch PSW1 connected with an inverter is turned off, and hence, the high data holding power line Vcel(n) connected with a memory cell connected with the selected word line WL(n) is connected with the supply potential Vcc at high impedance. Thus, the high data holding power line Vcel(n) is placed in a floating state shown in FIG. 24.

Next, in a read operation, the high data holding power line Vcel(n) is connected with the supply potential Vcc at low impedance.

As a characteristic of this embodiment, it is possible to avoid, in a write operation, a short-circuit between the power supply working as a current supplier for the high data holding power line Vcel(n) and the Ground power supply Vss in the I/O control circuit for a write driver and the like connected with the bit line pair BL(m) and /BL(m) through the load transistors P1 and P2 and the like. Accordingly, it is possible to suppress power from being wastefully consumed as well as to eliminate a factor to unstabilize the potential of the high data holding power line Vcel(n).

Figure 25:
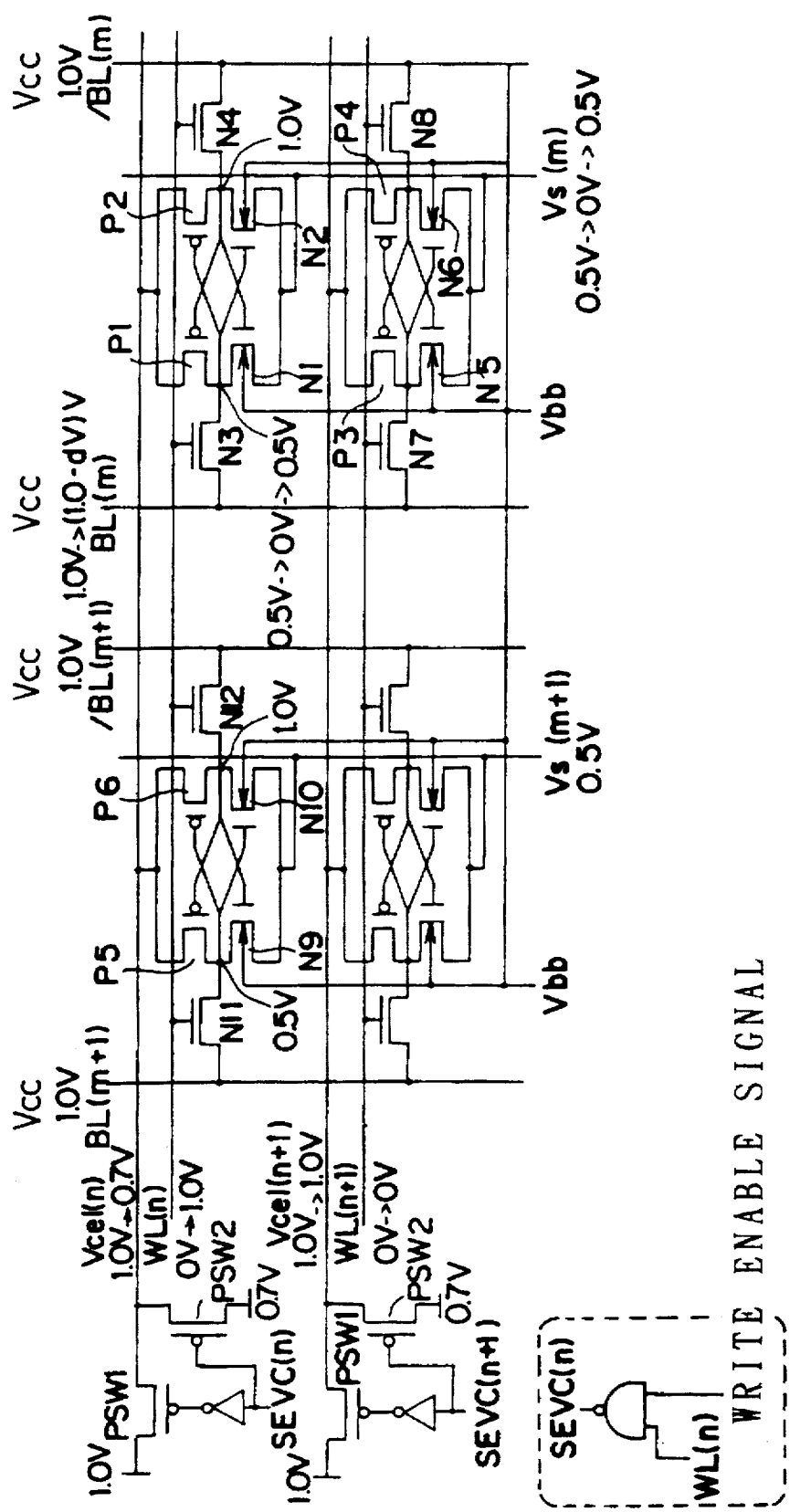
FIG. 25 is a circuit diagram of a memory cell array in a semiconductor SRAM IC device according to modification of the twelfth embodiment.
Figure 26:
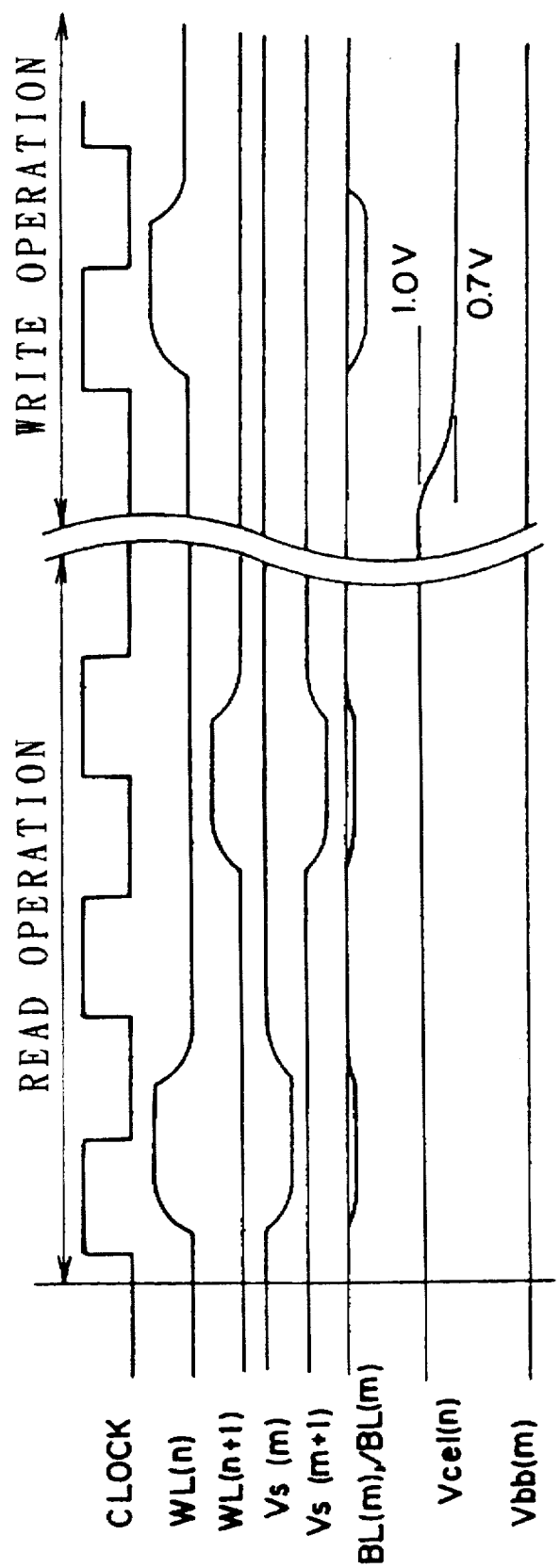
FIG. 26 is a timing chart for a read period and a write period of the semiconductor SRAM IC device according to the modification of the twelfth embodiment.

Now, the semiconductor SRAM IC device according to modification of the twelfth embodiment will be described with reference to the drawings. As is shown in FIGS. 25 and 26, in a write operation, the fifth control signal SEVC(n) undergoes a high to low transition, the first switch PSW1 connected with the inverter is turned off and a second switch PSW2 is turned on. As a result, the potential of the high data holding power line Vcel(n) connected with the memory cell connected with the selected word line is set at 0.7 V which is lower than the supply potential Vcc.

As a characteristic of this modification, since a potential difference between the high data holding power line Vcel(n)

and the bit line pair BL(m) and /BL(m) is small in a write operation, a wasteful through current can be suppressed.

Figure 27:
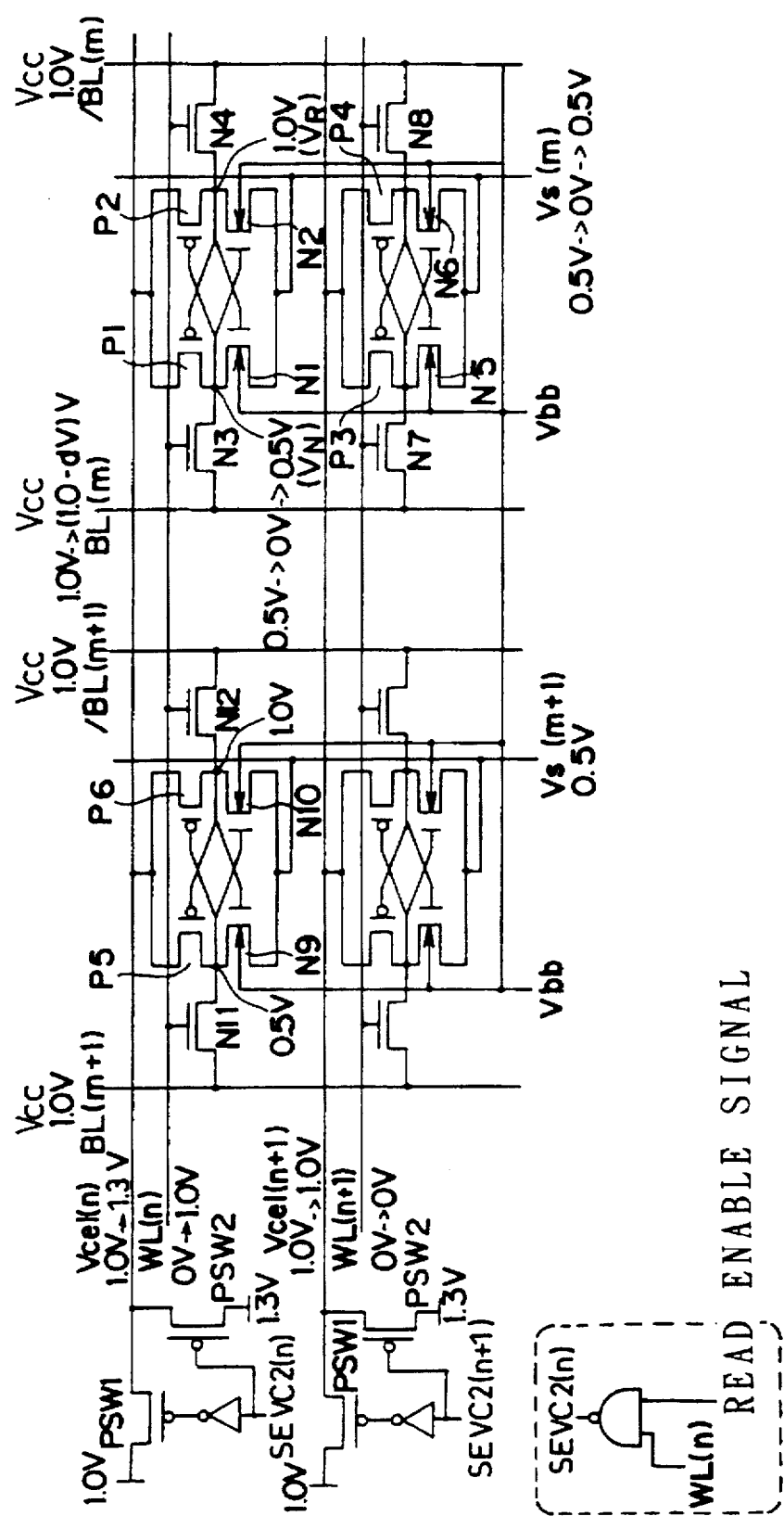
FIG. 27 is a circuit diagram of a memory cell array in a semiconductor SRAM IC device according to a thirteenth embodiment of the invention.

Now, the semiconductor SRAM IC device according to a thirteenth embodiment of the invention will be described with reference to the drawings. In FIG. 27, SEVC2(n) denotes a sixth control signal which undergoes a high to low transition when both a word line WL(n) and a read enable signal RE are activated, namely, when the word line WL(n) is selected in a read operation. The sixth control signal SEVC2(n) is supplied to the gate electrode of the second switch PSW2.

The operation of the semiconductor SRAM IC device having the aforementioned configuration will now be described.

Figure 28:
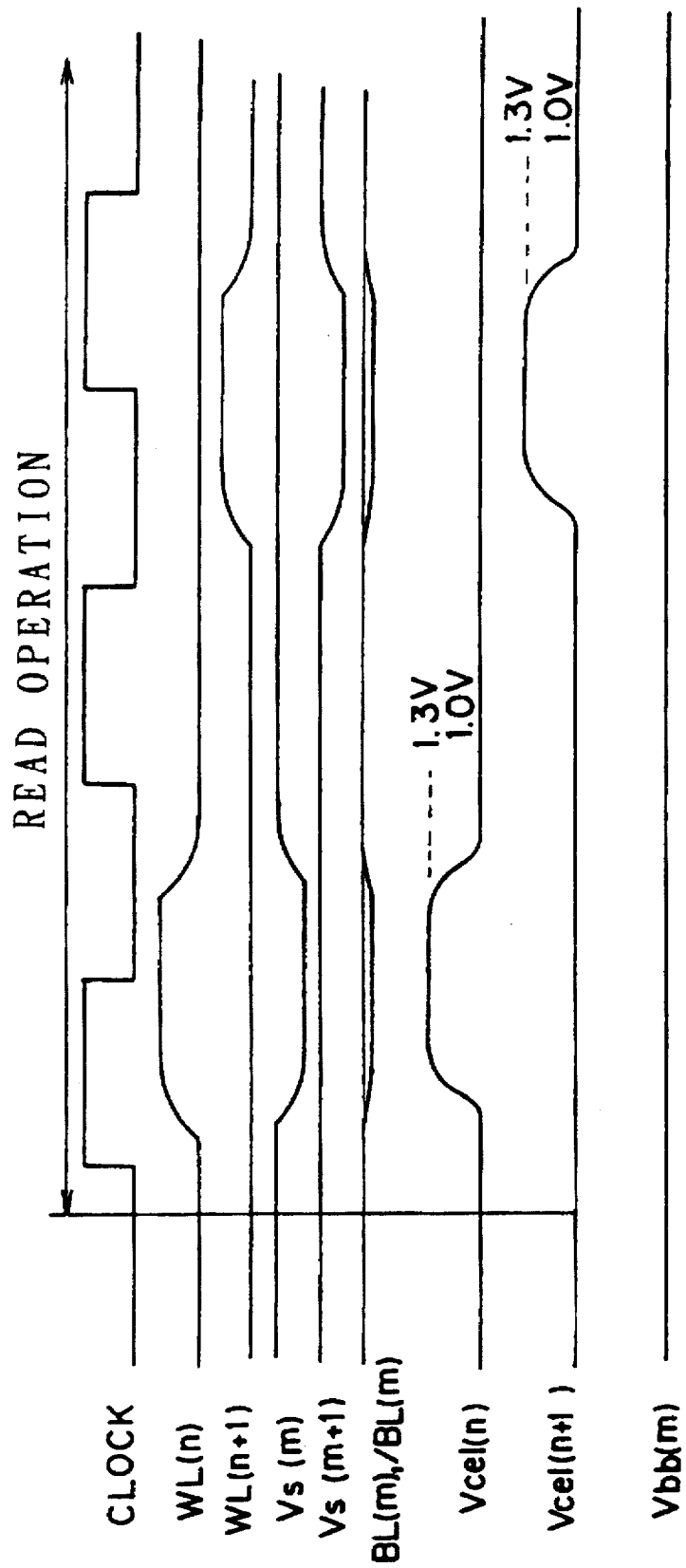
FIG. 28 is a timing chart for a read period of the semiconductor SRAM IC device of the thirteenth embodiment.

In a read operation as shown in FIG. 28, the sixth control signal SEVC2(n) undergoes a high to low transition, the first switch PSW1 connected with the inverter is turned off and the second switch PSW2 is turned on, and hence, the potential of the high data holding power line Vcel(n) connected with the memory cell connected with the selected word line is set at 1.3 V which is higher than the supply potential Vcc.

As a characteristic of this embodiment, since the potential applied to the high data holding power line Vcel(n) in a read operation is higher than the supply potential Vcc, for example, the first drive transistor N1 connected with the second memory node VR at its gate electrode as is shown in FIG. 27 is rapidly activated, resulting in a high speed read operation.

Contrary, even when the supply potential Vcc applied to the high data holding power line Vcel(n) during the stand-by period is decreased, the speed of a read operation is not degraded, and hence, the low voltage drive can be attained.

Figure 29:
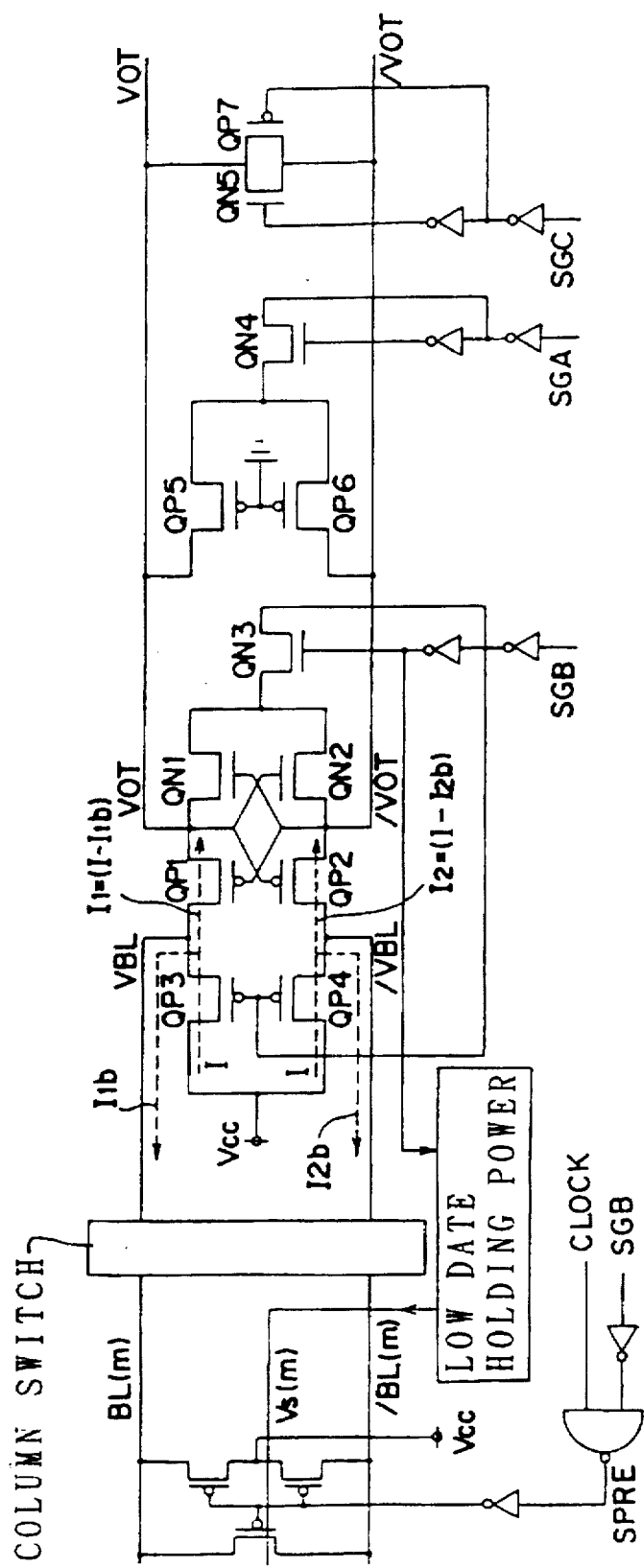
FIG. 29 is a circuit diagram of a bit line precharge circuit of a semiconductor SRAM IC device according to a fourteenth embodiment of the invention.

Now, the semiconductor SRAM IC device according to a fourteenth embodiment of the invention will be described with reference to the drawings. Referring to FIG. 29, description will be made merely on additional elements and control signal not included in the semiconductor SRAM IC device of FIG. 20: SPRE denotes a seventh control signal generated by a NAND circuit on the basis of an inverted signal of the second control signal SGB shown in FIG. 22 and the signal CLOCK.

The operation of the semiconductor SRAM IC device having the aforementioned configuration will now be described.

Figure 30:
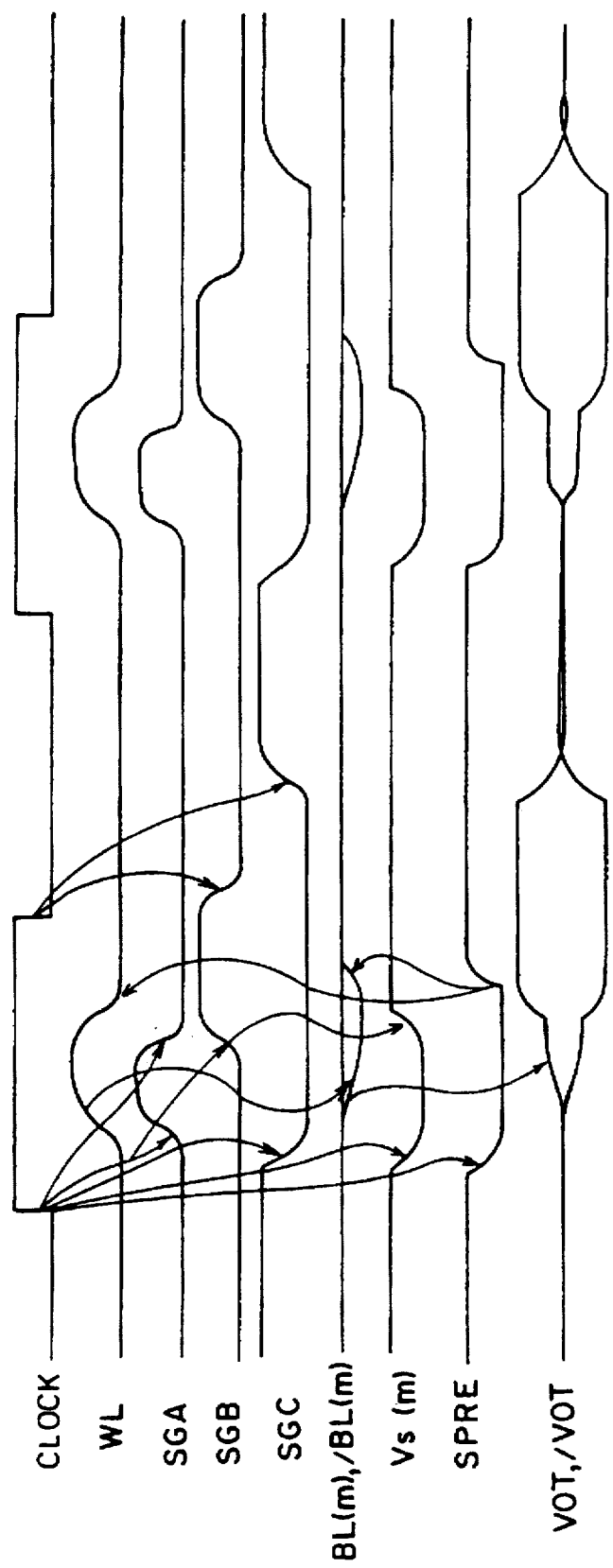
FIG. 30 is a timing chart for a read period of the semiconductor SRAM IC device of the fourteenth embodiment.

As is shown in FIG. 30, since the seventh control signal SPRE, which has been deactivated at the rise of the signal CLOCK, rises, the precharging operation of the bit line pair BL(m) and /BL(m) is started, and the word line WL(n), which has been at a high level, undergoes a high to low transition. At the same time, the low data holding power line Vs(m) having been supplied with the ground potential Vss is returned to the intermediate potential by the low data holding power control circuit.

As a characteristic of this embodiment, the connection between the bit line pair BL(m) and /BL(m) and the low data holding power line Vs(m) through the access transistors and the drive transistors is cut off when the word line WL(n) is deactivated. Therefore, the drive load capacitance can be minimized in returning the potential of the low data holding power line Vs(m) to the intermediate potential. Furthermore, when the word line WL(n) is controlled at timing not synchronous with the signal CLOCK in this manner, the precharging operation of the bit line pair BL(m) and /BL(m) can be started earlier, resulting in shortening cycle time.

Figure 31:
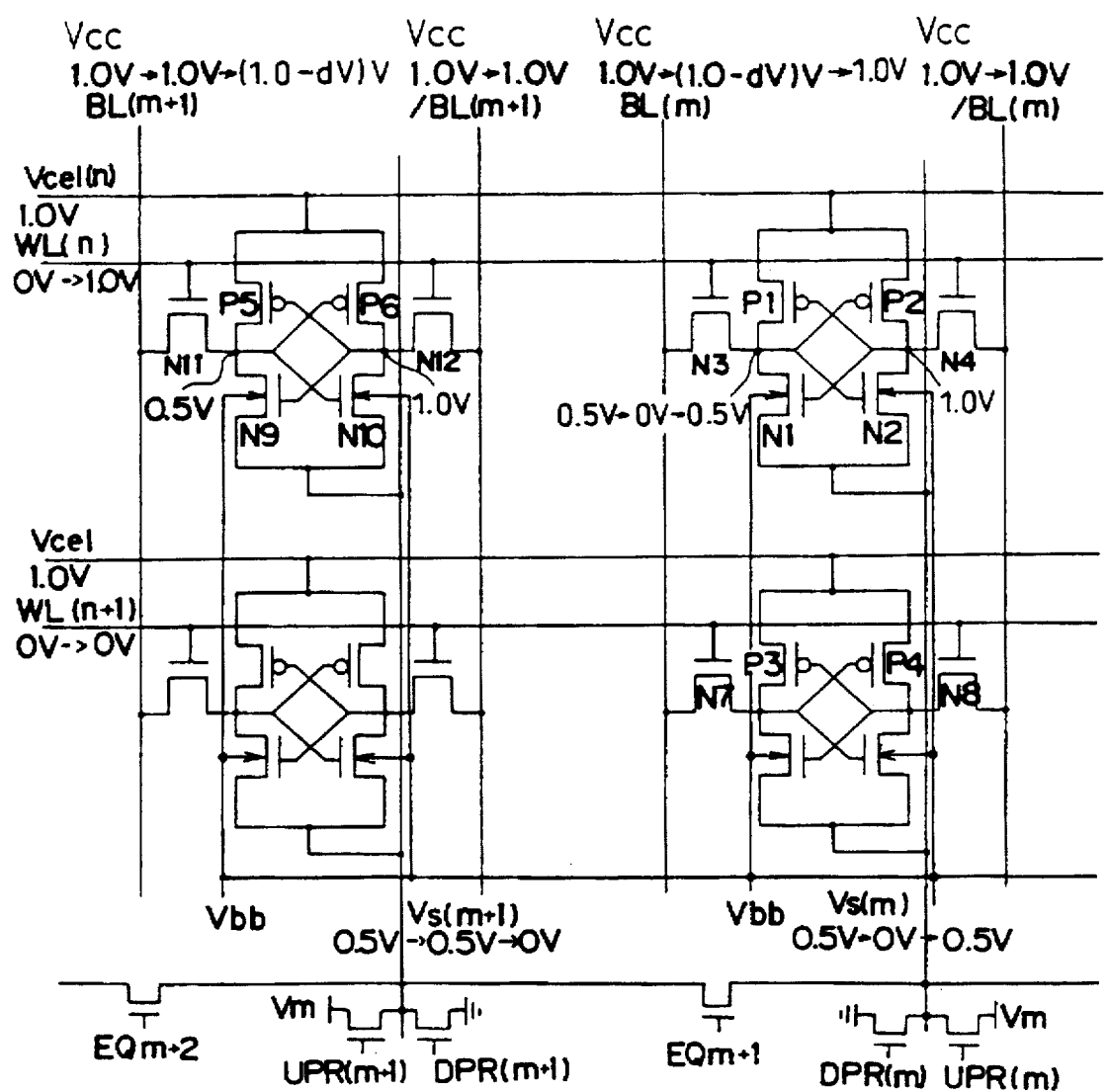
FIG. 31 is a circuit diagram of a memory cell array in a semiconductor SRAM IC device according to a fifteenth embodiment of the invention.
Figure 33A:
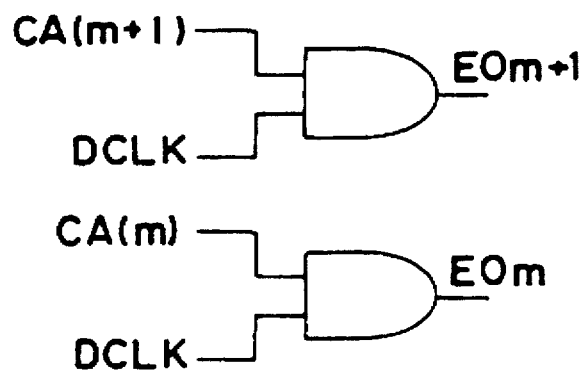
Figure 33B:
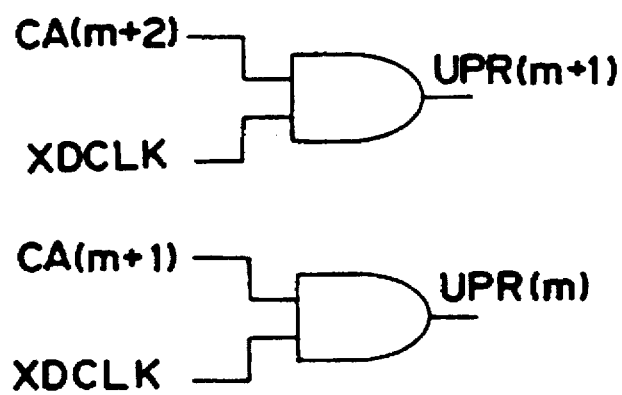
Figure 33C:
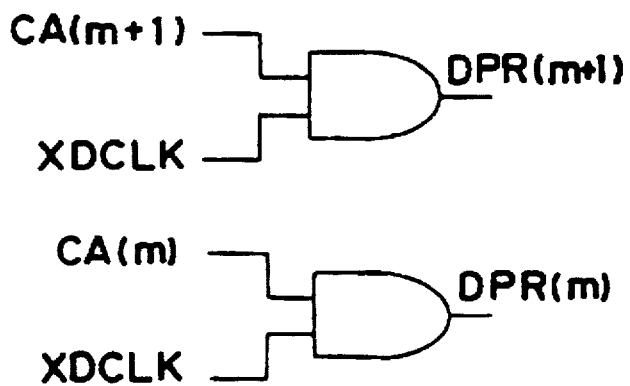

Now, the semiconductor SRAM IC device according to a fifteenth embodiment of the invention will be described with reference to the drawings. Referring to FIG. 31, description will be made merely on additional control signals not included in the SRAM IC device of FIG. 27: Vm denotes a potential of the low data holding power line Vs(m); EQm+1 denotes a recycle equivalent signal for connecting the low data holding power lines Vs(m) and Vs(m+1); UPR(m) denotes a recycle step-up signal for applying the potential Vm to the low data holding power line Vs(m); and DPR(m) denotes a recycle step-down signal for applying the ground potential Vss. As is shown in FIG. 33(a), the recycle equivalent signal EQm+1 is generated as a conjunction of a column address CA(m+1) and a delayed clock signal DCLK. As is shown in FIG. 33(b), the recycle step-up signal UPR(m) is generated as a conjunction of the column address CA(m+1) and an inverted signal XDCLK of the delayed clock signal. As is shown in FIG. 33(c), the recycle step-down signal DPR(m) is generated as a conjunction of a column address CA(m) and the inverted signal XDCLK of the delayed clock signal.

The operation of the semiconductor SRAM IC device having the aforementioned configuration will now be described.

In the case where data of an image and the like which can be sequentially read are stored in the memory cells, the potential of the low data holding power line Vs(m) is controlled to be changed between the potential Vm and the ground potential Vss through charge recycling between adjacent blocks.

Figure 32:
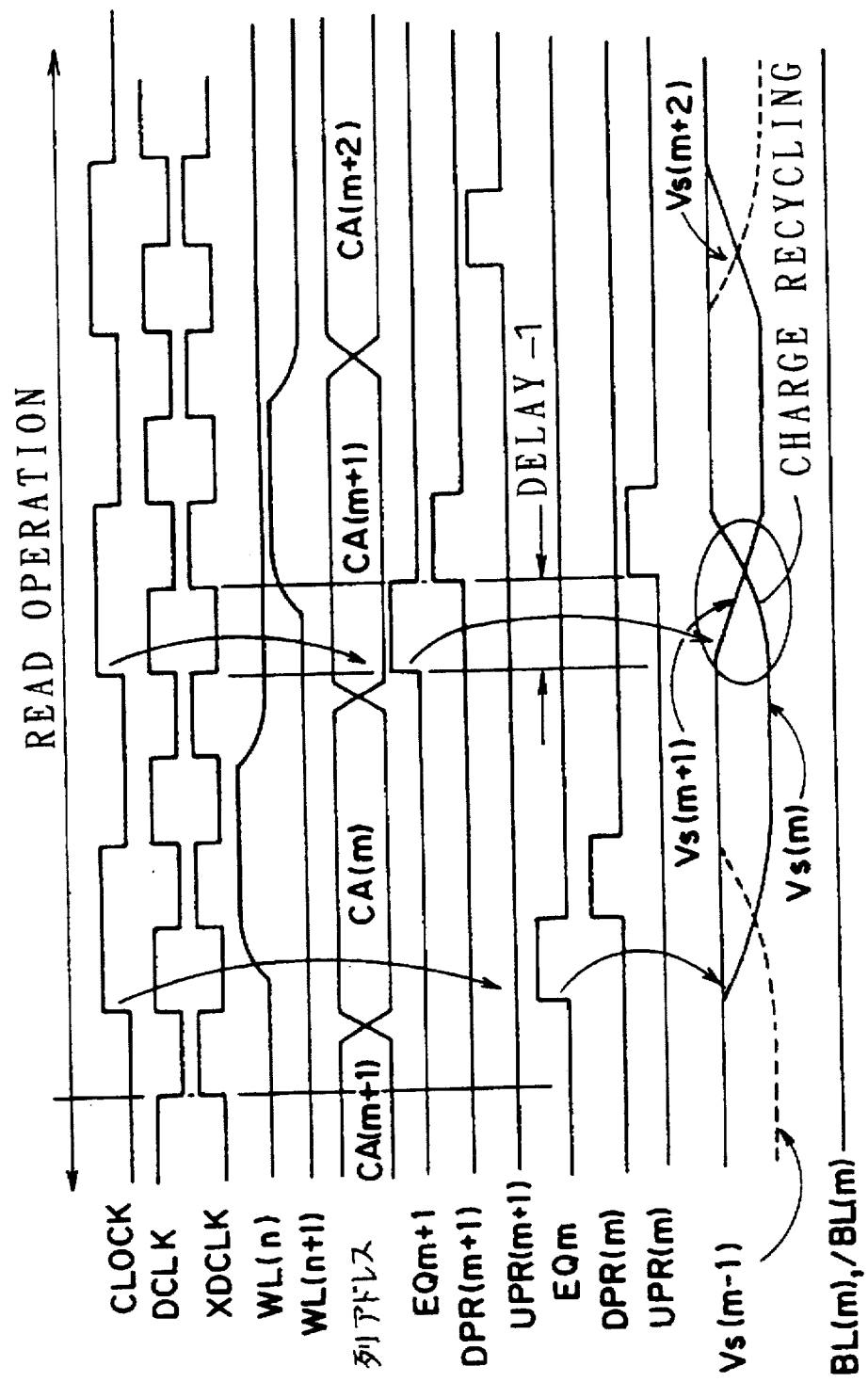
FIG. 32 is a timing chart for a read period of the semiconductor SRAM IC device of the fifteenth embodiment.

Specifically, as is shown in FIG. 32, when the potential Vm of the low data holding power line Vs(m+1) is desired to be decreased to the ground potential Vss, the recycle equivalent signal EQm+1 undergoes a low to high transition. As a result, the potential of the low data holding power line Vs(m+1) becomes equal to the potential of the low data holding power line Vs(m), and therefore, the potential of the low data holding power line Vs(m+1) changes from Vm to ½Vm. Then, the signals UPR(m) and DPR(m+1) undergo a low to high transition at the same time, and hence, the potential of the low data holding power line Vs(m+1) is decreased to the ground potential Vss and the potential of the low data holding power line Vs(m) is increased to the potential Vm.

As a characteristic of this embodiment, owing to the charge recycling, a half of the potential of the low data holding power line Vs(m+1), i.e., the potential ½Vm, is supplied to the low data holding power line Vs(m) in increasing the potential of the low data holding power line Vs(m) to the potential Vm. Thus, the power consumption can be halved.

Figure 34:
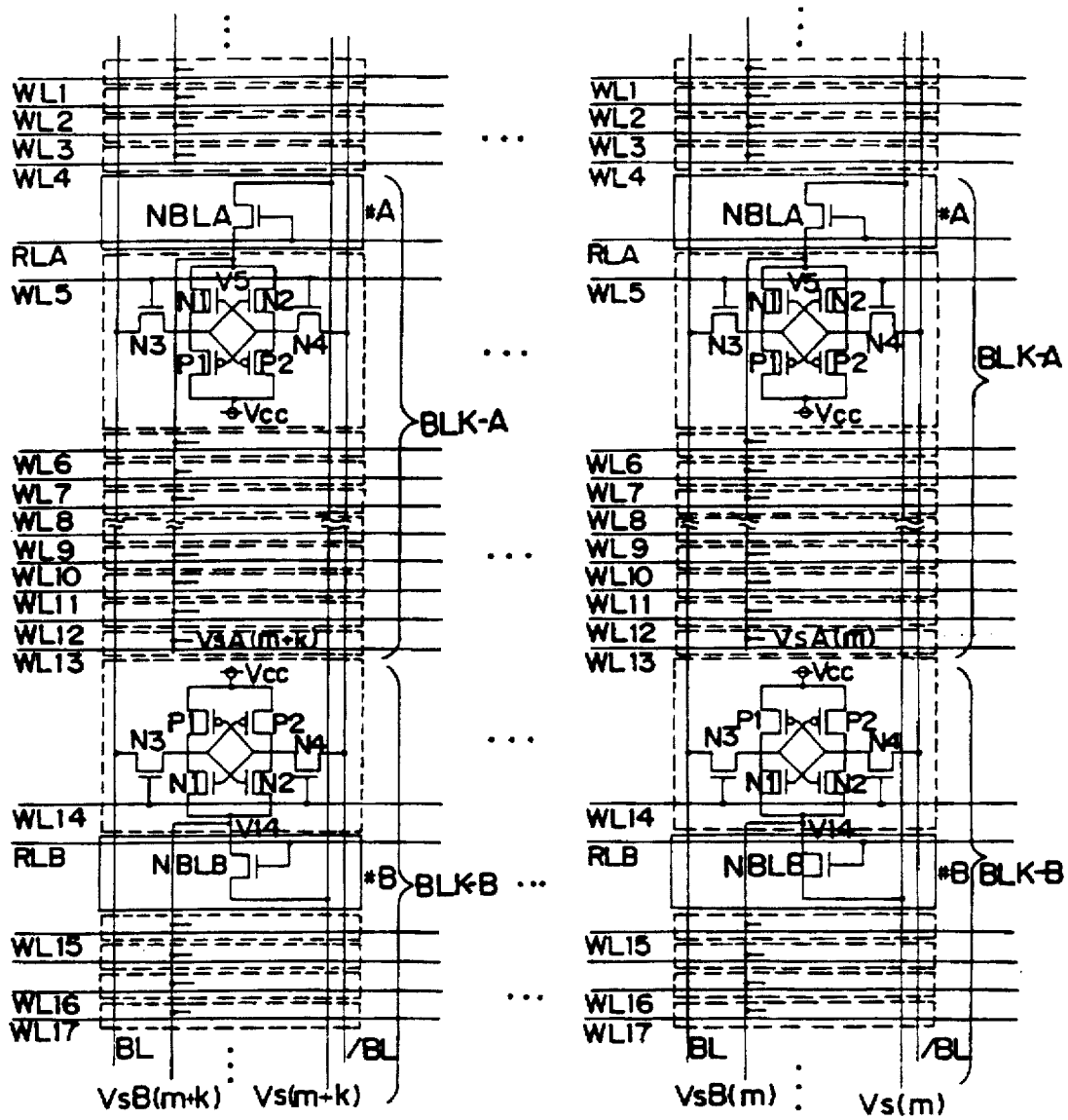
FIG. 34 is a circuit diagram of a memory cell array in a semiconductor SRAM IC device according to a sixteenth embodiment of the invention.

Now, the semiconductor SRAM IC device according to a sixteenth embodiment of the invention will be described with reference to the drawing. In FIG. 34, VsA(m) denotes a low data holding power line, referred to as a second low data holding power line, of a block A (BLK-A) obtained by plurally dividing the low data holding power line Vs(m), referred to as a first low data holding power line; VsB(m) denotes a low data holding power line, referred to as another second low data holding power line, of a block B (BLK-B); RLA denotes a block A control signal controlled on the basis of a selected row address; RLB denotes a block B control signal controlled on the basis of another selected row address; NBLA denotes a switch for the block A which can be activated in accordance with the block A control signal RLA; and NBLB denotes a switch for the block B which can be activated in accordance with the block B control signal RLB. As is shown in FIG. 34, the memory cell array connected with the bit line pair BL(m) and /BL(m) is divided into a plural blocks, the low data holding power line Vs(m) is connected with the second low data holding power line VsA(m) of the block A through the switch NBLA for the block A and also with the second low data holding power line VsB(m) of the block B through the switch NBLB for the block B. In this manner, the semiconductor SRAM IC device has a hierarchy configuration with the first low data holding power line Vs(m) connected with the second low data holding power lines VsA(m), etc. of the respective blocks.

As a characteristic of this embodiment, for example, in the case where the potential of the second low data holding power line VsA(m) of the block A is changed from 0.5 V, the intermediate potential, to the ground potential Vss in a read operation, the capacitance of the low data holding power line Vs(m) whose potential should be changed is decreased as described above because the number of the memory cells connected with each second low data holding power line is decreased correspondingly to the number of the divided blocks. As a result, the resistance and the capacitance delay of the low data holding power line Vs(m) are decreased. Accordingly, the potential of the low data holding power line Vs(m) can be rapidly changed, resulting in a rapid read operation. Moreover, the potential of merely the second low data holding power line VsA(m) or VsB(m), which is connected with the bit line pair BL(m) and /BL(m) selected on the basis of the row address and with the memory cell selected by the block A control signal RLA or the block B control signal RLB on the basis of the row address, is rapidly changed. Accordingly, the power consumption of this device is further decreased.

Figure 35A:
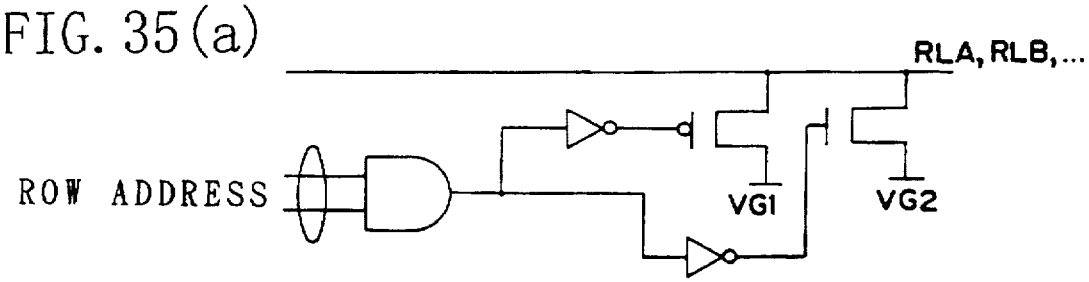

Now, the semiconductor SRAM IC device according to modification of the sixteenth embodiment will be described with reference to the drawings. As is shown in FIG. 35(a), the block A control signal RLA or the block B control signal RLB used in the sixteenth embodiment causes a first intermediate potential Vg1 (=0.5 V) for providing the switch NBLA for the block A or the switch NBLB for the block B with low impedance when it is selected on the basis of the row address, and causes a second intermediate potential Vg2 (=0.05 V) for providing the switch with higher impedance when it is not selected.

Figure 35B:
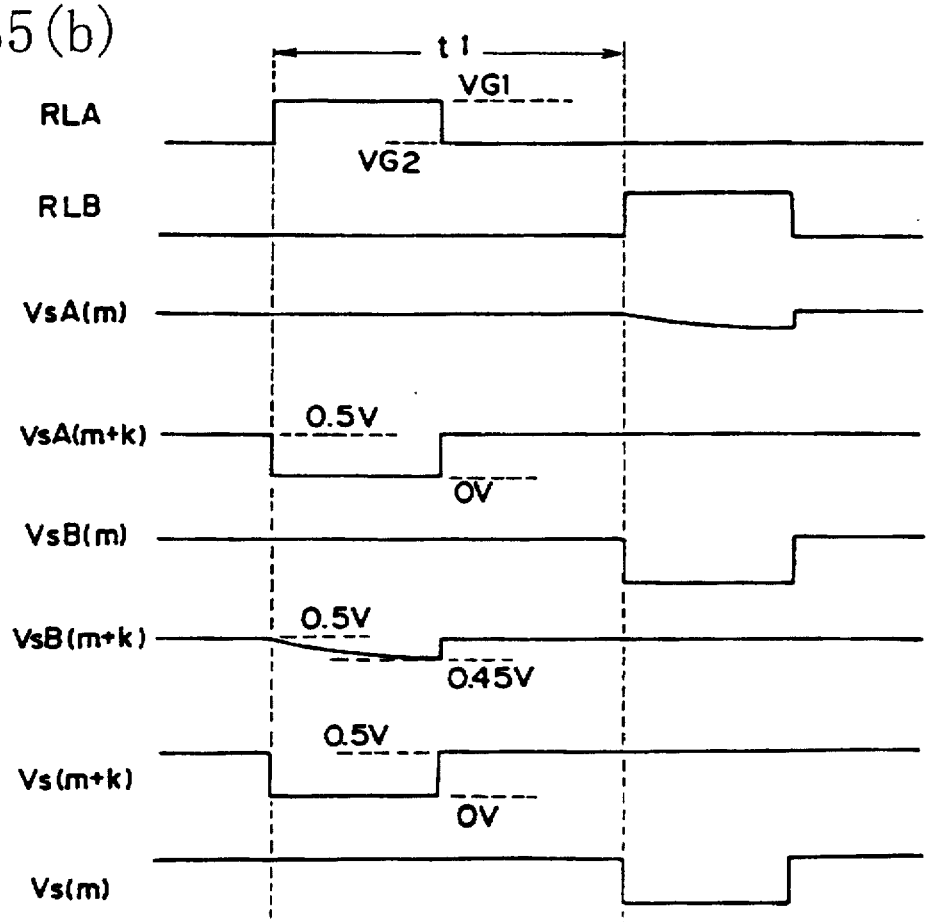

As is shown in a timing chart of FIG. 35(b), in the case where the block A is selected in accordance with the block A control signal RLA and a bit line Vs(m+k) is selected in the row direction at time t1, the potential of the second low data holding power line VsA(m+k) of the block A is rapidly changed from 0.5 V, the first intermediate potential Vg1, to the ground potential Vss, but the potential of the second low data holding power line VsB(m+k) of the block B is changed only by 0.05 V. At this point, the potentials of the second low data holding power line VsA(m) of the block A and the second low data holding power line VsB(m) of the block B are not changed at all, and hence, the cross-point selection can be effected as in the aforementioned embodiments.

As a characteristic of this modification, the potential change of the low data holding power line Vs(m+k) in an upper rank selected on the basis of the row address is followed by the potential change of the second low data holding power line VsA(m+k) of the block A alone, and the potentials of the other second low data holding power lines are only slightly changed. Accordingly, the drive capacitance can be effectively decreased, resulting in a rapid read operation and small power consumption.

When the second intermediate potential Vg2 for providing the block A control switch NBLA or the block B control switch NBLB with high impedance is set around the threshold voltage of the transistor included in the switch, the unselected second low data holding power line VsB(m) of the block B is prevented not only from being completely provided with high impedance but also from being strongly connected with the low data holding power line Vs(m+k) in the upper rank. This is also advantageous in decreasing the power consumption. The second intermediate potential Vg2 can be set at an arbitrary value depending upon the application, but is required to be set at a value which can provide higher impedance than the first intermediate potential Vg1.

Figure 36A:
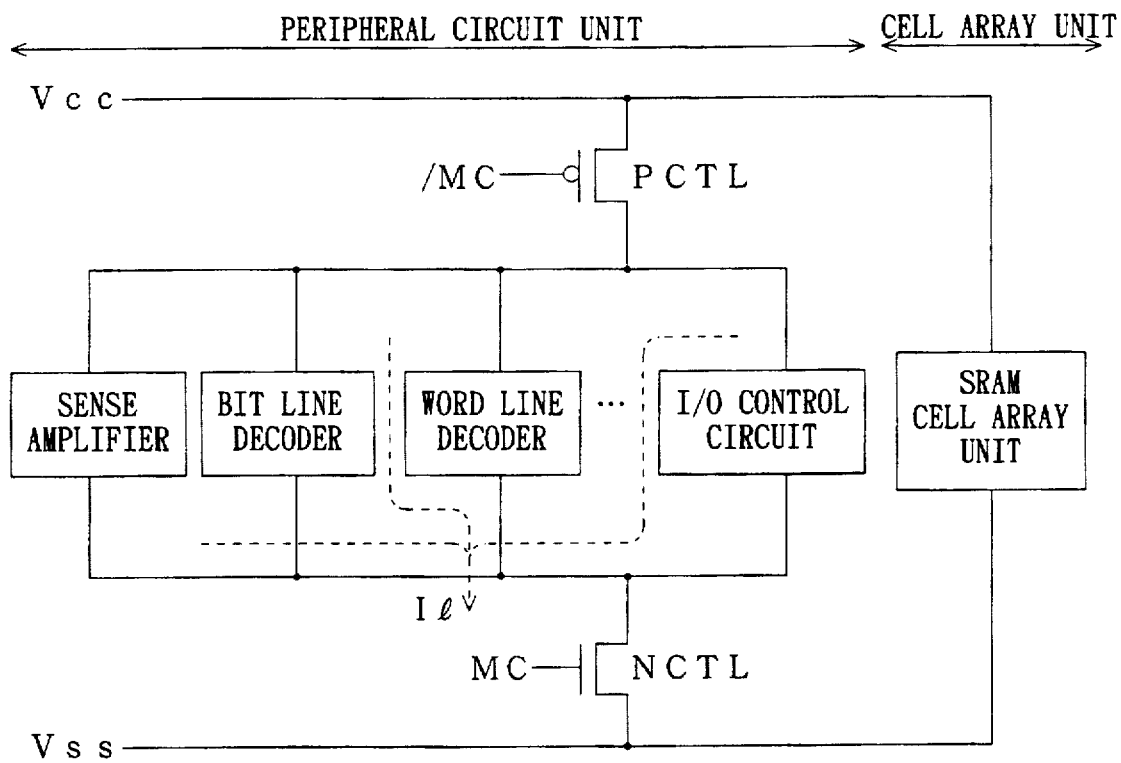

Now, the semiconductor SRAM IC device according to a seventeenth embodiment of the invention will be described with reference to the drawings. In FIG. 36(a), PCTL denotes first current control means for determining whether or not the supply potential Vcc is to be applied to a peripheral circuit unit including the sense amplifier, the bit line decoder and the like; NCTL denotes second current control means for determining whether or not the ground potential Vss is to be applied to the peripheral circuit unit; MC denotes an operation mode signal which is activated during the operation of the IC device; /MC denotes a stand-by mode signal, a complemental signal to the operation mode signal MC, which is activated during the stand-by period of the IC device; and I1 denotes a leakage current in the peripheral circuit unit.

The embodiments and their modifications described so far aim to decrease the power consumption in an SRAM cell array unit shown in FIG. 36(a), but this embodiment aims to decrease the power consumption in the peripheral circuit unit excluding the SRAM cell array unit.

Figure 36B:
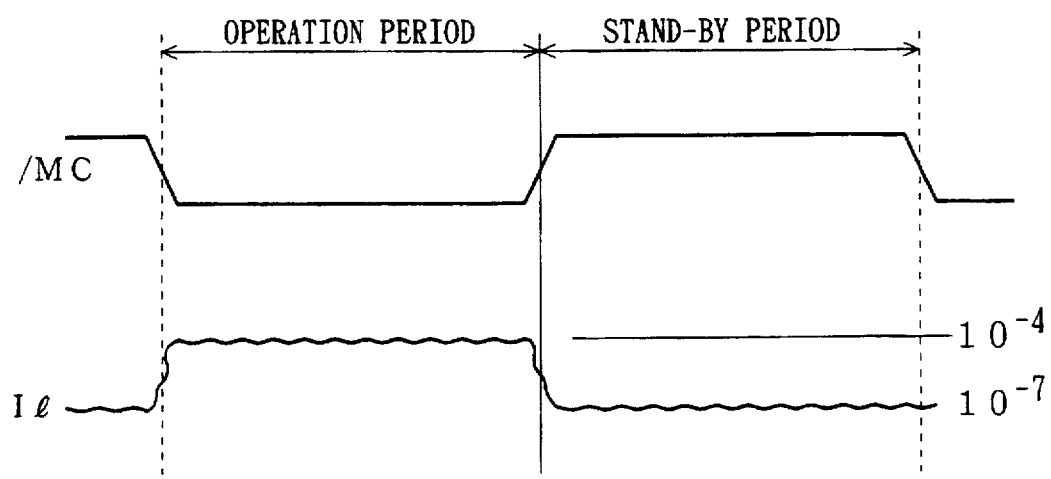

As is shown in FIGS. 36(a) and 36(b), the peripheral circuit unit excluding the SRAM cell array unit includes the current control means PCTL and NCTL for applying the supply voltage Vcc merely during the stand-by period. Owing to this configuration, the amount of the leakage current I1 flowing through the peripheral circuit unit during the stand-by period can be decreased by three figures.

FIGS. 37(a) through 37(d) show the proportions in the power consumption in main circuits of various semiconductor SRAM IC devices, wherein A indicates the power consumed by a word line drive circuit, B indicates the power consumed by charging/discharging bit lines, C indicates the power consumed by a column control circuit, and D indicates the power consumed by an I/O control circuit.

Figure 37A:
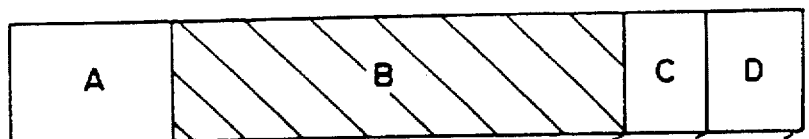

FIG. 37(a) shows the proportions in the power consumption of a conventional semiconductor SRAM IC device driven by a supply voltage of 3 V, wherein the power B consumed by charging/discharging the bit lines occupies 60 through 70% of the entire power consumption.

Figure 37B:
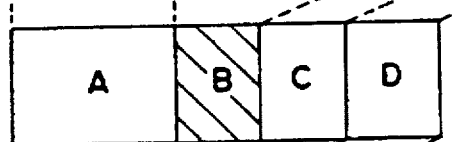

FIG. 37(b) shows the proportions in the power consumption of a conventional semiconductor SRAM IC device driven by a supply voltage of 3 V which conducts the cross-point selection of memory cells. Assuming that eight memory cells among all the memory cells included in the SRAM are accessed at a time and that the amount of currents in the seven memory cells is decreased to approximately 10% of that in one memory cell selected through the cross-point selection, the power B consumed by charging/discharging the bit lines can be decreased by approximately 80%. Accordingly, in this conventional semiconductor SRAM IC device, the total power consumption can be decreased by approximately 50% as compared with the device of FIG. 37(a).

Figure 37C:

FIG. 37(c) shows the proportions in the power consumption of the semiconductor SRAM IC device of this invention driven by a supply voltage of 1 V which conducts the cross-point selection of memory cells. Since the consumed power can be given by the following equation:

Power=drive frequency×operation capacitance×(supply voltage)$^2$ and the supply voltage of this device is decreased to one third, the total power consumption of FIG. 37(c) can be decreased to one ninth as small as that of FIG. 37(b).

Figure 37D:
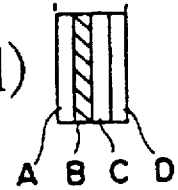

FIG. 37(d) shows the proportions in the power consumption of the semiconductor SRAM IC device according to this embodiment in which the amount of the leakage current in the peripheral circuit unit during the stand-by period is decreased. As compared with the total power consumption of FIG. 37(c), the power A consumed by the word line drive circuit, the power C consumed by the column control circuit and the power D consumed by the I/O control circuit are further decreased in this embodiment.

What is claimed is:

1. A data storage device comprising plural data holding means,
   wherein each of said plural data holding means includes:
   high data holding means for holding a high data at a potential higher than a supply potential; and
   low data holding means for holding a low data at a potential higher than a ground potential.

2. The data storage device of claim 1,
   wherein a difference between the potential of said high data holding means and the potential of said low data holding means is set to be equal to a difference between the supply potential and the ground potential.

3. The data storage device of claim 1,
   wherein a difference between the potential of said high data holding means and the potential of said low data holding means is set to be smaller than a difference between the supply potential and the ground potential.

4. The data storage device of claim 1,
   wherein a difference between the potential of said high data holding means and the potential of said low data holding means is set to be larger than a difference between the supply potential and the ground potential.

5. The data storage device of claim 1 further comprising data holding potential changing means for changing a difference between the potential of said high data holding means and the potential of said low data holding means in accordance with operation modes of said data storage device.

6. The data storage device of claim 5,
   wherein the operation modes of said data storage device include a first operation mode for conducting a read or write operation on any of said data holding means and a second operation mode for not conducting read and write operations on any of said data holding means, and
   said data holding potential changing means makes larger the difference between the potential of said high data holding means and the potential of said low data holding means in said first operation mode than in said second operation mode.

7. The data storage device of claim 5,
   wherein the operation modes of said data storage device include a first operation mode for conducting a read or write operation on any of said data holding means and a second operation mode for not conducting read and write operations on any of said data holding means, and
   said data holding potential changing means changes the potential of said low data holding means so that the difference between the potential of said high data holding means and the potential of said low data holding means is larger in said first operation mode than in said second operation mode.

8. The data storage device of claim 5,
   wherein the operation modes of said data storage device include a first operation mode for conducting a read or write operation on any of said data holding means and a second operation mode for not conducting read and write operations on any of said data holding means, and
   said data holding potential changing means changes the potential of said high data holding means so that the difference between the potential of said high data holding means and the potential of said low data holding means is larger in said first operation mode than in said second operation mode.

9. The data storage device of claim 6,
   wherein said data holding potential changing means increases an absolute value of at least one of the potentials of said high data holding means and said low data holding means in a third operation mode, in which said second operation mode is continued for a duration longer than said second operation mode by one microsecond or more.

10. The data storage device of claim 5,
    wherein said data holding means includes cross-couple type transistor pairs, and
    said data holding potential changing means works as source potential control means for changing a potential at a source electrode of said transistor pairs.

11. The data storage device of claim 10,
    wherein said transistor pairs are aligned in the form of an array,
    said data storage device is further provided with an address decoder for selecting one of said transistor pairs on the basis of a column address along a column direction and a row address along a row direction, and
    said source potential control means is controlled in accordance with an output signal of said address decoder.

12. The data storage device of claim 11,
    wherein the output signal of said address decoder is controlled in accordance with said column address.

13. The data storage device of claim 10 further comprising:
    source potential control lines connected with the source electrodes of said transistor pairs for controlling the potentials at the source electrodes; and
    bit line pairs connected with said transistor pairs for selecting one of said transistor pairs aligned in a column direction,
    wherein said source potential control lines are parallel to said bit line pairs.

14. The data storage device of claim 10 further comprising:
    source potential control lines connected with the source electrodes of said transistor pairs for controlling the potentials at the source electrodes; and
    word lines connected with said transistor pairs for selecting one of said transistor pairs aligned in a row direction,
    wherein said source potential control lines are parallel to said word lines.

15. The data storage device of claim 10 further comprising:
    externally supplied power lines connected with said transistor pairs for supplying charges to the source electrodes of said transistor pairs,
    wherein said source potential control means includes source line connecting means for connecting source lines connected with the source electrodes of said transistor pairs with said externally supplied power lines.

16. The data storage device of claim 15,
wherein said transistor pairs are aligned in the form of an array, said data storage device is further provided with an address decoder connected with said transistor pairs for selecting one of said transistor pairs on the basis of a column address and a row address, and said source line connecting means is controlled in accordance with an output signal of said address decoder.

17. The data storage device of claim 15,
wherein said externally supplied power lines are ground lines.

18. The data storage device of claim 15 further comprising a DC—DC converter using inductance or capacitance,
wherein said externally supplied power lines are connected with said DC—DC converter.

19. The data storage device of claim 16,
wherein said source potential control means includes:
common source line connecting means controlled in accordance with the output signal of said address decoder for connecting the source lines connected with the source electrodes of said transistor pairs with said externally supplied power lines.

20. The data storage device of claim 1,
wherein said high data holding means includes an internal step-up circuit composed of a charge pump circuit.

21. The data storage device of claim 7 further comprising:
frequency dependent type data holding potential changing means for changing the potential of said low data holding means so that the difference between the potential of said high data holding means and the potential of said low data holding means is less increased as a cycle frequency of a clock signal is larger in said first operation mode.

22. The data storage device of claim 21,
wherein said frequency dependent type data holding potential changing means includes:
predetermined potential setting means for setting the potential of said low data holding means in said second operation mode to be close to a predetermined potential of said low data holding means in said first operation mode.

23. The data storage device of claim 7 further comprising:
frequency dependent type data holding potential changing means for increasing the potential of said high data holding means as a cycle frequency of a clock signal is larger in said first operation mode.

24. The data storage device of claim 8 further comprising:
frequency dependent type data holding potential changing means for changing the potential of said high data holding means so that the difference between the potential of said high data holding means and the potential of said low data holding means is less increased as a cycle frequency of a clock signal is larger in said first operation mode.

25. The data storage device of claim 24,
wherein said frequency dependent type data holding potential changing means includes:
predetermined potential setting means for setting the potential of said high data holding means in said second operation mode to be close to a predetermined potential of said high data holding means in said first operation mode.

26. The data storage device of claim 8 further comprising:
frequency dependent type data holding potential changing means for decreasing the potential of said low data holding means as a cycle frequency of a clock signal is larger in said first operation mode.

27. A data storage device comprising:
plural data holding means; and
bit lines respectively connected with said plural data holding means for selecting predetermined data holding means among said plural data holding means,
wherein data holding potentials of said data holding means are shifted toward a reverse direction to a direction for driving said bit lines.

28. The data storage device of claim 1,
wherein said data holding means are disposed in the form of an array of memory cells including cross-couple type transistor pairs,
said data storage device is further provided with bit lines connected with said memory cells for selecting one of said memory cells,
said memory cells include access transistors interposed between said bit lines and a source electrode of said high data holding means, and
a threshold voltage of each of said access transistors is set at a smaller value than 0.35 V in the absolute value.

29. The data storage device of claim 1,
wherein said low data holding means is a drive transistor pair, and
a threshold value of each transistor of said drive transistor pair is set at a smaller value than 0.35 V in the absolute value.

30. The data storage device of claim 1,
wherein said data holding means are disposed in the form of an array of memory cells including cross-couple type transistor pairs,
said data storage device is further provided with bit lines connected with said memory cells for selecting one of said memory cells,
said memory cells include access transistors interposed between said bit lines and a source electrode of said high data holding means, and
said data storage device is further provided with means for setting an absolute value of a substrate bias potential of each of said access transistors during a stand-by period in which neither a read operation nor a write operation is conducted on any of said data holding means at a value larger than an absolute value of the substrate bias potential of said access transistor during an activating period in which a read or write operation is conducted on said data holding means.

31. The data storage device of claim 1,
wherein said low data holding means is a drive transistor pairs, and
said data storage device is further provided with means for setting an absolute value of a substrate bias potential of said drive transistor pair during a stand-by period in which neither a read operation nor a write operation is conducted on any of said data holding means at a value larger than an absolute value of the substrate bias potential of said drive transistor pair during an activating period in which a read or write operation is conducted on said data holding means.

32. The data storage device of claim 1 further comprising:
data holding potential changing means for decreasing the potential of said low data holding means during a stand-by period in which neither a read operation nor a write operation is conducted on any of said data holding means.

33. The data storage device of claim 1,
wherein said low data holding means is a drive transistor pair, and
device parameters are set so that dependency of a threshold voltage of each transistor of said drive transistor pair on a substrate bias potential is increased.

34. The data storage device of claim 33,
wherein said device parameters include a depth, from a surface of a substrate, of each transistor of said drive transistor pair determined in accordance with the substrate bias potential, and an impurity concentration in a space charge area between a bottom of the substrate and a channel region.

35. The data storage device of claim 33,
wherein said device parameters include a flat band voltage, which is set to be increased in a reverse direction to a sign of the threshold voltage.

36. The data storage device of claim 1,
wherein said data holding means are disposed in the form of an array of memory cells including cross-couple type transistor pairs,
said data storage device is further provided with:
bit line pairs connected with said memory cells for selecting one of said memory cells;
low data holding power lines connected with said memory cells for controlling the potential of said low data holding means;
a sense amplifier connected with said memory cells via said bit line pairs for amplifying a potential of a data read from a memory cell selected from said memory cells; and
a low data holding power control circuit for controlling the potential of said low data holding means through said low data holding power lines,
wherein said sense amplifier sets, in amplifying the potential of the read data, a difference between the potential of said high data holding means and the potential of said low data holding means in the selected memory cell at a value close to a difference between the potential of said high data holding means and the potential of said low data holding means in an unselected memory cell.

37. The data storage device of claim 36,
wherein said low data holding means is a drive transistor pair, and
said low data holding power control circuit increases a potential at a source electrode of said drive transistor pair.

38. The data storage device of claim 36,
wherein said memory cell includes access transistors interposed between said bit line pairs and a source electrode of said high data holding means, and
said low data holding power control circuit sets the potential of said low data holding means during a stand-by period in which neither a read operation nor a write operation is conducted on any of said data holding means at a potential lower than the supply potential by a threshold voltage of each of said access transistors.

39. The data storage device of claim 36,
wherein said low data holding power control circuit includes dummy access transistors,
the supply potential is applied to gate electrodes of said dummy access transistors at the same time of precharging said bit line pairs up to the supply potential, and
said low data holding power control circuit sets the potential of said low data holding means during a stand-by period by supplying a voltage to a source electrode of said low data holding means through said dummy access transistors from a power supplier for precharging said bit line pairs.

40. The data storage device of claim 36,
wherein each of said low data holding power lines connected with said low data holding power control circuit is electrically connected with an adjacent low data holding power line in a read operation.

41. The data storage device of claim 1,
wherein said data holding means are disposed in the form of an array of memory cells including cross-couple type transistor pairs,
said data storage device is further provided with:
bit line pairs connected with said memory cells for sellecting one of said memory cells; and
a sense amplifier connected with said memory cells through said bit line pairs for amplifying a potential of a data read from a memory cell selected from said memory cells,
said sense amplifier includes a low potential supply power controlling transistor which becomes conductive in a read operation, and
control signals complementary to each other are respectively supplied to a gate electrode and a source electrode of said low potential supply power controlling transistor, and a threshold voltage of said low potential supply power controlling transistor is set at a value smaller than 0.35 V in the absolute value.

42. The data storage device of claim 1 further comprising:
high data holding power lines connected with said high data holding means for supplying a voltage to said high data holding means; and
high data holding potential floating means for placing a potential of selected high data holding means in a floating state in a write operation.

43. The data storage device of claim 1 further comprising:
data holding potential changing means for setting a difference between the potential of selected high data holding means and the potential of selected low data holding means in a write operation at a value equal to or smaller than a difference between the potential of said high data holding means and the potential of said low data holding means in a stand-by period in which neither a read operation nor a write operation is conducted, and sets a difference between a potential at a source electrode of unselected high data holding means and a potential at a source electrode of unselected low data holding means in the write operation at a value equal to the difference between the potential of the high data holding means and the potential of the low data holding means in the stand-by period.

44. The data storage device of claim 1 further comprising:
high data holding power lines connected with said high data holding means for supplying a voltage to said high data holding means; and
data holding potential changing means for decreasing a potential of selected high data holding means in a write operation.

45. The data storage device of claim 1 further comprising:
high data holding power lines connected with said high data holding means for supplying a voltage to said high data holding means; and
data holding potential changing means for increasing a potential of selected high data holding means in a read operation.

46. The data storage device of claim 1, wherein said data holding means are disposed in the form of an array of memory cells including cross-couple type transistor pairs, said array being divided into plural blocks, said data storage device is further provided with:
  a first low data holding power line extending over said plural blocks; and
  a second low data holding power lines respectively connected with said low data holding means in said plural blocks for supplying a voltage to said low data holding means, and said first low data holding power line is connected with said second low data holding power lines through switches.

47. The data storage device of claim 46 further comprising:

plural bit line pairs connected with said memory cells for selecting one of said memory cells, said plural blocks are formed by dividing said array into groups each including memory cells connected with the same bit line pair among said plural bit line pairs, said switches are respectively provided to said plural blocks, and said data storage device is further provided with impedance control means for controlling impedance of said first and second low data holding power lines through said switches.

48. The data storage device of claim 47, wherein said impedance control means generates, through said switches, a potential for providing low impedance to a selected second low data holding power line and a potential for providing high impedance to an unselected second low data holding power line.

49. A data storage device comprising:

a memory cell array unit including memory cells aligned in the form of an array; and a peripheral circuit unit, wherein said peripheral circuit unit includes:

voltage control means for increasing, in a read operation, a difference between a potential at a source electrode of high data holding means and a potential at a source electrode of low data holding means of a selected memory cell to be larger than a difference between a potential at a source electrode of high data holding means and a potential at a source electrode of low data holding means of an unselected memory cell; and current control means for allowing a current to flow through said peripheral circuit unit in an activating period in which a read or write operation is conducted and cutting the current flowing through said peripheral circuit unit in a stand-by period in which neither a read operation nor a write operation is conducted.

50. A method of driving a data storage device including plural cross-couple type transistor pairs working as data holding means, comprising:

a source line grounding step of grounding a source line of a transistor pair selected from said plural transistor pairs; and a source line connecting step of connecting a source line of unselected transistor pairs with the source line of said selected transistor pair in precharging the source line of said selected transistor pair.

51. The method of driving a data storage device of claim 50, wherein said source line connecting step includes a step of connecting source lines of said transistor pairs with one another through switches and holding potentials of said source lines at a predetermined potential.

52. The method of driving a data storage device of claim 50, wherein said source line grounding step includes a step of placing the source line of said selected transistor pair in a floating state and connecting the source lines of said unselected transistor pairs with one another in a write operation.

* * * * *

UNITED STATES PATENT AND TRADEMARK OFFICE
CERTIFICATE OF CORRECTION

PATENT NO. : 5,715,191
DATED : February 3, 1998
INVENTOR(S) : Yamauchi et al.

It is certified that error appears in the above-identified patent and that said Letters Patent is hereby corrected as shown below:

Claim 41, line 7, change "sellecting" to --selecting--.

Signed and Sealed this

Twenty-fifth Day of April, 2000

*Attest:*

Q. TODD DICKINSON

*Attesting Officer*     *Director of Patents and Trademarks*